(12) United States Patent
Nagao

(10) Patent No.: US 6,380,876 B1
(45) Date of Patent: Apr. 30, 2002

(54) D/A CONVERSION CIRCUIT AND SEMICONDUCTOR DEVICE

(75) Inventor: Shou Nagao, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/571,612

(22) Filed: May 15, 2000

(30) Foreign Application Priority Data

May 17, 1999  (JP) ............................................. 11-136090

(51) Int. Cl.$^7$ ................................................. H03M 1/78
(52) U.S. Cl. ........................................ 341/154; 341/144
(58) Field of Search .................................. 341/144, 154

(56) References Cited

U.S. PATENT DOCUMENTS

| | | | | |
|---|---|---|---|---|
| 4,713,649 A | * | 12/1987 | Hino ........................... | 340/347 |
| 5,134,400 A | * | 7/1992 | Hash ........................... | 341/136 |
| 5,274,373 A | * | 12/1993 | Kanoh ......................... | 341/118 |
| 5,594,569 A | | 1/1997 | Konuma et al. ............ | 349/122 |

FOREIGN PATENT DOCUMENTS

JP        11-167373        6/1999

OTHER PUBLICATIONS

Inui, S. et al, "Thresholdless Antiferroelectricity in Liquid Crystals and its Application to Displays," *J. Mater Chem.*, vol. 6, No. 4, pp. 671–673, 1996.

Yoshida, T. et al, "A Full–Color Thresholdless Antiferroelectric LCD Exhibiting Wide Viewing Angle with Fast Response Time," *SID 97 Digest,* pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," *SID 98 Digest,* pp. 782–785, 1998.

English abstract re Japanese patent application No. 11–167373, published May 11, 1998.

* cited by examiner

*Primary Examiner*—Peguy JeanPierre
(74) *Attorney, Agent, or Firm*—Cook, Alex, McFarron, Manzo, Cummings & Mehler, Ltd.

(57) ABSTRACT

A DAC whose area is held down and a semiconductor device using the DAC are fabricated. A D/A conversion circuit is disclosed, including n resistors $A_0, A_1, \ldots A_{n-1}$, n resistors $B_0, B_1, \ldots, B_{n-1}$, two power-supply voltage lines, a power-supply voltage line L and a power-supply voltage line H, maintained at potentials different from each other, n switches $SWa_0, SWa_1, \ldots, SWa_{n-1}$, n switches $SWb_0, SWb_1, \ldots, SWb_{n-1}$, and an output line, wherein, by n-bit digital signals inputted from the outside, said n switches $SWa_0, SWa_1, \ldots, SWa_{n-1}$ and said n switches $SWb_0, SWb_1, \ldots, SWb_{n-1}$ are controlled, and, from the output line, an analog gradation voltage signal is outputted.

23 Claims, 24 Drawing Sheets

US 6,380,876 B1

D/A CONVERSION CIRCUIT AND SEMICONDUCTOR DEVICE

BACKGROUND OF THE INVENTION

1. Field of the Invention

The present invention relates to a D/A conversion (digital-to-analog conversion) circuit (DAC: Digital-Analog Converter). The invention relates, more particularly, to a DAC used in the driving circuit of a semiconductor device and, further, to a semiconductor device using this DAC.

2. Description of the Related Art

Recently, the technique of fabricating a semiconductor device in which semiconductor thin films are formed on a cheap glass substrate, such as, e.g., the technique of fabricating thin film transistors (TFTs) is being rapidly developed. The reason therefor is that the demand for semiconductors (particularly, active matrix liquid crystal display devices and EL display devices) is growing.

An active matrix liquid crystal display device is constituted in such a manner that, in each of several tens of millions to several hundreds of millions of pixel regions disposed in a matrix-like state, a TFT is disposed, so that the charges coming into and going out from the respective pixel elements are controlled by the switching function of the TFTs.

Among such active matrix liquid crystal display devices, a digital driving type active matrix liquid crystal display device is attracting attention as the display devices are becoming more and more precise and minute and as their picture quality is becoming higher and higher.

FIG. 15 shows an outline of the structure of a conventional digital driving type active matrix liquid crystal display device. The conventional digital driving type active matrix liquid crystal display device is comprised, as shown in FIG. 15, of a source signal line side shift register 1401, address lines (a to d) 1402 for the digital signals inputted from the outside, latch circuits 1 (LAT1) 1403, latch circuits 2 (LAT2) 1404, a latch pulse line 1405, D/A conversion circuits 1406, gradation voltage lines 1407, source signal lines (data lines) 1408, a gate signal line side shift register 1409, gate signal lines (scanning lines) 1410 and pixel TFTs 1411. A 4-bit digital driving type active matrix liquid crystal display device is taken up by way of example. The latch circuits 1 1403 and the latch circuits 2 1404 (LAT1 and LAT2) are each shown in the state in which four latch circuits are put together for convenience' sake.

The digital signals fed from the outside to the digital signal address lines (a to d) 1402 are successively written into all the LAT1 1403 in accordance with the timing signals from the source signal line side shift register 1401. In this specification, all the LAT1 put together will be genetically called LAT1 group.

The length of time required for completing the writing of the digital signals into the LAT1 group is called one line period. In other words, the time interval from the point of time when the writing of the digital signals inputted from the outside into the LAT1 at the leftmost side is started to the point of time when the writing of the digital signals inputted from the outside into the LAT1 at the rightmost side is completed, is one line period.

After the writing of the digital signals into the LAT1 group is terminated, the digital signals thus written into the LAT1 group are simultaneously transmitted and written into all the LAT2 1404, in tune with the operating timing of the source signal line side shift register 1401, when a latch signal is inputted to the latch pulse line 1405. In this specification, all the LAT2 put together will be genetically called LAT2 group.

Into the LAT1 group which has finished the transmission of the digital signals to the LAT2 group, the writing of the digital signals again fed to the digital decoder address lines (a to d) 1402 is successively carried out in accordance with the signals from the source signal line side shift register 1401.

In step with the start of the second one-line period, the digital signals previously sent out to the LAT2 group are inputted to the D/A conversion circuits 1406 and converted into analog graduation voltage signals corresponding to the digital signals and then fed to the source signal lines 1408.

The analog gradation voltage signals are fed to the corresponding source signal lines 1408 for the one-line period. By the scanning signals outputted from the gate signal line side shift register 1409, the switching of the corresponding pixel TFTs 1411 is carried out, and, by the analog graduation voltage signals from the source signal lines 1411, the liquid crystal molecules are driven.

By repeating the above-mentioned operation a number of times equal to the scanning line number, one picture (one frame) is formed. Generally, in an active A matrix liquid crystal display device, the rewrite of 60 frame images is effected for one second.

Here, the known A/D converter circuits used in the above-mentioned digital driving circuit will be described. FIG. 16 will be referred to.

A known 4-bit D/A conversion circuit comprises switches (sw0 to sw15) and gradation voltage lines (V0 to V15). This 4-bit D/A conversion circuit is constituted in such a manner that, by the 4-bit digital signals fed from the LAT2 group 1404 in the digital driving type active matrix liquid crystal display device shown in FIG. 15, one of the switches (sw0 to sw15) is selected, and, from the gradation voltage line connected to the thus selected switch, the voltage is fed to the source signal line 1408.

In case of the known 4-bit D/A conversion circuit which is now being described, the number of the switches is 16, and the number of the graduation voltage lines is 16. In an actual active matrix type liquid crystal display device, the area of the switches themselves is large. Further, the D/A conversion circuit shown in FIG. 16 is provided at a rate of one to one source signal line, so that the area of the whole driving circuit becomes large.

Another example of the known 4-bit D/A conversion circuit will next be taken up. The 4-bit D/A conversion circuit shown in FIG. 17 is constituted in such a manner that, as in case of the 4-bit D/A conversion circuit described above, one of a plurality of switches (sw0 to sw15) is selected by the 4-bit digital signal fed from the LAT2 group 1404, and, from the gradation voltage line connected to the thus selected switch, the voltage is fed to the source signal line 1408.

In the D/A conversion circuit shown in FIG. 17, the graduation voltage lines are five in number (V0 to V4) and thus are smaller in number than those of a 4-bit D/A conversion circuit as shown in FIG. 16. However, the number of the switches is still sixteen. Therefore, it is difficult to reduce the area of the whole driving circuit.

In case of a D/A conversion circuit which converts 4-bit digital signals into an analog gradation voltage signal as described here, if the bit number increases, the number of the switches is exponentially increased. In other words, in the known D/A conversion circuit which converts n-bit digital signals into an analog gradation signal, $2^n$ switches become necessary. Therefore, it is difficult to hold down the area of the driving circuit.

In case of the driving circuit which includes D/A conversion circuits as mentioned above, it is difficult to hold down its area, which becomes a cause for hindering the miniaturization of semiconductor devices, particularly, active matrix liquid crystal display devices.

Further, for making semiconductor display devices highly precise and minute, the number of the pixels must be increased, that is, the number of the source signal lines must be increased. However, if the source signal lines are increased in number, then the number of the D/A conversion circuits is also increased as mentioned above, and thus, the area of the driving circuit is increased, which is a cause for impeding the realization of a high precise and minute structure.

For the reasons mentioned above, there is a growing demand for keeping small the area of an D/A conversion circuit.

Further, besides the above-mentioned resistance division type DAC, there is a capacitance division type DAC in which the resistance division is made by the capacitance. In order to operate the capacitance division type DAC, there are needed the period of time for accumulating charges in the capacitance and the period of time for discharging the charges accumulated in the capacitance to reset them to the same charges as the GND (ground), so that the operating speed is slow.

SUMMARY OF THE INVENTION

Thus, the present invention has been achieved in view of the above-mentioned problems, and it is the object of the invention to hold down the area of a D/A conversion circuit to a small value.

The DAC according to the invention comprises a resistor A group consisting of n resistors $A_0, A_1, \ldots, A_{n-1}$ which correspond to n-bit digital signals, respectively, and a resistor B group consisting of n resistors $B_0, B_1, \ldots, B_{n-1}$. The general expression of the resistance values of the resistor A group and the resistor B group is $2^{n-1}R$ (wherein n stands for a natural number which is 1 or greater, and R stands for a positive number). Further, the DAC according to the invention includes a switch SWa group consisting of switches $SWa_0, SWa_1, \ldots, SWan-1$ which correspond to the respective n-bit digital signals and a switch SWb group consisting of n switches $SWb_0, SWb_1, \ldots, SWb_{n-1}$. The DAC according to the invention further includes two power-supply voltage lines, a power-supply voltage line L and a power-supply voltage line H, which are maintained at potentials different from each other.

When the switches of the switch SWa group are turned on, the power-supply voltage line L and an output line are connected to each other through the resistor A group consisting of n resistors $A_0, A_1, \ldots A_{n-1}$. Further, when the switches of the switch SWb group are similarly turned on, the power-supply voltage line H and the output line are connected through the resistor B group consisting of n resistors $B_0, B_1, \ldots, B_{n-1}$.

Conversely, if the switches of the switch SWa group are turned off, then the connection between the power-supply voltage line L and the output line is cut off. Further, if similarly the switches of the switch SWb group are turned off, then the connection between the power-supply voltage line H and the output line is cut off.

The switch SWa group is controlled by the n-bit digital signals inputted from the outside, and the switch SWb group is controlled by the inverted signals of the n-bit digital signals. Then an analog gradation voltage signal corresponding to the inputted n-bit digital signals is outputted through the output line.

The DAC according to the present invention will now be described on the basis of certain aspects of the invention.

Embodiment Mode 1

FIG. 1 shows the DAC circuit according to Embodiment Mode 1. The DAC of the invention shown in FIG. 1 converts n-bit digital signals into an analog graduation voltage signal. In the present invention, n stands for a natural number.

As shown in FIG. 1A–FIG. 1D, the DAC according to the invention includes n resistors $A_0, A_1, \ldots, A_{n-1}$ and n resistors $B_0, B_1, \ldots, B_{n-1}$. The n resistors $A_0, A_1, \ldots A_{n-1}$, put together, will be generically called register A group. Further, the n resistors $B_0, B_1, \ldots, B_{n-1}$, put together, will be generically called register B group.

The respective resistors constituting the resistor A group are as follows: $A_1=R, A_2=2R, A_3=2^2R, \ldots, A_{n-1}=2^{n-1}R$. Further, the respective resistors constituting the resistor B group are as follows: $B_1=R, B_2=2R, B_3=2^2R, \ldots, B_{n-1}=2^{n-1}R$. In the present invention, R is a constant for standing for a resistance value.

In the invention, the n resistors $A_0, A_1, \ldots, A_{n-1}$ and the n resistors $B_0, B_1, \ldots, B_{n-1}$ each have two or more terminals. As these terminals, there are input and output terminals for inputting to the resistor and outputting from the resistor, and, besides them, a common terminal which is common for inputting to and outputting from the resistor. In the invention, the two input and output terminals of the resistors will hereinafter be referred to as the ends of the resistors.

Further, the DAC according to the invention includes n switches $SWa_0, SWa_1, \ldots, SWa_{n-1}$ and n switches $SWb_0, SWb_1, \ldots, SWb_{n-1}$. The n switches $SWa_0, SWa_1, \ldots, SWa_{n-1}$, put together, will be generically called switch Swa group. Further, the n switches $SWb_0, SWb_1, \ldots, SWb_{n-1}$, put together, will be generically called switch group SWb. Further, the switch SWa group and the switch SWb group, put together, will be generically called switch SW group. In this Embodiment Mode, the internal resistance of the switch SW group is regarded as 0, but it is also permissible to make the circuit design by taking the internal resistance of the switch SW group into account.

In the invention, the n switches $SWa_0, SWa_1, \ldots, SWa_{n-1}$ and the n switches $SWb_0, SWb_1, \ldots, SWb_{n-1}$ each have input and output terminals for inputting to the switch and for outputting from the switch. Further, in some cases, the switches each have, besides the input and output terminals, a common terminal which is common for inputting to and outputting from the switch. In the invention, the two terminals, the input and output terminals, of the switches will be called the ends of the switches.

Further, the DAC according to the invention includes an output line, a power-supply voltage line L, and a power-supply voltage line H. From the output line that the DAC has, an analog gradation voltage signal resulting from the conversion of digital signals is outputted. The output potential of the analog gradation voltage signal outputted from the output line will be called $V_{out}$.

The power-supply voltage line L and the power-supply voltage line H are connected to a power supply provided outside the DAC and maintained at constant potentials. The power-supply voltage line L is maintained at a power-supply potential $V_L$, and the power-supply voltage line H is maintained at a power-supply potential $V_H$.

The power-supply potential $V_L$ and the power-supply potential $V_H$ are both alike based on the ground (GND) potential.

In this specification, to connect means to electrically conduct. To electrically conduct is a matter of degree. In case that what is supplied with electricity fulfills its object function or in case that the object function of what is supplied with electricity is spoiled, it is defined that electrical conduction is effected. Further, in this specification, connection being cut off is defined as a state in which electrical conduction is not effected.

As for the relationship between the power-supply potential $V_H$ and the power-supply potential $V_L$, in case of $VH<V_L$ and in case of $VH>V_L$, analog signals which are inverted with respect to each other are outputted as the output potentials $V_{out}$. Here, the output in case of $VH>V_L$, is set as positive phase, while the output in case of $V_H<V_L$ is set as opposite phase.

Here, the circuit arrangement of the DAC according to the invention will be described.

Both-ends of the resistor $A_0$ are respectively connected to the switch $SWa_0$ and the output line. That end of the switch $SWa_0$ which is not connected to the resistor $A_0$ is connected to the power-supply voltage line L.

Further, both ends of the resistor $A_1$ are respectively connected to the switch $SWa_1$ and the output line. That end of the switch $SWa_1$ which is not connected to the resistor $A_1$ is connected to the power-supply voltage line L.

Further, both ends of the resistor $A_2$ are respectively connected to the switch $SWa_2$ and the output line. That end of the switch $Swa_2$ which is not connected to the resistor $A_2$ is connected to the power-supply voltage line L.

Similarly, both ends of the resistor $A_{n-1}$ are respectively connected to the switch $SWa_{n-1}$ and the output line. That end of the switch $SWa_{n-1}$ which is not connected to the resistor $A_{n-1}$ is connected to the power-supply voltage line L.

As mentioned above, both ends of the resistors $A_0$, $A_1$, . . . , $A_{n-1}$ are respectively connected to the respective switches $SWa_0$, $SWa_1$, . . . $SWa_{n-1}$ and the output line. Those ends of the respective switches $SWa_0$, $SWa_1$, . . . , $SWa_{n-1}$ which are not connected to the respective resistors $A_0$, $A_1$, . . . , $A_{n-1}$ are connected to the power-supply voltage line L.

The relationship between the resistors $B_0$, $B_1$, . . . , Bn–1 and the switches $SWb_0$, $SWb_1$, . . . , $SWb_{n-1}$ is also similar to the relationship between the resistors $A_0$, $A_1$, . . . , $A_{n-1}$ and the switches $SWa_0$, $SWa_1$, . . . , $SWa_{n-1}$. That is, both ends of the respective resistors $B_0$, $B_1$, . . . , $B_{n-1}$ are connected to the respective switches $SWb_0$, $SWb_1$, . . . , $SWb_{n-1}$ and the output line. The respective ends of the switches $SWb_0$, $SWb_1$, . . . , $SWb_{n-1}$ which ends are not connected to the resistors $B_0$, $B_1$, . . . , $B_{n-1}$ are connected to the power-supply voltage line H.

Next, the operation of the DAC according to the invention will be described.

When the switch $SWa_0$ is turned on, the power-supply voltage line L and the resistor $A_0$ are connected to each other. In other words, when the switch $Swa_0$ is turned on, that end of the resistor $A_0$ which is connected to the switch $SWa_0$ is maintained at the same potential as the power-supply potential $V_L$. Conversely, if the switch $SWa_0$ is turned off, then the connection between the power-supply voltage line L and the resistor $A_0$ is cut off.

Further, if the switch $Swa_1$ is turned on, the power-supply voltage line L and the resistor $A_1$ are connected to each other. In other words, if the switch $SWa_1$ is turned on, then that end of the resistor $A_1$ which is connected to the switch $SWa_1$ is maintained at the same potential as the power-supply potential $V_L$. Conversely, if the switch $SWa_1$ is turned off, then the connection between the power-supply voltage line L and the resistor $A_1$ is cut off.

Further, if the switch $SWa_2$ is turned on, then the power-supply voltage line L and the resistor $A_2$ are connected to each other. In other words, if the switch $SWa_2$ is turned on, then that end of the resistor $A_2$ which is connected to the switch $SWa_2$ is maintained at the same potential as the power-supply potential $V_L$. Conversely, if the switch $SWa_2$ is turned off, then the connection between the power-supply voltage line L and the resistor $A_2$ is cut off.

Similarly, if the switch $SWa_{n-1}$ is turned on, then the power-supply voltage line L and the resistor $A_{n-1}$ are connected to each other. In other words, if the switch $SWa_{n-1}$ is turned on, then that end of the resistor $A_{n-1}$ which is connected to the switch $SWa_{n-1}$ is maintained at the same potential as the power-supply potential $V_L$. Conversely, if the switch $SWa_{n-1}$ is turned off, then the connection between the power-supply voltage line L and the resistor $A_{n-1}$ is cut off.

As mentioned above, if each of the switches $SWa_0$, $SWa_1$, . . . , $SWa_{n-1}$ is turned on, then the power-supply voltage line L and each of the resistors $A_0$, $A_1$, . . . , $A_{n-1}$ are connected to each other. In other words, if each of the switches $SWa_0$, $SWa_1$, . . . $SWa_{n-1}$ is turned on, then that end of each of the resistors $A_0$, $A_1$, . . . , $A_{n-1}$ which is connected to each of the switches $SWa_0$, $SWa_1$, . . . , $SWa_{n-1}$ is maintained at the same potential as the power-supply potential $V_L$. Conversely, if each of the switches $SWa_0$, $SWa_1$, . . . , $SWa_{n-1}$ is turned off, then the connection between the power-supply voltage line L and each of the resistors $A_0$, $A_1$, . . . , $A_{n-1}$ is cut off. Similarly, if each of the switches $SWb_0$, $SWb_1$, . . . , $SWb_{n-1}$ is turned on, then the power-supply voltage line H and each of the resistors $B_0$, $B_1$, . . . , $B_{n-1}$ are connected to each other. In other words, if each of the switches $SWb_0$, $SWb_1$, . . . , $SWb_{n-1}$ is turned on, then that end of each of the resistors $B_0$, $B_1$, . . . , $B_{n-1}$ which is connected to each of the switches $SWb_0$, $SWb_1$, . . . , $SWb_{n-1}$ is maintained at the same potential as the power-supply potential $V_H$. Conversely, if each of the switches $SWb_0$, $SWb_1$, . . . , $SWb_{n-1}$ is turned off, then the connection between the power-supply voltage line H and each of the resistors $B_0$, $B_1$, . . . , $B_{n-1}$ is cut off.

The ON or OFF control of the switch SWa group and the switch SWb group is determined depending on the digital signal $Da_0$, $Da_1$, . . . , $Da_{n-1}$ inputted to the DAC. The digital signals $Da_0$, $Da_1$, . . . , $Da_{n-1}$, all put together, will be generically called digital signals Da.

The value of the digital signal is either Hi or Lo. For the convenience of description, the value of the digital signal when it is Hi will be defined as 1, while the value of the digital signal when it is Lo will be defined as 0. The digital signal is defined in such a manner that $Da_0$ is the least significant bit (LSB), and $Da_{n-1}$ is the most significant bit (MSB).

Further, the signals resulting from the inversion of the digital signals $Da_0$, $Da_1$, . . . , $Da_{n-1}$ will be designated as $DB_0$, $DB_1$, . . . , $Db_{n-1}$. Thus, it follows that, if $Da_0$ is 1, then $Db_0$ is 0, and, conversely if $Da_0$ is 0, then $Db_0$ is 1. The digital signals $DB_0$, $DB_1$, . . . , $Db_{n-1}$, all put together, will be generically called a digital signal Db. If the digital signal Da is inputted to the DAC, then the digital signal Da is inputted to the switches $SWa_0$, $SWa_1$, ... $SWa_{n-1}$, and the digital signal Db is inputted to the switches $SWb_0$, $SWb_1$, ..., $SWb_{n-1}$.

If the digital Da which is inputted to each of the switches $SWa_0$, $SWa_1$, $SWa_{n-1}$ is assumed to be 1, then the switches $SWa_0$, $SWa_2$, ..., $SWb_{n-1}$ are each turned on. The digital signal Db which is inputted to each of the switches $SWb_0$, $SWb_1$, ..., $SWb_{n-1}$ is the inversion of the digital signal Da and thus 0, so that the switches $SWb_0$, $SWb_1$, ..., $SWb_{n-1}$ are each turned off. Conversely, if the digital signal Da inputted to each of the switches $SWa_0$, $SWa_1$, ..., $SWa_{n-1}$ is 0, then the switches $SWa_0$, $SWa_1$, ..., $SWa_{n-1}$ are each turned off. The digital signal Db which is then inputted to each of the switches $SWb_0$, $SWb_1$, ..., $SWb_{n-1}$ is the inversion of the digital signal Da and thus 1, so that the switches $SWb_0$, $SWb_1$, ..., $SWb_{n-1}$ are each turned on.

In this way, the switch SWa group and the switch SWb group are operatively associated with each other.

Let's examine the digital signal $Da_0$ being the first bit; if the digital signal $Da_0=1$ is inputted to the DAC, then the $Da_0$ is inputted to the switch $SWa_0$ corresponding to the digital signal $Da_0$, and the switch $SWa_0$ is turned on. As a result, the power-supply potential $V_L$ of the power-supply voltage line L is applied to the resistor $A_0$ corresponding to the switch $SWa_0$.

When $Da_0=1$, $Db_0=0$. The digital signal $Db_0$ is inputted to the corresponding switch $SWb_0$, so that the switch $SWb_0$ is turned off. As a result, the resistor $B_0$ corresponding to the switch $SWb_0$ is disconnected from the power-supply voltage line H.

To the digital signals, $Da_1$, $Da_2$, ..., $Da_{n-1}$, the same thing as mentioned about the digital signal $Da_0$ above, also applies.

The operation performed by the DAC of the present invention in case that the digital signals Da inputted to the DAC are all 1, will be described by the use of FIG. 1A.

In case that the digital signals Da ($Da0$, $Da_1$, ..., $Da_{n-1}$) inputted are all 1, the switches $SWa_0$, $SWa_1$, ..., $SWa_{n-1}$ are all turned on, and the output line is connected to the power-supply voltage line L through each of the resistors $A_0$, $A_1$, ..., $A_{n-1}$. The then digital signals Db ($DB_0$, $DB_1$, ..., $Db_{n-1}$) are all 0, and thus, the switches $SWb_0$, $SWb_1$, ..., $SWb_{n-1}$ are turned off, so that the output line is brought into a state disconnected from the power-supply voltage line H.

As a result, the power-supply potential $V_L$ of the power-supply voltage line L is outputted intact from the output line. The output potential $V_{out}$ from the output line of the DAC becomes $V_{out}$ ($Da_0=Da_1= ... =Da_{n-1}=1)=V_L$.

The operation performed by the DAC of the invention when the digital signals Da inputted to the DAC are all 0, will be described by the use of FIG. 1B.

In case that the digital signals Da inputted are all 0, the switches $SWa_0$, $SWa_1$, $SW_{a-1}$ are all turned off, and the output line is brought into a state disconnected from the power-supply voltage line L. Since the digital signals Db are all 1, the switches $SWb_0$, $SWb_1$, ..., $SWb_{n-1}$ are all turned on, and the output line is connected to the power-supply voltage line H through each of the resistors $B_0$, $B_1$, ..., $B_{n-1}$.

As a result, the power-supply potential $V_H$ of the power-supply voltage line H is directly outputted from the output line. The output potential $V_{out}$ from the output line of the DAC becomes $V_{out}$ ($Da_0=Da_1= ... =Dan-1=0) =V_H$.

The operation of the DAC according to the invention in case that, of the digital signals Da inputted to the DAC, only $Da_0$ is 0, while $Da_1$, $Da_2$, ..., $Da_{n-1}$ are all 1, will be described by the use of FIG. 1C.

Since $Da_0$ is 0, $SWa_0$ is turned off, while $SWb_0$ is turned on, and the output line is connected to the power-supply voltage line H through the resistor $B_0$. On the other hand, since $Da_1$, $Da_2$, ..., $Da_{n-1}$ are all 1, $SWa_1$, $SWa_2$, ..., $SWa_{n-1}$ are all turned on, while, conversely, $SWb_1$, $SWb_2$, ..., $SWb_{n-1}$ are all turned off, and thus, the output line is connected to the power-supply voltage line L through the resistors $A_1$, $A_2$, ..., $A_{n-1}$.

Of the resistors $A_0$, $A_1$, ..., $A_{n-1}$, the combined resistance of all those resistors (in this case, the resistors $A_1$, $A_2$, ... $A_{n-1}$ correspond to those resistors) which are connected to the switches $SWa_1$, $SWa_2$, ..., $SWa_{n-1}$ that are in ON state, is assumed to be $A_T$. Further, of the resistors $B_0$, $B_1$, ..., $B_{n-1}$, the combined resistance of all those resistors (in this case, the resistor $B_0$ corresponds to those resistor) which are connected to the switch $SWb_0$ that is in ON state, is assumed to be $B_T$.

The reciprocal number of the combined resistance $A_T$ is equal to the sum of the reciprocal numbers of the respective resistors $A_1$, $A_2$, ..., $A_{n-1}$ connected to the switches $SWa_1$, $SWa_2$, ..., $SWa_{n-1}$ which are in ON state. (Equation 1)

Equation 1

$$\frac{1}{A_T} = \frac{1}{A_1} + \frac{1}{A_2} + \cdots + \frac{1}{A_{n-2}} + \frac{1}{A_{n-1}} \tag{1}$$

$$= \frac{1}{2R} + \frac{1}{2^2 R} + \cdots + \frac{1}{2^{n-2}R} + \frac{1}{2^{n-1}R}$$

By solving the equation 1 with respect to $A_T$, the equation 2 is obtained.

Equation 2

$$\therefore A_T = \frac{2^{n-1}}{2^{n-2} + 2^{n-3} + \cdots + 2 + 1} R \tag{2}$$

Further, similarly, the reciprocal number of the combined resistance $B_T$ is equal to the reciprocal number of the resistor $B_0$ connected to the switch $Swb_0$ that is in ON state. (Equation 3)

Equation 3

$$\frac{1}{B_T} = \frac{1}{B_0} = \frac{1}{R} \tag{3}$$

By solving the equation 3 with respect to $B_T$, the equation 4 is obtained.

Equation 4

$$\therefore B_T = R \tag{4}$$

By the use of the combined resistance $A_T$ and the combined resistance $B_T$ evaluated by the equation 2 and the equation 4, the output potential $V_{out}$ ($Da_0=0$, $Da_1=Da_2$ ... $Da_{n-1}=1$) from the output line of the DAC is evaluated. The output potential $V_{out}$ ($Da_0=0$, $Da_1=Da_2= ... =Da_{n-1}=1$) is what results from dividing the combined resistance $A_T$ of the equation 2 by the sum of the combined resistance $A_T$ of the equation 2 and the combined resistance $B_T$ of the equation 4 and then multiplying the thus obtained quotient by the difference between the power-supply potential $V_H$ and the power-supply potential $V_L$. (Equation 5)

Equation 5

$$V_{OUT} = \frac{A_T}{A_T + B_T} \cdot (V_H - V_L) = \frac{1}{2} \cdot \frac{2^n}{2^n - 1} \cdot (V_H - V_L) \quad (5)$$

In this way, by the ON/OFF operation of the switches, the n-bit digital signals can be converted into an analog gradation voltage signal.

By the use of FIG. 1D, the operation of the DAC according to the invention in case that, of the digital signals Da inputted to the DAC of the invention, $Da_0$ and $Da_1$ are 0, while $Da_2, Da_3, \ldots, Da_{n-1}$ are all 1, will be described.

Since $Da_0$ and $Da_1$ are 0, $SWa_0$ and $SWa_1$ are turned off, while, conversely, the $SWb_0$ and $SWb_1$ are turned on, and the output line is connected to the power-supply voltage line H through the resistors $B_0$ and $B_1$. On the other hand, since $Da_2, Da_3, \ldots, Da_{n-1}$ are all 1, $SWa_2, SWa_3, \ldots, SWa_{n-1}$ are all turned on, while, conversely, $SWb_2, SWb_3, \ldots, SWb_{n-1}$ are all turned off, and the output line is connected to the power-supply voltage line L through the resistors $A_2, A_3, \ldots, A_{n-1}$.

Of the resistors $A_0, A_1, \ldots, A_{n-1}$, the combined resistance of all those resistors (In this case, the resistors $A_2, A_3, \ldots, A_{n-1}$ correspond to those registers) which are connected to the switches $SWa_2, SWa_3, \ldots, SWa_{n-1}$, that are in ON state is assumed to be $A_T$. Further, of the resistors $B_0, B_1, \ldots, B_{n-1}$, the combined resistance of all those resistors (In this case, the resistors $B_0$ and $B_1$ correspond to those registers) which are connected to the switches $SWb_0$ and $SWb_1$ that are in ON state is assumed to be $B_T$.

The reciprocal number of the combined resistance $A_T$ is equal to the sum of the reciprocal numbers of the respective resistors $A_2, A_3, \ldots, A_{n-1}$, which are connected to the switches $SWa_2, SWa_3, \ldots, SWa_{n-1}$, which are in ON state. (Equation 6)

Equation 6

$$\frac{1}{A_T} = \frac{1}{A_2} + \frac{1}{A_3} + \cdots + \frac{1}{A_{n-2}} + \frac{1}{A_{n-1}} \quad (6)$$
$$= \frac{1}{2^2 R} + \frac{1}{2^3 R} + \cdots + \frac{1}{2^{n-2} R} + \frac{1}{2^{n-1} R}$$

By solving the equation 6 with respect to $A_T$, the equation 7 is obtained.

Equation 7

$$\therefore A_T = \frac{2^{n-1}}{2^{n-3} + 2^{n-4} + \cdots + 2 + 1} R \quad (7)$$

Further, similarly, the reciprocal number of the combined resistance $B_T$ is equal to the sum of the reciprocal numbers of the respective resistors $B_0$ and $B_1$ which are connected to the switches $SWb_0$ and $SWb_1$ that are in ON state. (Equation 8)

Equation 8

$$\frac{1}{B_T} = \frac{1}{B_0} + \frac{1}{B_1} = \frac{1}{R} + \frac{1}{2R} \quad (8)$$

By solving the equation 8 with respect to $B_T$, the equation 9 is obtained.

Equation 9

$$\therefore B_T = \tfrac{2}{3} R \quad (9)$$

By the use of the combined resistance $A_T$ and the combined resistance $B_T$ evaluated in accordance with the equation 7 and the equation 9, the output potential $V_{out}$ ($Da_0 = Da_1 = 0, Da_2 = Da_3 = \ldots = Da_{n-1} = 1$) from the output line of the DAC is evaluated. The output potential $V_{out}$ ($Da_0 = Da_1 = 0, Da_2 = Da_3 = \ldots = D_{n-1} = 1$) is what results from dividing the combined resistance $A_T$ of the equation 7 by the sum of the combined resistance $A_T$ of the equation 7 and the combined resistance $B_T$ of the equation 9 and then multiplying the thus obtained quotient by the difference between the power-supply potential $V_H$ and the power-supply potential $V_L$. (Equation 10)

Equation 10

$$V_{OUT} = \frac{A_T}{A_T + B_T} \cdot (V_H - V_L) = \frac{3}{4} \cdot \frac{2^n}{2^n - 1} \cdot (V_H - V_L) \quad (10)$$

In this way, by turning on or off the switches, the n-bit digital signals can be converted into an analog gradation voltage signal.

In the above, description has been made, by the use of the equations 1 to 10, with reference to the case where the values of the individual digital signals are concretely known; and, hereinbelow, the combined resistance $A_T$, the combined resistance $B_T$ and the output potential $V_{out}$ of the DAC according to the invention will be represented by the use of general expressions.

The reciprocal number of the combined resistance $A_T$ is equal to the sum of the reciprocal numbers of the respective resistors connected to those switches, of the switches $SWa_0, SWa_1, \ldots, SWa_{n-1}$, which are in ON state. Of the switches $SWa_0, SWa_1, \ldots, SWa_{n-1}$, those switches which are in ON state are the switches to which the digital signals $Da_0, Da_1, \ldots, Da_{n-1}$ being 1 are inputted. Thus, the reciprocal number of the combined resistance $A_T$ is equal to the sum of the products obtained by multiplying the reciprocal numbers of the respective resistors $A_0, A_1, \ldots, A_{n-1}$ connected to the switches $SWa_0, SWa_1, \ldots, SWa_{n-1}$, by the values of the digital signals Da corresponding to the respective switches $SWa_0, SWa_1, \ldots, SWa_{n-1}$. (Equation 11)

Equation 11

$$\frac{1}{A_T} = \frac{Da_0}{A_0} + \frac{Da_1}{A_1} + \cdots + \frac{Da_{n-2}}{A_{n-2}} + \frac{Da_{n-1}}{A_{n-1}} \quad (11)$$
$$= \frac{Da_0}{R} + \frac{Da_1}{2R} + \cdots + \frac{Da_{n-2}}{2^{n-2} R} + \frac{Da_{n-1}}{2^{n-1} R}$$

By solving the equation 11 with reference to $A_T$, the equation 12 is obtained.

Equation 12

$$\therefore A_T = \frac{2^{n-1}}{2^{n-1}Da_0 + 2^{n-2}Da_1 + \cdots + 2Da_{n-2} + Da_{n-1}} R \quad (12)$$

Further, similarly, the reciprocal number of the combined resistance $B_T$ is equal to the sum of the products obtained by multiplying the reciprocal numbers of the respective resistors $B_0, B_1, \ldots, B_{n-1}$ connected to the switches $SWb_0$, $SWb_1$, $SWb_{n-1}$, by the values of the digital signals Db corresponding to the respective switches $SWb_0, SWb_1, \ldots, SWb_{n-1}$. (Equation 13)

Equation 13

$$\frac{1}{B_T} = \frac{Db_0}{B_0} + \frac{Db_1}{B_1} + \cdots + \frac{Db_{n-2}}{B_{n-2}} + \frac{Db_{n-1}}{B_{n-1}} \quad (13)$$
$$= \frac{Db_0}{R} + \frac{Db_1}{2R} + \cdots + \frac{Db_{n-2}}{2^{n-2}R} + \frac{Db_{n-1}}{2^{n-1}R}$$

By solving the equation 13 with reference to $B_T$, the equation 14 is obtained.

Equation 14

$$\therefore B_T = \frac{2^{n-1}}{2^{n-1}Db_0 + 2^{n-2}Db_1 + \cdots + 2Db_{n-2} + Db_{n-1}} R \quad (14)$$

The output voltage $V_{out}$ is what results from dividing the combined resistance $A_T$ of the equation 12 by the sum of the combined resistance $A_T$ of the equation 12 and the combined resistance $B_T$ of the equation 14 and then multiplying the thus obtained quotient by the difference between the power-supply potential $V_H$ and the power-supply potential $V_L$. (Equation 15)

Equation 15

$$V_{OUT} = \frac{A_T}{A_T + B_T} \cdot (V_H - V_L) = \quad (15)$$
$$\frac{2^{n-1}Db_1 + 2^{n-2}Db_2 + \cdots + 2Db_{n-1} + Db_n}{2^n - 1} \cdot (V_H - V_L)$$

In this way, the output potential $V_{out}$ which is determined depending on the values of the digital signals Da is outputted from the output line. As may be apparent from the equation 15, the output potential $V_{out}$ is not determined by the value of the resistance value R. Further, the amplitude of the output potential $V_{out}$ can be determined by the difference between $V_H$ and $V_L$.

In the DAC according to the invention, it is not necessary to provide switches or graduation voltage lines in the same number as the bit number of the digital signals as in case of a conventional DAC. Therefore, the area of the DAC can be kept down, and thus, the miniaturization of driving circuits and active matrix liquid crystal display device has become possible.

Further, in case of the conventional DAC, it was necessary to exponentially increase the number of the switches as the bit number of the digital signals increased. According to the invention, however, in case of converting n-bit digital signals, the number of the switches has become 2n. Thus, even if the bit number is increased, it becomes possible to hold down the increase of the switch number unlike in case of the known DAC; and thus, it has become possible to miniaturize driving circuits and active matrix liquid crystal display devices.

Further, since the area of the DAC itself can be held down, the area of the driving circuit can be held down even if the number of the D/A conversion circuits is increased by increasing the number of the pixels, that is, by increasing the source signal lines; and thus, it has become possible to fabricate a highly precise and minute active matrix liquid crystal display device.

Further, unlike in case of a capacitance division type DAC, the period of time for accumulating charges in the capacitance and the period of time for discharging the charges accumulated in the capacitance to reset them to the same charges as the GND (ground) are not needed any more, so that the operating speed is enhanced as compared with the capacitance division type DAC.

Embodiment Mode 2

This embodiment mode will be described with reference to an example of the case where a DAC for converting 2-bit digital signals into an analog gradation voltage signal is fabricated by the use of thin film transistors. This embodiment mode is not limited to this bit number.

FIG. 5A shows a detailed circuit diagram of a DAC, for converting 2-bit digital signals into an analog gradation voltage signal. To the DAC, a digital signal $Da_0$ is inputted through $IN_0$, and a digital signal $Da_1$ is inputted through $IN_1$.

The digital signal $Da_0$ inputted through $IN_0$ is inputted to $SWa_0$, so that the ON or OFF of the $SWa_0$ is determined by the digital signal $Da_0$. The digital signal $Db_0$ resulting from inverting the digital signal $Da_0$ by an inverter is inputted to $SWb_0$, so that the ON or OFF of the $SWb_0$ is determined by the digital signal $Db_0$. Since the $Db_0$ is thus the inverted signal of the $Da_0$, the $SWb_0$ is turned off in case that the $SWa_0$ is turned on, and the $SWb_0$ is turned on in case that the $SWa_0$ is turned off.

In case that the digital signal $Da_1$ is inputted to the $IN_1$, the $SWa_1$ and the $SWb_1$ are controlled by the digital signal $Da_1$ in the same way as in case that the digital signal $Da_0$ is inputted to the $IN_0$.

FIG. 5B shows an example of the concrete circuit diagram of the inverters used in this embodiment mode. Through $V_{in}$, a digital signal of 1 or 0 is inputted. In this embodiment mode, 1 stands for a Hi signal, while 0 stands for a Lo signal. Vddh indicates that the same power-supply potential as the Hi of the digital signal is applied, and Vss indicates that the same power-supply potential as the Lo of the digital signal is applied.

When the Hi digital signal is applied to the $V_{in}$, the Lo digital signal is outputted from the $V_{out}$. Conversely, if the Lo digital signal is applied to the $V_{in}$, the Hi digital signal is outputted from the $V_{out}$.

In case of this embodiment mode, as the resistance provided in the DAC, the internal resistance of the thin film transistors (TFTs) forming the switch SW group. The internal resistance of the TFT means the resistance, existing in the direction which connects the source region and the drain region, in the channel forming region that the active layer of the TFT has. FIG. 6 shows an example of the concrete circuit diagram of the switch SW group used in this embodiment mode.

As shown in FIG. 6, the switch SW group includes an N-channel type thin film transistor (N-channel type TFT)

and a P-channel type thin film transistor (P-channel type TFT). One of the source region and the drain region of each of the N-channel type TFT and the P-channel type TFT is connected to the output line, while the other region is connected to the power-supply voltage line.

When the digital signal of 1 is applied to the switch SW group, the source regions and the drain regions of the N-channel type TFT and the P-channel type TFT in the switch SW group are brought into an electrically conducting state; and the switch group is turned on.

Conversely, if the digital signal of 0 is applied, the source regions and the drain regions of the N-channel type TFT and the P-channel type TFT in the switch SW group are brought into an electrically non-conducting state, so that the switch group is turned off.

FIG. 7 shows an example of the top view of a thin film transistor used in the switch SW group. The active layer and the gate electrode are provided as shown in FIG. 7. The gate electrode is constituted in such a manner that a portion of the gate signal line is functioned as gate electrode. Though not shown, a gate insulating film is provided between the active layer and the gate electrode.

A source region and a drain region into which an impurity with one conductivity type is added, are provided in the active layer. Further, between the source region and the drain region, there is provided a channel forming region which forms a channel upon application of a voltage to the gate electrode.

The length of the channel forming region in the direction which connects the source region and the drain region to each other is defined as channel length (L). Further, the length of the channel forming region in the direction perpendicular to the direction which connects the source region and the drain region to each other is defined as channel width (W).

The resistance value of the internal resistance of the thin film transistor (TFT) is determined depending on the channel width (W) in case that the channel length (L) is equal. The resistance value of the internal resistance is inversely proportional to the channel width, so that, in case that the resistance value of the internal resistance of the TFT is to be doubled, the channel width (W) is halved, while, in case that the resistance value of the internal resistance of the TFT is to be made $2^2$ times, the channel width (W) is made $\frac{1}{2}^2$ times.

In this embodiment mode, it is important to equalize the resistance values of the internal resistances of the N-channel type TFT and the P-channel type TFT to such a degree that the analog graduation voltage signal outputted from the he DAC is not adversely affected.

This embodiment mode has been described with reference to a DAC based on the circuit diagram shown in FIG. 5, but this embodiment mode is not necessarily limited to this circuit diagram, but the designer can suitably modify it in accordance with his use.

Further, this embodiment mode has been described with reference to an example of the case where the resistance value of the internal resistance of the thin film transistor is changed by controlling the channel width (W), but the resistance value of the internal resistance of the thin film transistor may also be changed by controlling the channel length (L). The resistance value of the internal resistance of the TFT is proportional to the channel length (L). Thus, in case that the resistance value of the internal resistance of the TFT is to be doubled, the channel length (L) is doubled, and, in case that the resistance value of the internal resistance of the TFT is to be increased to $2^2$ times, the channel length (L) is made $2^2$ times. Further, by controlling the channel length (L) and the channel width (W) both together, it is also possible to control the resistance value of the internal resistance of the TFT.

In the DAC according to the present invention, it is not necessary to provide the same number of switches or gradation voltage lines as the bit number of the digital signals as in case of the conventional DAC. As a result, it becomes possible to hold down the area of the DAC; and thus, the miniaturization of the driving circuit and the active matrix liquid crystal display device has become possible.

Further, in case of the conventional DAC, if the bit number of the digital signals increased, it was necessary to exponentially increase the number of the switches. According to the invention, however, in case of converting n-bit digital signals, the number of the switches has become 2n. As seen above, even if the bit number increases, it becomes possible to hold down the increase of the switch number unlike in case of the conventional DAC; and thus, the miniaturization of the driving circuit and the active matrix liquid crystal display device has become possible.

Further, since the area itself of the DAC is held down, the area of the driving circuit is held down, even if the number of the D/A conversion circuits is increased by increasing the pixel number, that is, the source signal lines; and thus, the fabrication of a highly precise and minute active matrix liquid crystal display device has become possible.

Further, since the period of time for accumulating charges in the capacitance and the period of time for discharging the charges accumulated in the capacitance to reset the charges to the same charges as the GND (ground) become unnecessary unlike in case of the capacitance division type DAC, the operating speed is enhanced as compared with the capacitance division type DAC.

Further, in this embodiment mode, the DAC is constituted by utilizing the internal resistances of the thin film transistors that the switches have. As a result, unlike in case of the Embodiment Mode 1, it is unnecessary to provide resistors anew, and thus, it becomes possible to hold down the area of the DAC and, in turn, the area of the semiconductor device that include the DAC. Further, the number of steps for fabricating the DAC itself can be held down.

DESCRIPTION OF THE PREFERRED EMBODIMENTS

Figure 1A:
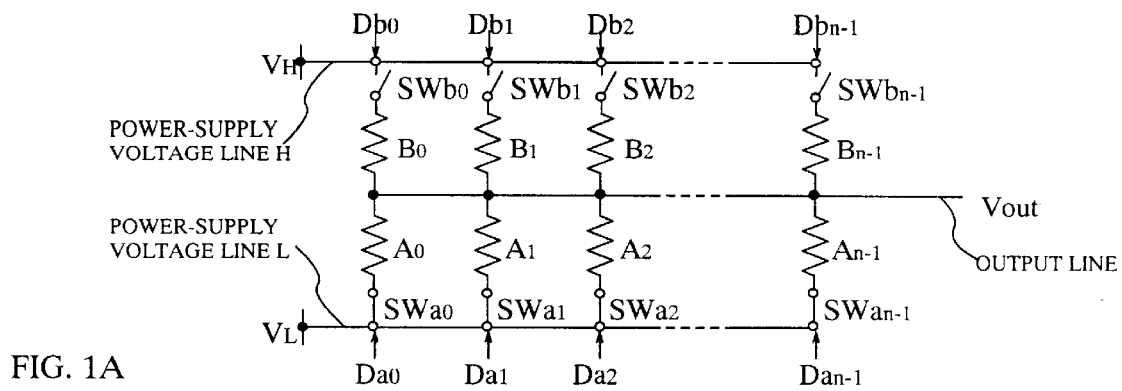
FIGS. 1A–1D show circuit diagrams of the DAC according to Embodiment Mode 1.
Figure 1B:
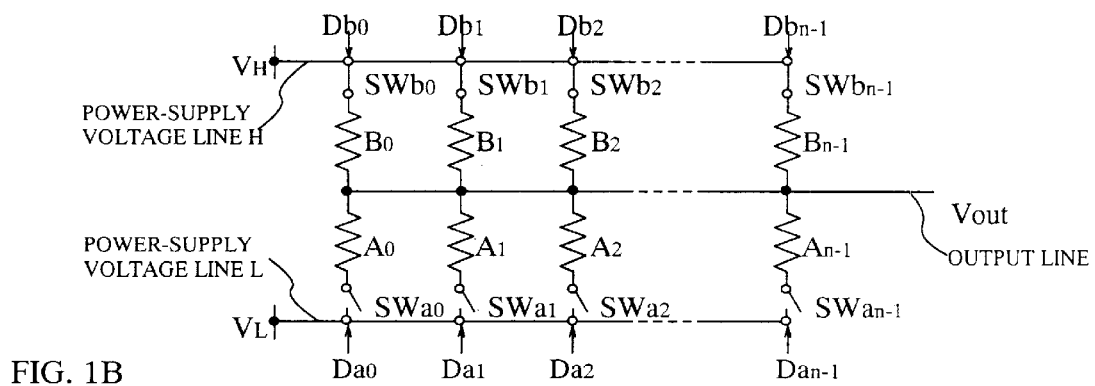
Figure 1C:
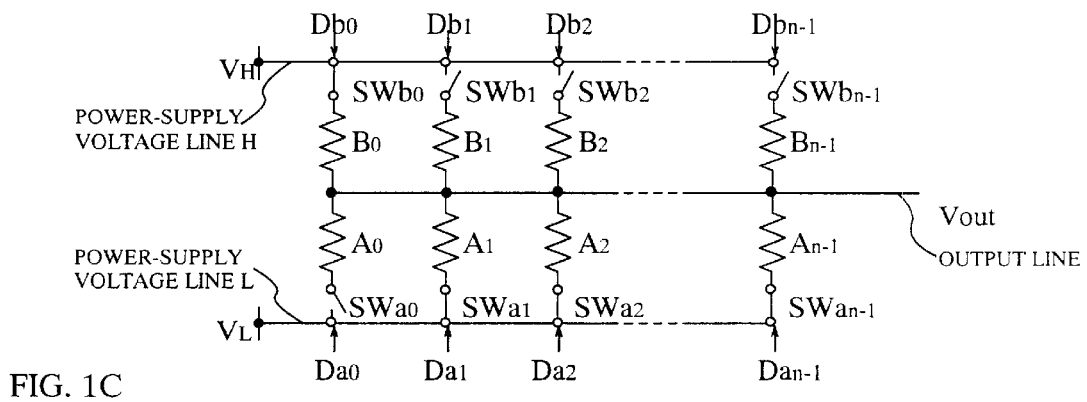
Figure 1D:
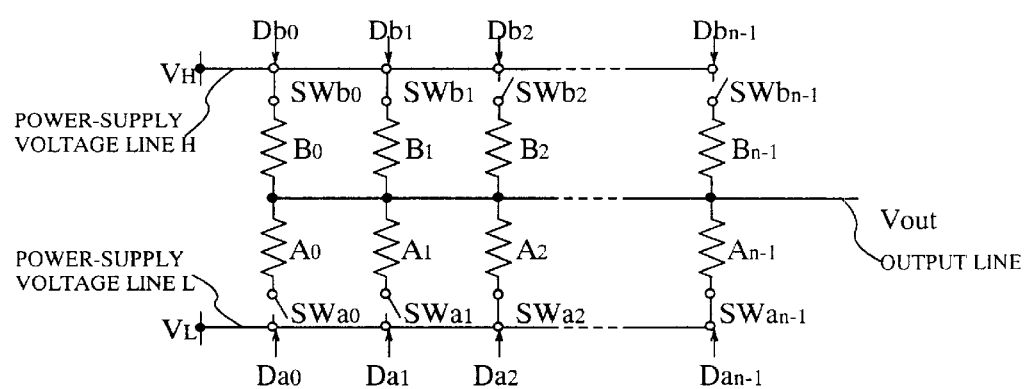

Embodiments of the DAC according to the invention will now be described. However, the concrete constitution of the DAC according to the invention is not limited to the constitutions of the embodiments to follow.

Embodiment 1

This embodiment will be described, by the use of FIGS. 2A–2D, with reference to an example of the DAC corresponding to 4-bit digital signals.

The DAC of this embodiment shown in FIGS. 2A–2D converts 4-bit digital signals Da ($Da_0$, $Da_1$, ..., $Da_3$) into an analog gradation voltage signal. In this embodiment, the power-supply potential $V_H$ is set to 5 V, and the power-supply voltage $V_L$ is set to 0 V, but the present invention is not limited to these values.

As shown in FIGS. 2A–2D, the DAC according to the invention includes 4 switches $SWa_0$, $SWa_1$, ..., $SWa_3$ and four switches $SWb_0$, $SWb_1$, ..., $SWb_3$. The DAC also includes four resistors $A_0$, $A_1$, ..., $A_3$ and four resistors $B_0$, $B_1$, ..., $B_3$.

Here, the circuit arrangement of the DAC according to the invention will be described.

Both ends of the resistor $A_0$ are respectively connected to the switch $SWa_0$ and the output line. That end of the switch $SWa_0$ which is not connected to the resistor $A_0$ is connected to the power-supply voltage line L. In this embodiment, the internal resistance of the switch SW group is regarded as 0, but it is permissible to design the circuit by taking the internal resistance of the switch SW group into account.

Further, both ends of the resistor $A_1$ are respectively connected to the switch $SWa_1$ and the output line. That end of the switch $SWa_1$ which is not connected to the resistor $A_1$ is connected to the power-supply voltage line L.

Further, both ends of the resistor $A_2$ are respectively connected to the switch $SWa_2$ and the output line. That end of the switch $SWa_2$ which is not connected to the resistor $A_2$ is connected to the power-supply voltage line L.

Similarly, both ends of the resistor $A_3$ are respectively connected to the switch $SWa_3$ and the output line. That end of the switch $SWa_3$ which is not connected to the resistor $A_3$ is connected to the power-supply voltage line L.

The relationship between the resistors $B_0$, $B_1$, ..., $B_3$ and the switches $SWb_0$, $SWb_1$, ..., $SWb_3$ is also similar to the relationship between the resistors $A_0$, $A_1$, ..., $A_3$ and the switches $SWa_0$, $SWa_1$, ..., $SWa_3$. That is, both ends of the respective resistors $B_0$, $B_1$, ..., $B_3$ are connected to the respective switches $SWb_0$, $SWb_1$, ..., $SWb_3$ and the output line. Those ends of the respective switches $SWb_0$, $SWb_1$, ..., $SWb_3$ which are not connected to the resistors $B_0$, $B_1$, ..., $B_3$ are connected to the power-supply voltage line H.

Next, the operation of the DAC according to this embodiment will be described.

When the switch $SWa_0$ is turned on, the power-supply voltage line L and the resistor $A_0$ are connected to each other. In other words, when the switch $SWa_0$ is turned on, that end of the resistor $A_0$ which is connected to the switch $SWa_0$ is maintained at the same potential as the power-supply potential $V_L$. Conversely, if the switch $SWa_0$ is turned off, then the connection between the power-supply voltage line L and the resistor $A_0$ is cut off.

Further, if the switch $SWa_1$ is turned on, then the power-supply voltage line L and the resistor $A_1$ are connected to each other. In other words, if the switch $SWa_1$ is turned on, then that end of the resistor $A_1$ which is connected to the switch $SWa_1$ is maintained at the same potential as the power-supply potential $V_L$. Conversely, if the switch $SWa_1$ is turned off, then the connection between the power-supply voltage line L and the resistor $A_1$ is cut off.

Further, if the switch $SWa_2$ is turned on, then the power-supply voltage line L and the resistor $A_2$ are connected to each other. In other words, if the switch $SWa_2$ is turned on, then that end of the resistor $A_2$ which is connected to the switch $SWa_2$ is maintained at the same potential as the power-supply potential $V_L$. Conversely, if the switch $SWa_2$ is turned off, then the connection between the power-supply voltage line L and the resistor $A_2$ is cut off.

Similarly, if the switch $SWa_3$ is turned on, then the power-supply voltage line L and the resistor $A_3$ are connected to each other. In other words, if the switch $SWa_3$ is turned on, then that end of the resistor $A_3$ which is connected to the switch $SWa_3$ is maintained at the same potential as the power-supply potential $V_L$. Conversely, if the switch $SWa_3$ is turned off, then the connection between the power-supply voltage line L and the resistor $A_3$ is cut off.

As mentioned above, if each of the switches $SWa_0$, $SWa_1, \ldots, SWa_3$ is turned on, then the power-supply voltage line L and each of the resistors $A_0, A_1, \ldots, A_3$ are connected to each other. In other words, if each of the switches $SWa_0$, $SWa_1, \ldots, SWa_3$ is turned on, then that end of each of the resistors $A_0, A_1, \ldots, A_3$ which is connected to each of the switches $SWa_0, SWa_1, \ldots, SWa_3$ is maintained at the same potential as the power-supply potential $V_L$. Conversely, if each of the switches $SWa_0, SWa_1, \ldots, SWa_3$ is turned off, then the connection between the power-supply voltage line L and each of the resistors $A_0, A_1, \ldots, A_3$ is cut off.

Similarly, if each of the switches $SWb_0, SWb_1, \ldots, SWb_3$ is turned on, then the power-supply voltage line H and each of the resistors $B_0, B_1, \ldots, B_3$ are connected to each other. In other words, if each of the switches $SWb_0, SWb_1, \ldots, SWb_3$ is turned on, then that end of each of the resistors $B_0, B_1, \ldots, B_3$ which is connected to each of the switches $SWb_0, SWb_1, \ldots, SWb_3$ is maintained at the same potential as the power-supply potential $V_H$. Conversely, if each of the switches $SWb_0, SWb_1, \ldots, SWb_3$ is turned off, then the connection between the power-supply voltage line H and each of the resistors $B_0, B_1, \ldots, B_3$ is cut off.

The ON or OFF of the switch SWa group and the switch SWb group is determined depending on the digital signals $Da_0, Da_1, \ldots, Da_3$ inputted to the DAC.

If the digital signals Da are inputted to the DAC, then the digital signals Da are inputted to the switches $SWa_0$, $SWa_1, \ldots SWa_3$, and the inverted signals Db of the digital signals Da are inputted to the switches $SWb_0, SWb_1, \ldots, SWb_3$.

If the digital signals Da which are inputted to the respective switches $SWa_0, SWa_1, \ldots, SWa_3$ are 1, then the switches $SWa_0, SWa_1, \ldots, SWa_3$ are respectively turned on. The digital signals Db which are inputted to the respective switches $SWb_0, SWb_1, \ldots, SWb_3$ are the inversions of the digital signals Da and are thus 0, so that the switches $SWb_0, SWb_1, \ldots, SWb_3$ are respectively turned off.

Conversely, if the digital signals Da inputted to the respective switches $SWa_0, SWa_1, \ldots, SWa_3$ are 0, then the switches $SWa_0, SWa_1, \ldots, SWa_3$ are respectively turned off. The digital signals Db which are then inputted to the respective switches $SWb_0, SWb_1, \ldots, SWb_3$ are the inversions of the digital signals Da and are thus 1, so that the switches $SWb_0, SWb_1, \ldots, SWb_3$ are respectively turned on.

In this way, the switch SWa group and the switch SWb group are operatively associated with each other.

Figure 2A:
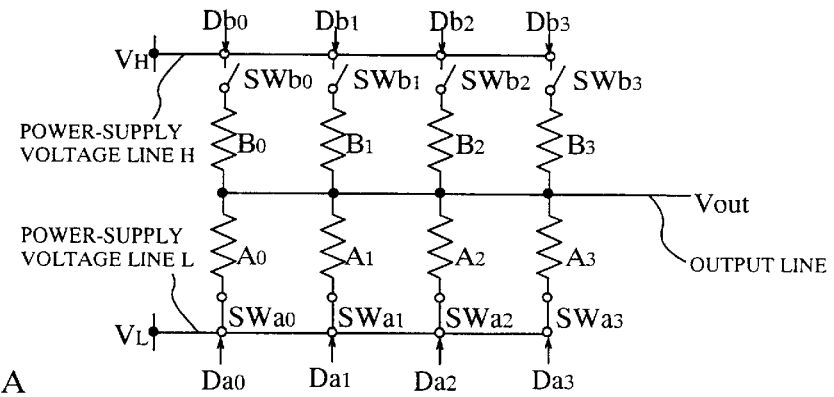
FIGS. 2A–2D show circuit diagrams of the DAC according to Embodiment 1.

The operation performed by the DAC of the invention in case that the digital signals Da $(Da_0, Da_1, \ldots Da_3)$ inputted to the DAC are all 1 will be described by the use of FIG. 2A.

In case that the digital signals Da $(Da_0, Da_1, \ldots, Da_3)$ inputted to the DAC are all 1, the switches $SWa_0, SWa_1, \ldots, SWa_3$ are all turned on, and the output line is connected to the power-supply voltage line L through each of the resistors $A_0, A_1, \ldots, A_3$. Conversely, the digital signals $Db_0$, $Db_1, \ldots, Db_3$ all become 0, so that the switch $SWb_0$, $SWb_1, \ldots, SWb_3$ are all turned off, and thus, the output line is brought into a state disconnected from the power-supply voltage line H. (FIG. 2A).

As a result, the power-supply potential $V_L$ on the power-supply voltage line L is directly outputted from the output line. The output potential $V_{out}$ from the output line of the DAC becomes $V_{out}$ ($Da_0=Da_1= \ldots =Da_3=1)=V_L=0$ V.

Figure 2B:
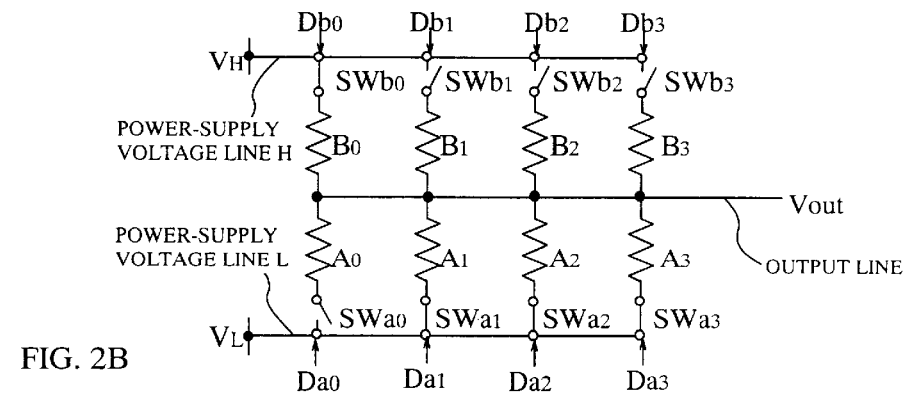

The operation performed by the DAC of the invention in case that, of the digital signals Da inputted to the DAC of the invention, only $Da_0$ is 0, while $Da_1, Da_2$ and $Da_3$ are all 1, will be described by the use of FIG. 2B.

Since $Da_0$ is 0, $SWa_0$ is turned off, while $SWb_0$ is, conversely, turned on, so that the output line is connected to the power-supply voltage line H through the resistor $B_0$. On the other hand, since $Da_1, Da_2, \ldots, Da_3$ are all 1, $SWa_1, \ldots,$ $SWa_3$ are all turned on, while, conversely, $SWb_1, SWb_2$ and $SWb_3$ are all turned off, and thus, the output line is connected to the power-supply voltage line L through the resistors $A_1, A_2, A_3$.

The combined resistance of all those resistors (in this case, the resistors $A_1, A_2, A_3$ correspond to those resistors), of the resistors $A_0, A_2, \ldots, A_3$, which are connected to the switches $SWa_1, SWa_2, SWa_3$ that are in ON state are assumed to be $A_T$. Further, the combined resistance of all those resistors (in this case, the resistor $B_0$ corresponds to those resistors), of the resistors $B_0, B_1, \ldots, B_3$, which are connected to the switch $SWb_0$ that is in ON state is assumed to be $B_T$.

The reciprocal number of the combined resistance $A_T$ is equal to the sum of the reciprocal numbers of the respective resistors $A_1, A_2, A_3$ connected to the switches $SWa_1, SWa_2$, $SWa_3$ which are in ON state. (Equation 16)

Equation 16

$$\frac{1}{A_T} = \frac{1}{A_1} + \frac{1}{A_2} + \frac{1}{A_3} = \frac{1}{2R} + \frac{1}{2^2R} + \frac{1}{2^3R} \qquad (16)$$

By solving the equation 16 with respect to $A_T$, the equation (17) is obtained.

Equation 17

$$\therefore A_T = 8/7 R \qquad (17)$$

Further, similarly, the reciprocal number of the combined resistance $B_T$ is equal to the reciprocal number of the resistor $B_0$ connected to the switch $SWb_0$ which is in ON state. (Equation 18)

Equation 18

$$\frac{1}{B_T} = \frac{1}{B_0} = \frac{1}{R} \qquad (18)$$

By solving the equation 18 with respect to $B_T$, the equation 19 is obtained.

Equation 19

$$\therefore B_T = R \qquad (19)$$

By the use of the combined resistance $A_T$ and the combined resistance $B_T$ evaluated by the equation 17 and the equation 19, the output potential $V_{out}$ ($Da_0=0$, $Da_1=Da_2=Da_3=1$) from the output line of the DAC is evaluated in accordance with the following equation 20. The output potential $V_{out}$ ($Da_0=0$, $Da_1=Da_2=Da_3=1$) is what results from dividing the combined resistance $A_T$ of the equation 17 by the sum of the combined resistance $A_T$ of the equation 17 and the combined resistance $B_T$ of the equation 19 and then multiplying the thus obtained quotient by 5 which is the difference between the power-supply potential $V_H$ and the power-supply potential $V_L$.

Equation 20

$$V_{OUT} = \frac{A_T}{A_T + B_T} \cdot (V_H - V_L) = \frac{8}{15} \cdot (V_H - V_L) = \frac{8}{3} \quad (20)$$

In this way, by the ON/OFF of the switches, the n-bit digital signals can be converted into an analog gradation voltage signal.

Figure 2C:
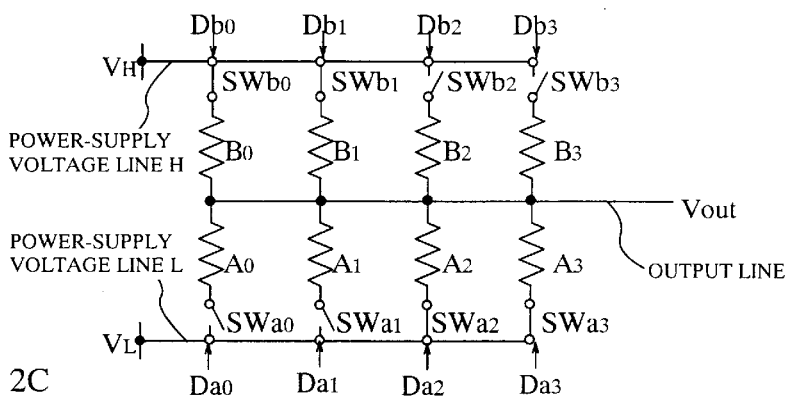

By the use of FIG. 2C, the operation performed by the DAC according to the invention in case that, of the digital signals Da inputted to the DAC, $Da_0$ and $Da_1$ are 0, while $Da_2$ and $Da_3$ are 1, will be described.

Since $Da_0$ and $Da_1$ are 0, $SWa_0$ and $SWa_1$ are turned off, while, conversely, $SWb_0$ and $SWb_1$ are turned on, so that the output line is connected to the power-supply voltage line H through the resistors $B_0$ and $B_1$. On the other hand, since $Da_2$ and $Da_3$ are 1, $SWa_2$ and $SWa_3$ are turned on, while, conversely, $SWb_2$ and $SWb_3$ are turned off, so that the output line is connected to the power-supply voltage line L through the resistors $A_2$, $A_3$.

The combined resistance of all those resistors (In this case, the resistors $A_2$, $A_3$ correspond to those registers), of the resistors $A_0$, $A_1$, ..., $A_3$, which are connected to the switches. $SWa_2$, $SWa_3$, which are in ON state is assumed to be $A_T$. Further, of the resistors of the resistors B, the combined resistance of all those resistors (in this case, the resistors $B_0$ and $B_1$ correspond to those registers), of the resistors B, which are connected to the switches $SWb_0$ and $SWb_1$ that are in ON state is assumed to be $B_T$.

The reciprocal number of the combined resistance $A_T$ is equal to the sum of the reciprocal numbers of the respective resistors $A_2$, $A_3$ connected to the switches $SWa_2$, $SWa_3$ which are in ON state. (Equation 21)

Equation 21

$$\frac{1}{A_T} = \frac{1}{A_2} + \frac{1}{A_3} = \frac{1}{2^2 R} + \frac{1}{2^3 R} \quad (21)$$

By solving the equation 21 with respect to $A_T$, the equation 22 is obtained.

Equation 22

$$\therefore A_T = \tfrac{8}{3} R \quad (22)$$

Further, similarly, the reciprocal number of the combined resistance $B_T$ is equal to the sum of the reciprocal numbers of the respective resistors $B_0$, $B_1$ which are connected to the switches $SWb_0$ and $SWb_1$ that are in ON state. (Equation 23)

Equation 23

$$\frac{1}{B_T} = \frac{1}{B_0} + \frac{1}{B_1} = \frac{1}{R} + \frac{1}{2R} \quad (23)$$

By solving the equation 8 with respect to $B_T$, the equation 24 is obtained.

Equation 24

$$\therefore B_T = \tfrac{2}{3} R \quad (24)$$

By the use of the combined resistance $A_T$ and the combined resistance $B_T$ evaluated in accordance with the equation 22 and the equation 24, the output potential $V_{out}$ ($Da_0=Da_1=0$, $Da_2=Da_3=1$) from the output line of the DAC is evaluated in accordance with the following equation 25. The output potential $V_{out}$ ($Da_0=Da_1=0$, $Da_2=Da_3=1$) is what results from dividing the combined resistance $A_T$ of the equation 22 by the sum of the combined resistance $A_T$ of the equation 22 and the combined resistance $B_T$ of the equation 24 and then multiplying the thus obtained quotient by 5 which is the difference between the power-supply potential $V_H$ and the power-supply potential $V_L$.

Equation 25

$$V_{OUT} = \frac{A_T}{A_T + B_T} \cdot (V_H - V_L) = \frac{4}{5} \cdot (V_H - V_L) = 4 \quad (25)$$

In this way, by the ON/OFF of the switches, the n-bit digital signals can be converted into an analog gradation voltage signal.

Figure 2D:
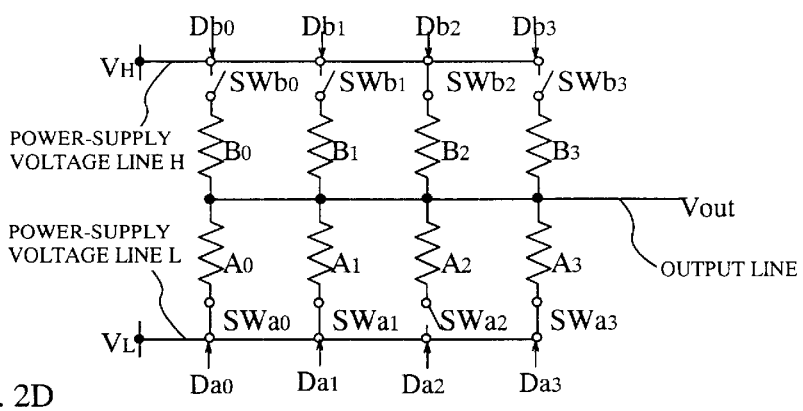

The operation performed by the DAC in case that, of the digital signals Da ($Da_0$, $Da_1$, ..., $Da_3$) inputted to the DAC of the invention, only $Da_2$ is 0, while $Da_0$, $Da_1$ and $Da_3$ are all 1, will be described by the use of FIG. 2D.

In case that $Da_2$ is 0, $SWa_2$ is turned off, while, conversely, $SWb_2$ is turned on, so that the output line is connected to the power-supply voltage line H through the resistor $B_2$. On the other hand, since $Da_0$, $Da_1$ and $Da_3$ are all 1, $SWa_0$, $SWa_1$ and $SWa_3$ are turned on, while, conversely, $SWb_0$, $SWb_1$ and $SWb_3$ are turned off, so that the output line is connected to the power-supply voltage line L through the resistors $A_0$, $A_1$, $A_3$ of the resistors A.

The combined resistance of all those resistors (In this case, the resistors $A_0$, $A_2$, $A_3$ correspond to those resistors), of the resistors $A_0$, $A_1$, ..., $A_3$, which are connected to the switch $SWa_0$, $SWa_1$ and $SWa_3$ that are in ON state is assumed to be $A_T$. Further, the combined resistance of all those resistors (In this case, the resistor $B_2$ correspond to those resistors) which are connected to the switch $SWb_2$ that is in ON state.

The reciprocal number of the combined resistance $A_T$ is equal to the sum of the reciprocal numbers of the respective resistors $A_0$, $A_1$, $A_3$ connected to the switches $SWa_0$, $SWa_1$, $SWa_3$ which are in ON state. (Equation 26)

Equation 26

$$\frac{1}{A_T} = \frac{1}{A_0} + \frac{1}{A_1} + \frac{1}{A_3} = \frac{1}{R} + \frac{1}{2R} + \frac{1}{2^3 R} \quad (26)$$

By solving the equation 26 with reference to $A_T$, the equation 27 is obtained.

Equation 27

$$\therefore A_T = \tfrac{8}{13} R \quad (27)$$

Further, similarly, the reciprocal number of the combined resistance $B_T$ is equal to the reciprocal number of the resistor $B_3$ connected to the switch $SWb_3$. (Equation 28)

Equation 28

$$\frac{1}{B_T} = \frac{1}{B_2} = \frac{1}{2^2 R} \qquad (28)$$

By solving the equation 28 with reference to $B_T$, the equation 29 is obtained.

Equation 29

$$\therefore B_T = 4R \qquad (29)$$

By the use of the combined resistance $A_T$ and the combined resistance $B_T$ obtained in accordance with the equation 27 and the equation 29, the output voltage $V_{out}$ ($Da_2=0$, $Da_0=Da_1=Da_3=1$) from the output line of the DAC is evaluated in accordance with the following equation 30. The output potential $V_{out}$ ($Da_2=0$, $Da_0=Da_1=Da_3=1$) is what results from dividing the combined resistance $A_T$ of the equation 27 by the sum of the combined resistance $A_T$ of the equation 27 and the combined resistance $B_T$ of the equation 29 and then multiplying the thus obtained quotient by 5 which is the difference between the power-supply potential $V_H$ and the power-supply potential $V_L$.

Equation 30

$$V_{OUT} = \frac{A_T}{A_T + B_T} \cdot (V_H - V_L) = \frac{2}{15} \cdot (V_H - V_L) = \frac{2}{3} \qquad (30)$$

In this way, by the ON/OFF of the switches, the n-bit digital signals can be converted into an analog gradation voltage signal.

In the above, description has been made, by the use of the equations 16 to 30, with reference to the case where the values of the digital signals are concretely known, but the combined resistance $A_T$, the combined resistance $B_T$ and the output potential $V_{out}$ of the DAC according to the invention will be represented below by the use of general expressions.

The reciprocal number of the combined resistance $A_T$ is equal to the sum of the reciprocal numbers of the respective resistors connected to those switches, of the switches $SWa_0$, $SWa_1$, ..., $SWa_3$, which are in ON state. Of the switches $SWa_0$, $SWa_1$, ..., $SWa_3$, those switches which are in ON state are the switches to which the digital signals $Da_0$, $Da_1$, ..., $Da_3$ being 1 are inputted. Thus, the reciprocal number of the combined resistance $A_T$ is equal to the sum of the products obtained by multiplying the reciprocal numbers of the respective resistors $A_0, A_1, \ldots, A_3$ connected to the switches $SWa_0, SWa_1, \ldots, SWa_3$, by the values of the digital signals Da corresponding to the respective switches $SWa_0$, $SWa_1$, ..., $SWa_3$. (Equation 31)

Equation 31

$$\frac{1}{A_T} = \frac{Da_0}{A_1} + \frac{Da_1}{A_1} + \frac{Da_2}{A_2} + \frac{Da_3}{A_3} \qquad (31)$$

$$= \frac{Da_0}{R} + \frac{Da_1}{2R} + \frac{Da_2}{2^2 R} + \frac{Da_3}{2^3 R}$$

By solving the equation 31 with reference to $A_T$, the equation 32 is obtained.

Equation 32

$$\therefore A_T = \frac{2^3}{2^3 Da_0 + 2^2 Da_1 + 2Da_2 + Da_3} R \qquad (32)$$

Further, similarly, the reciprocal number of the combined resistance $B_T$ is equal to the sum of the products obtained by multiplying the reciprocal numbers of the respective resistors $B_0, B_1, \ldots, B_3$ connected to the switches $SWb_0$, $SWb_1, \ldots, SWb_3$, by the values of the digital signals Db corresponding to the respective switches $SWb_0, SWb_1, \ldots,$ $SWb_3$. (Equation 33)

Equation 33

$$\frac{1}{B_T} = \frac{Db_0}{B_1} + \frac{Db_1}{B_1} + \frac{Db_2}{B_2} + \frac{Db_3}{B_3} \qquad (33)$$

$$= \frac{Db_0}{R} + \frac{Db_1}{2R} + \frac{Db_2}{2^2 R} + \frac{Db_3}{2^3 R}$$

By solving the equation 33 with reference to $B_T$, the equation 34 is obtained.

Equation 34

$$\therefore B_T = \frac{2^3}{2^3 Db_0 + 2^2 Db_1 + 2Db_2 + Db_3} R \qquad (34)$$

The output potential $V_{out}$ is what results from dividing the combined resistance $A_T$ of the equation 32 by the sum of the combined resistance $A_T$ of the equation 32 and the combined resistance $B_T$ of the equation 34 and then multiplying the thus obtained quotient by the difference between the power-supply potential $V_H$ and the power-supply potential $V_L$. (Equation 35)

Equation 35

$$V_{OUT} = \frac{A_T}{A_T + B_T} \cdot (V_H - V_L) \qquad (35)$$

$$= \frac{2^3 Db_0 + 2^2 Db_1 + 2Db_2 + Db_3}{15} \cdot (V_H - V_L)$$

$$= \frac{2^3 Db_0 + 2^2 Db_1 + 2Db_2 + Db_3}{3}$$

In this way, the output potential $V_{out}$ which is determined depending on the values of the digital signals Da is outputted from the output line. As may be understood from the equation 35, the output potential $V_{out}$ is not determined depending on the value of the resistance value R.

In the DAC according to this embodiment, it is not necessary to provide switches Lie or graduation voltage lines in the same number as the bit number of the digital signals as in case of the conventional DAC. Therefore, the area of the DAC can be held down, and thus, the miniaturization of driving circuits and active matrix liquid crystal display devices has become possible.

Further, in case of the conventional DAC, it was necessary to increase the number of the switches exponentially as the bit number of the digital signals increased. According to the present invention, however, even if the bit number is increased, it is possible to hold down the increase of the switch number unlike in case of the conventional DAC; and thus, it has become possible to miniaturize driving circuits and active matrix liquid crystal display devices.

Further, the area of the DAC itself can be held down, so that the area of the driving circuit can be held down even if the number of the D/A conversion circuits is increased by increasing the number of the pixels, that is, by increasing the source signal lines; and thus, it has become possible to fabricate a highly precise and minute active matrix liquid crystal display device.

In this embodiment, $V_H$ is set to 5 V, and $V_L$ is set to 0 V, but the invention is not limited to these values. The amplitude of the output potential $V_{out}$ can be determined depending on the difference between $V_H$ and $V_L$. Further, this embodiment has been described with reference to the case where the digital signals are of four bits, but the bit number of the digital signals is not limited to this value.

Embodiment 2

This embodiment will be described with reference to the case where the DAC according to Embodiment 1 is used in the driving circuit of an active matrix liquid crystal display device.

Figure 3:
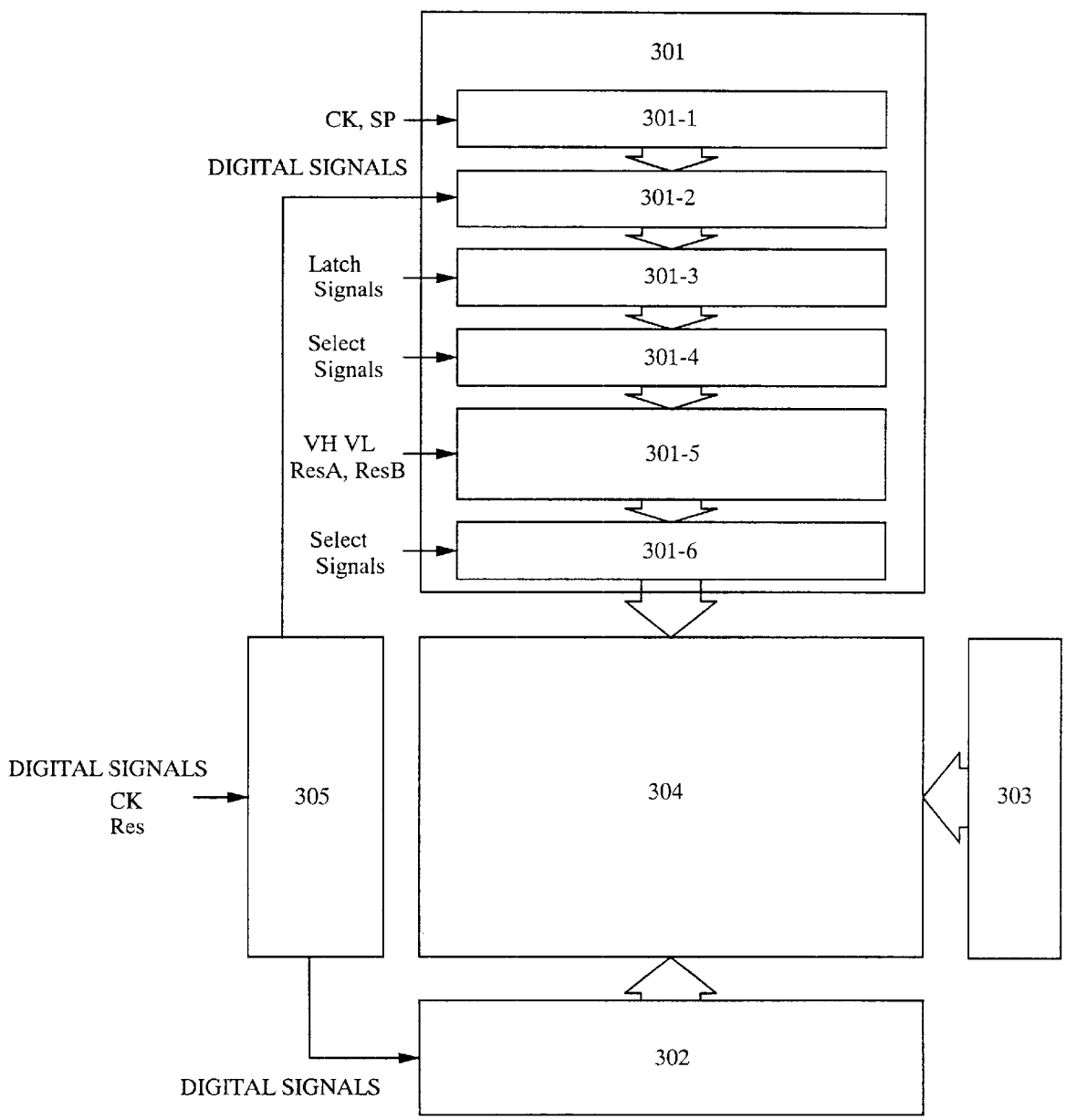
FIG. 3 is a block diagram showing an outline of the active matrix liquid crystal display device using the DAC of Embodiment 2.

FIG. 3 is a block diagram showing an outline of the active matrix liquid crystal display device according to this embodiment. The reference numeral 301 denotes a source signal line driving circuit A, and numeral 302 denotes a source signal line driving circuit B. Numeral 303 denotes a gate signal line driving circuit. Numeral 304 denotes a pixel portion. Numeral 305 denotes a digital video data dividing circuit (SPC; Serial-to-Parallel Conversion Circuit).

The source signal line driving circuit A 301 includes a source signal line side shift register circuit (a shift register circuit of 240 stages×2) 301-1, a latch circuit 1 (960×8 digital latch circuit) 301-2, a latch circuit 2 (960×8 digital latch circuit) 301-3, a selector circuit 1 301-4, a D/A conversion circuit (DAC) 301-5, and a selector circuit 2 301-6. The source signal line driving circuit A 301 further includes a buffer circuit and a level shifter circuit (not shown). Further, the source signal line driving circuit A 301 may also be constituted as including a level shift circuit though it is omitted for convenience' sake in the description.

The source signal line driving circuit B 302 has the same constitution as the source signal line driving circuit A 301. The source signal line driving circuit A 301 is constituted so as to feed odd-numbered source signal lines with a video signal (an analog gradation voltage signal), and the source signal line driving circuit B 302 is constituted so as to feed the even-numbered source signal lines with the video signal.

In the active matrix liquid crystal display device according to this embodiment, two source signal line driving circuits, the source signal line driving circuit A and the source signal line driving circuit B, are provided so as to sandwich the pixel portion 304 from above and beneath, for reasons relating to the layout of the circuit, but, if the circuit layout permits, it is also possible to provide only one source signal line driving circuit.

Further, numeral 303 denotes a gate signal line driving circuit, which includes a shift register circuit, a buffer circuit and a level shifter circuit (not shown).

The pixel portion 304 has 1920×1080 (breadthwise× lengthwise) pixels. For each of the pixels, a pixel TFT is disposed; and, to the source region of each pixel TFT, a source signal line is connected, and, to the gate electrode thereof, a gate signal line is connected. Further, to the drain region of each pixel TFT, a pixel electrode is connected. The pixel TFTs each control the feed of the video signal (an analog gradation voltage signal) to the pixel connected to each pixel TFT. To each pixel electrode, the video signal (analog gradation voltage signal) is fed, so that a voltage is applied to the liquid crystal sandwiched between each pixel electrode and the opposite electrode, whereby the liquid crystal is driven.

Here, the operation and the signal flow of the active matrix liquid crystal display device according to this embodiment will be described.

First, the operation of the source signal line driving circuit A 301 will be described. To the source signal line side shift register circuit 301-1, a clock signal (CK) and a start pulse (SP) are inputted. The source signal line side shift register circuit 301-1 successively produces timing signals on the basis of the clock signal (CK) and the start pulse (SP) to feed them to the circuit at the following stage through a buffer circuit and the like (not shown).

The timing signal from the source signal line side shift register circuit 301-1 is buffered by the buffer circuit and the like. To the source signal lines to which the timing signals are fed, a large number of circuits or elements are connected, so that the load capacitance (parasitic capacitance) thereof is large. In order to prevent the leading edge and the trailing edge of the timing signal from being blunted due to this large load capacitance, this buffer circuit is provided.

The timing signal thus buffered by the buffer circuit is fed to the latch circuit 1 (301-2). The latch circuit 1 (301-2) has 960 stages of latch circuits for processing the digital signals. The latch circuit 1 (301-2), when fed with the timing signal, successively takes in the digital signals fed from the digital video data division circuit and holds them.

The length of time required for the digital signals to be thoroughly written into all the stages of the latch circuit 1 (301-2) is called one line period. That is, the time interval from the point of time when the writing of the digital signal into the latch circuit at the leftmost-side stage in the latch circuit 1 (301-2) is started to the point of time when the writing of the digital signal into the latch circuit at the rightmost-side stage is terminated, is one line period. In actuality, the period comprising the above-mentioned line period plus the horizontal retrace period is called one line period in some cases.

After the completion of one line period, a latch signal is fed to the latch circuit 2 (301-3) in step with the operating timing of the shift register circuit 301-1. At this moment, the digital signals which are written and held in the latch circuit 1 (301-2) are sent out to the latch circuit 2 (301-3) all together and written into all the stages of the latch circuit 2 (301-3) and held there.

Into the latch circuit 1 (301-2) which has finished the transmission of the digital signals to the latch circuit 2 (301-3), the digital signals fed from the digital video data division circuit is successively carried out on the basis of the timing signal from the source signal line side shift register circuit 301-1.

During this second one-line period, the digital signals which are written and held in the latch circuit 2 (301-3) are successively selected by the selector circuit 1 (301-4) and fed to the D/A conversion circuit (DAC) 301-5. In the selector circuit 1 (301-4), one selector circuit corresponds to four source signal lines. As the selector circuit, the one disclosed in Japanese Patent Laid-Open No. 9-286098 can be used.

The digital signals selected by the selector circuit 301-4 are fed to the DAC 301-5.

The DAC 301-5 converts the digital signals into an analog gradation voltage signal, which is successively fed to the source signal lines selected by the selector circuit 2 (301-6). The Dac according to this embodiment corresponds to the digital signals, and its operation accords with the operation of Embodiment 1, and the output $V_{out}$ is represented by the above-mentioned equation 5.

The analog gradation voltage signal fed to the source signal lines is fed to the source regions of the pixel TFTs, in the pixel portion 304, connected to the source signal lines.

Numeral 302 denotes a source signal line driving circuit B, and its constitution is identical with the source signal line driving circuit A 301. The source signal line driving circuit B 302 feeds the even-numbered source signal lines with the video signal (analog gradation voltage signal).

In the gate signal line driving circuit 303, the timing signal from the shift register (not shown) is fed to the buffer circuit (not shown) and fed to the corresponding gate signal line (scanning line). To the gate signal line, the gate electrodes of the pixel TFTs corresponding to one line are connected, and all the pixel TFTs corresponding to one line must be turned on simultaneously, so that, as the buffer circuit, a buffer circuit with a large current capacity is selected.

In this way, by the scanning signal from the gate signal line driving circuit, the switching of the corresponding pixel TFTs is carried out, the analog gradation voltage signal from the source signal line driving circuit is fed to the pixel TFTs, whereby the liquid crystal molecules are driven.

Numeral 305 denotes a digital video data division circuit (SPC: Series-to-Parallel Conversion Circuit). The digital video data division circuit 305 is a circuit for lowering to 1/m the frequency of the digital signal inputted from the outside. By dividing the digital signal inputted from the outside, the frequency of the signal necessary for the operation of the driving circuit can also be lowered to 1/m.

The DAC according to the present invention can also be used in devices other than an active matrix liquid crystal display device constituted as disclosed through this embodiment. By the use of the DAC according to the invention, the miniaturization of the driving circuit and active matrix liquid crystal display device has become possible.

Embodiment 3

This embodiment will be described, by the use of FIG. 4, with reference to another example of the 4-bit DAC disclosed through Embodiment 1.

Figure 4:
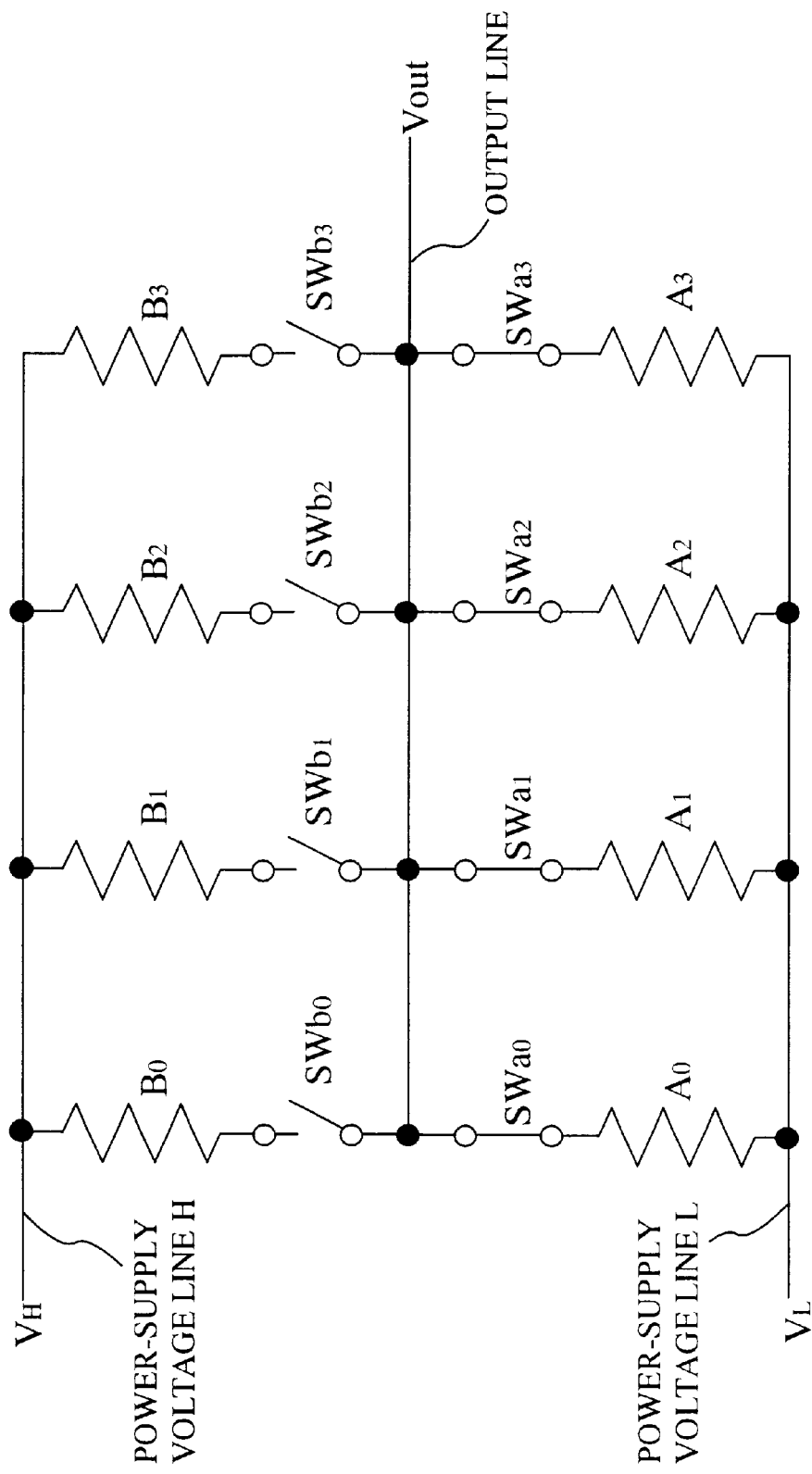
FIG. 4 is a circuit diagram of the DAC according to Embodiment 3.
Figure 5A:
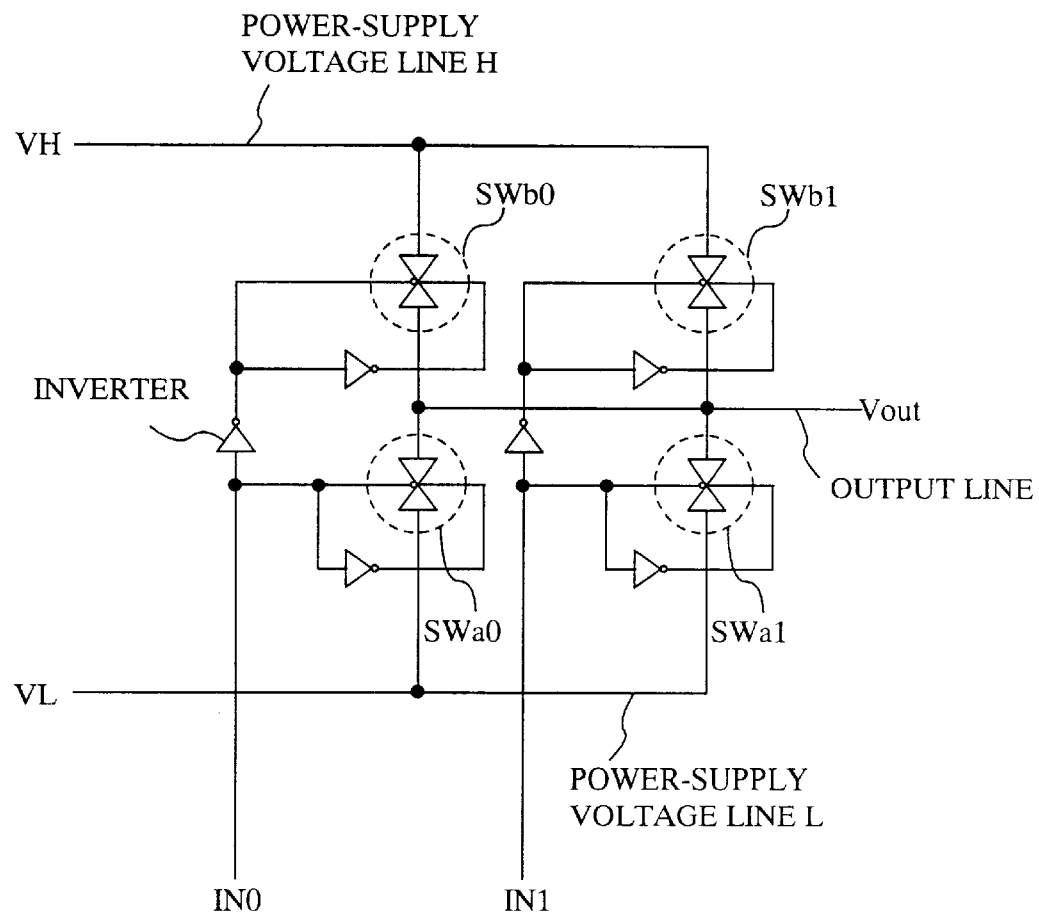
FIGS. 5A–5B show detailed circuit diagrams of the DAC according to Embodiment Mode 2.
Figure 5B:
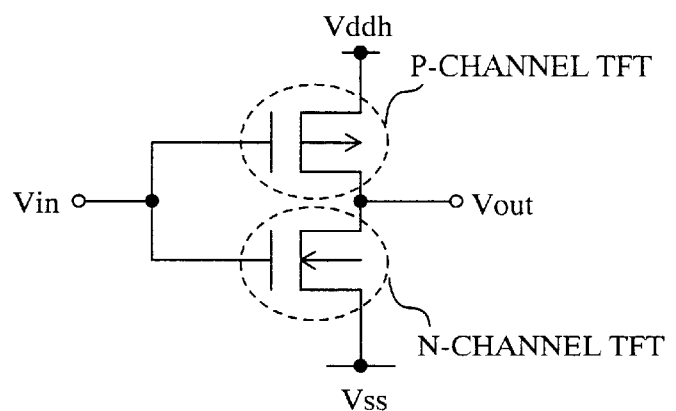
Figure 6:
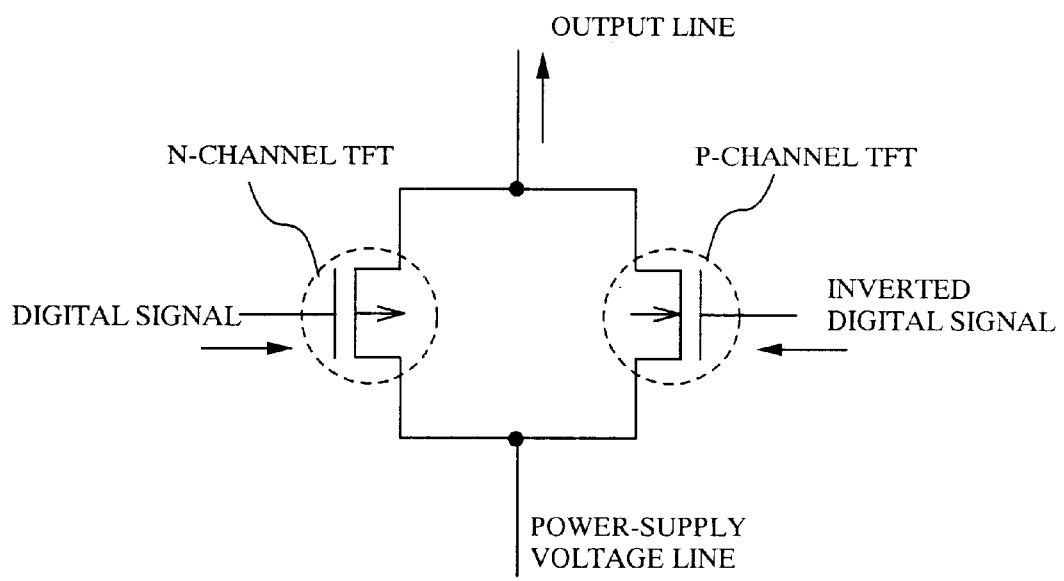
FIG. 6 is a circuit diagram of the switches and the resistors used in the DAC according to Embodiment Mode 2.
Figure 7:
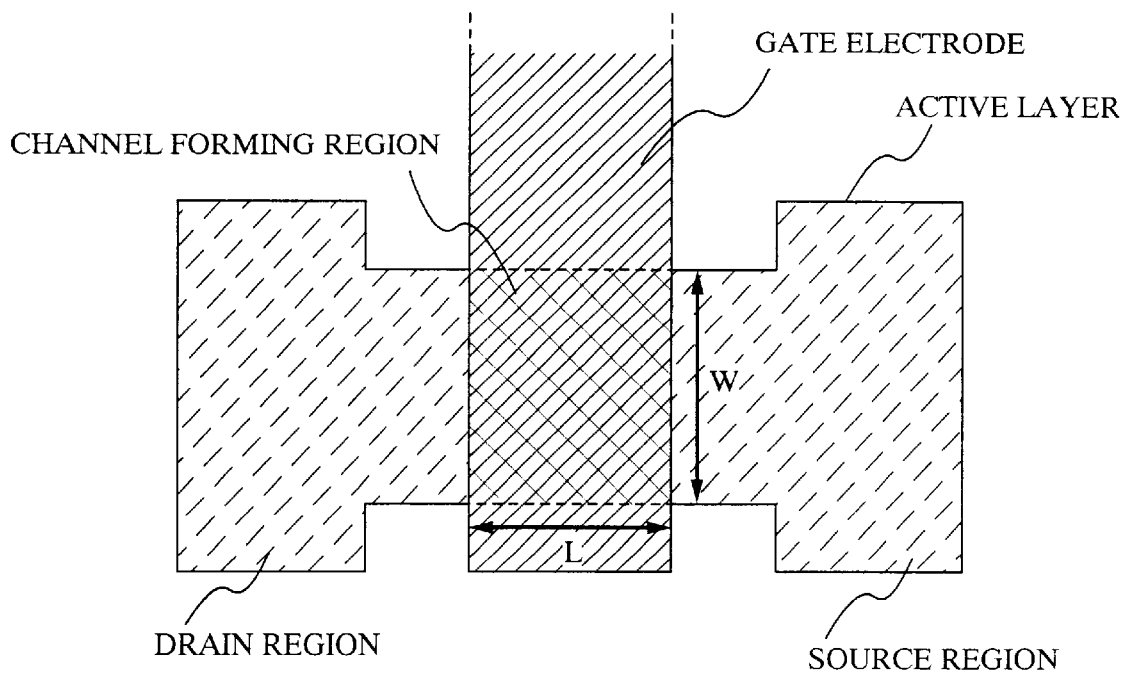
FIG. 7 is a top view of the TFT which constitutes a switch and a resistor used in the DAC according to Embodiment Mode 2.

The DAC according to this embodiment shown in FIG. 4 converts 4-bit digital signals Da ($DA_0$, $Da_1$, ..., $Da_3$) into an analog gradation voltage signal. This embodiment will be described with reference to a DAC corresponding to 4-bits digital signals, but the present invention is not limited to this bit number. Further, In this embodiment, the power-supply potential $V_H$ is set to 6 V, and the power-supply potential $V_L$ is set to 2 V, but the invention is not limited to these power-supply potential values.

As shown in FIG. 4, the DAC according to the invention includes four switches $SWa_0$, $SWa_1$, ..., $SWa_3$ and four swishes $SWb_0$, $SWb_1$, ..., $SWb_3$. The DAC also includes four resistors $A_0, A_1, ..., A_3$ and four resistors $B_0, B_1, ..., B_3$.

Both ends of the resistor $A_0$ are connected to the switch $SWa_0$ and a power-supply voltage line L, respectively. That end of the $SWa_0$ which is not connected to resistor $A_0$ is connected to an output line.

The same thing also applies to the resistors $A_1, A_2, A_3$, . In this way, both ends of each of the resistors $A_0, A_1, ..., A_3$ are respectively connected to each of the switches $SWa_0$, $SWa_2, ..., SWa_3$ and to the power-supply voltage line L. Those ends of the switches $SWa_0$, $SWa_1$, ..., $SWa_3$ which are not connected to the respective resistors $A_0, A_1, ..., A_3$ are connected to the output line.

The relationship between the resistors $B_0, B_1, ..., B_3$ and the switches $SWab_0$, $SWb_1$, ..., $SWb_3$ is also similar to the relationship between the resistors $A_0$, $A_1$, $A_3$ and the resistors $SWa_0$, $SWa_1$, ..., $SWa_3$. In other words, both ends of each of the resistors $B_0, B_1, ..., B_3$ are connected to each of the switches $SWb_0$, $SWb_1$, $SWb_{n-1}$ and a power-supply voltage line H. Those ends of the respective switches $SWb_0$, $SWb_1$, ..., $SWb_{n-1}$ which are not connected to the respective resistors $B_0, B_1, ..., B_{n-1}$ are connected to the output line.

Next, the operation of the DAC according to this embodiment will be described.

When the switch $SWa_0$ is turned on, the output line and the resistor $A_0$ are connected to each other. In other words, when the switch $SWa_0$ is turned on, that end of the resistor $A_0$ which is connected to the switch $SWa_0$ and the output line are maintained at the same potential. Conversely, if the switch $SWa_0$ is turned off, then the connection between the output lien and the resistor $A_0$ is cut off.

This same thing also applies to the switches $SW_1$, $SW_2$, $SW_3$. If each of the switches $SWa_0$, $SWa_1$, ..., $SWa_3$ is turned on, then the output line and each of the resistors $A_0$, $A_1, ... A_3$ are connected to each other. In other words, if the switches $SWa_0$, $SWa_1$, ..., $SWa_3$ are each turned on, those ends of the respective resistors $A_0, A_1, ... A_3$ which are connected to the respective switches $SWa_0, SWa_1, ..., SWa_3$ and the output line are maintained at the same potential. Conversely, if the switches $SWa_0$, $SWa_1, ..., SWa_3$ are each turned off, then the connection between the output line and the resistors $A_0, A_1, ..., A_3$ are cut off.

This same thing also applies to the switches $SWb_0$, $SWb_1, ..., SWb_3$. If the switches $SWb_0$, $SWb_1$, ..., $SWb_3$ are each turned on, then the output line and each of the resistors $B_0, B_1, ..., B_3$ are connected to each other. In other words, if the switches $SWb_0$, $SWb_1$, ..., $SWb_3$ are each turned on, then those ends of the respective resistors $B_0$, $B_1, ..., B_3$ which are connected to the respective switches $SWb_0, SWb_1, ..., SWb_3$ and the output line are maintained at the same potential. Conversely, if the switches $SWb_0$, $SWb_1, ..., SWb_3$ are each turned off, then the connection between the output line and the resistors $B_0, B_1, ..., B_3$ are cut off.

This embodiment differs from Embodiment 1 in that, with respect to the latter, the positions at which the switches and the resistors are provided are replaced by each other. In this embodiment, the resistors are provided closer to the power-supply voltage line sides with reference to the switches, whereas, in Embodiment 1, the switches are provided closer to the power-supply voltage line sides with reference to the resistors.

This embodiment is constituted in such a manner that all the resistors are provided closer to the power-supply line sides with reference to the switches, but the present invention may also be constituted in such a manner that some of the resistors are provided closer to the power-supply voltage line sides with reference to the switches, while the remaining switches are provided closer to the power-supply voltage lines with reference to the resistors.

Embodiment 4

The present Embodiment describes by using FIGS. 8A to 10C, an example of a method for simultaneously manufacturing TFTs for the pixel portion and driving circuit TFTs disposed in the peripheral of the pixel portion, of an active matrix liquid crystal display device that is an example of a semiconductor display device of the present invention. Note that the present embodiment is merely an example and the present invention is not limited to this manufacturing method.

Figure 8A:
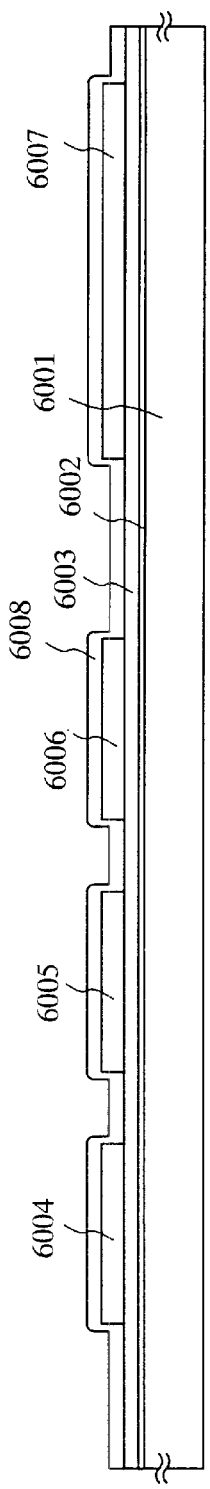
FIGS. 8A–8C are drawings showing manufacturing steps of TFTs according to Embodiment 4.

In FIG. 8A, a non-alkali glass substrate or a quartz substrate is preferably used for an active matrix substrate 6001. A silicon substrate or a metal substrate that have an insulating film formed on the surface, may also be used as an active matrix substrate.

On one surface of the substrate 6001 on which the TFT is to be formed, a base film comprising a silicon oxide film, a silicon nitride film, or a silicon nitride oxide is formed by plasma CVD or sputtering to have a thickness of 100 to 400 nm. For instance, the base film may be double layered structure in which a silicon nitride film 6002 having a thickness of 25 to 100 nm, here in 50 nm, and a silicon oxide film 6003 having a thickness of 50 to 300 nm, here in 150 nm, are formed. The base film is provided for preventing impurity contamination from the active matrix substrate, and is not always necessary in case of employing a quartz substrate.

Next, an amorphous silicon film with a thickness of 20 to 100 nm is formed on the base film by a known film deposition method. Though depending on its hydrogen content, the amorphous silicon film is preferably heated at 400 to 550° C. for several hours for dehydrogenation, reducing the hydrogen content to 5 atom % or less to prepare for the crystallization step. The amorphous silicon film may be formed by other formation methods such as sputtering or evaporation. In this case, it is desirable that impurity elements such as oxygen and nitrogen etc. contained in the film be sufficiently reduced. The base film and the amorphous silicon film can be formed by the same film deposition method here, so that the films may be formed continuously. In that case, it is possible to prevent contamination on the surface since it is not exposed to the air, and that reduces fluctuation in characteristics of the TFTs to be manufactured.

A known laser crystallization technique or thermal crystallization technique may be used for a step of forming a crystalline silicon film from the amorphous silicon film. The crystalline silicon film may be formed by thermal oxidation using a catalytic element for promoting the crystallization of silicon. Other options include the use of a microcrystal silicon film and direct deposition of a crystalline silicon film. Further, the crystalline silicon film may be formed by employing a known technique of SOI (Silicon On Insulators) with which a monocrystal silicon is adhered to a substrate.

An unnecessary portion of the thus formed crystalline silicon film is etched and removed to form island semiconductor layers 6004 to 6007. A region in the crystalline silicon film where an n-channel TFT is to be formed may be doped in advance with boron (B) in a concentration of about $1\times10^{15}$ to $5\times10^{17}$ cm$^{-3}$ in order to control the threshold voltage.

Then a gate insulating film 6008 mainly comprised of silicon oxide or silicon nitride is formed to cover the island semiconductor layers 6004 to 6007. The thickness of the gate insulating film 6008 may be 10 to 200 nm, preferably 50 to 150 nm. For example, a silicon nitride oxide may be formed to 75 nm thick by plasma CVD from raw materials of $N_2O$ and $SiH_4$, and then the film may be thermally oxidized in an oxygen atmosphere or a mixed atmosphere of oxygen and hydrochloride at 800 to 1000° C. into a thickness of 115 nm (FIG. 8A).

Resist masks 6009 to 6012 are formed over the entire surfaces of the island semiconductor layers 6004 and 6007, over a portion of the island semiconductor layer 6005 (including a region which becomes a channel forming region) and over a portion of the island semiconductor layer 6006 (including a region which becomes a channel forming region), and low concentration impurity regions 6013 to 6015 are formed by adding an impurity element imparting n-type. These low concentration impurity regions 6013 to 6015 are the impurity regions for forming LDD (lightly doped drain) regions that overlap gate electrodes by interposing a gate insulating film (called an Lov region in this specification, where 'ov' stands for 'overlap') in the n-channel TFT of a driving circuit. The concentration of the impurity element for imparting n-type contained in the low concentration impurity regions formed here is denoted to as (n$^-$). Accordingly, the low concentration impurity regions 6013 to 6015 may be called n$^-$ regions in this specification.

Figure 8B:
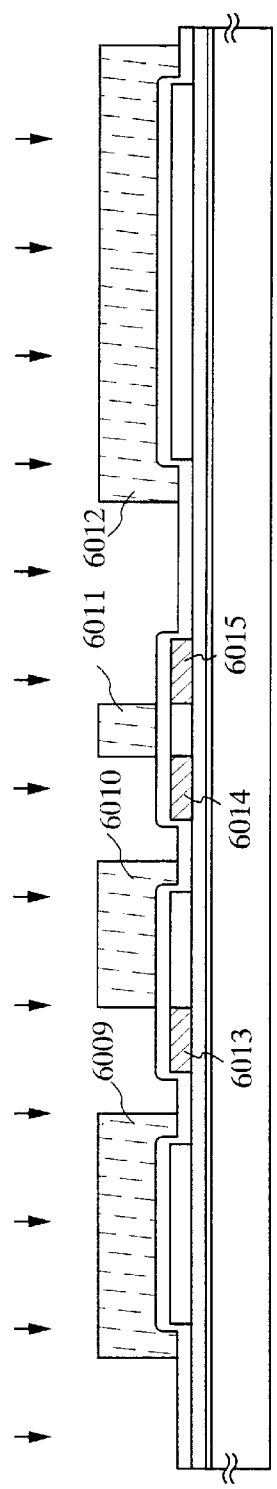

Phosphorus is doped by ion doping with the use of plasma-excited phosphine (PH$_3$) without performing mass-separation on it. Needless to say, the ion implantation involving mass-separation may also be employed. In this step, a semiconductor layer beneath the gate insulating film 6008 is doped with phosphorus through the film 6008. The concentration of phosphorus to be used in the doping preferably ranges from $5\times10^{17}$ atoms/cm$^3$ to $5\times10^{18}$ atoms/cm$^3$, and the concentration here in this embodiment is set to $1\times10^{18}$ atoms/cm$^3$. (FIG. 8B)

Thereafter, the resist masks 6009 to 6012 are removed and heat treatment is conducted in a nitrogen atmosphere at 400 to 900° C., preferably, 550 to 800° C. for 1 to 12 hours, activating phosphorus added in this step.

Figure 8C:
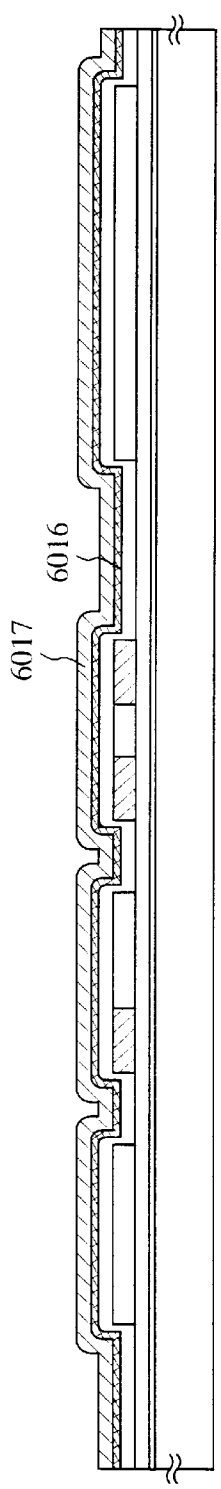

A first conductive film 6016 is formed to a thickness between 10 and 100 nm from a conductive material which comprises one of the elements selected from tantalum (Ta), titanium (Ti), molybdenum (Mo) and tungsten (W) or from a conductive material which has one of these elements as its main ingredient. Tantalum nitride (TaN) or tungsten nitride (WN), for example, is preferably used for the first conductive film 6016. A second conductive film 6017 is formed to a thickness between 100 and 400 nm on the first conductive film 6016 from an element selected from Ta, Ti, Mo and W or from a conductive material comprising one of those elements as its main ingredient. For instance, a Ta film may be formed to 200 nm thick. Though not shown, it is effective to form a silicon film with a thickness of about 2 to 20 nm under the first conductive film 6016, for the purpose of preventing oxidation of the first conductive film 6016 and the second conductive film 6017 (especially the second conductive film 6017). (FIG. 8C.)

Resist masks 6018 to 6020 are formed and the first conductive film 6016 and the second conductive film 6017 (which are hereinafter treated as a laminated film) are etched to form a gate electrode 6021 of a p-channel TFT. Here, conductive films 6022 and 6023 are left to cover the entire surface of the regions where n-channel TFTs are formed.

Figure 9A:
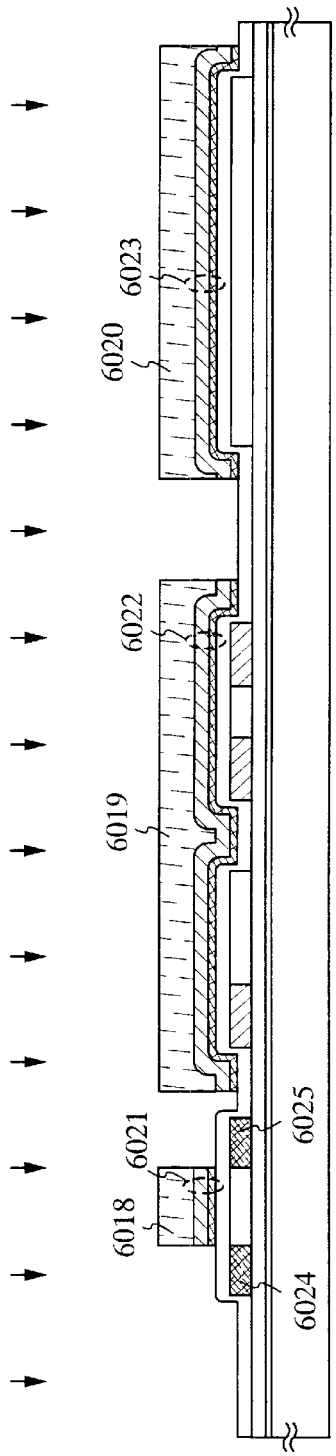
FIGS. 9A–9C are drawings showing manufacturing steps of TFTs according to Embodiment 4.

The resist masks 6018 to 6020 are remained as they are to serve as masks, and a portion of the semiconductor layer 6004 where the p-channel TFT is to be formed is doped with an impurity element for imparting p-type. Boron may be used here as the impurity element and is doped by ion doping (ion implantation may also be employed) using diborane (B$_2$H$_6$). Boron is doped here to a concentration from $5\times10^{20}$ to $3\times10^{21}$ atoms/cm$^3$. The concentration of the impurity element for imparting p-type contained in the impurity regions formed here is expressed as (p$^{++}$). Accordingly, impurity regions 6024 and 6025 may be referred to as p$^{++}$ regions in this specification. (FIG. 9A.)

Here, doping process of impurity element imparting p-type may be performed instead after exposing a portion of island semiconductor layer 6004 by removing the gate insulating film 6008 by etching using resist masks 6018 to 6020. In this case, a low acceleration voltage is kept low, so that the island semiconductor film is less damaged and the throughput is increased.

Figure 9B:
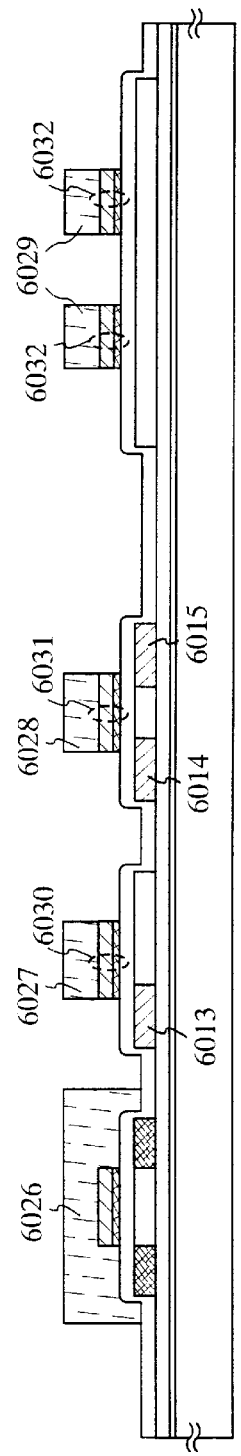

Resist masks 6026 to 6029 are formed after removing resist masks 6018 to 6020 and gate electrodes 6030 to 6032 of n-channel TFTs are formed. At this point, the gate electrode 6030 is formed so as to overlap with the n$^-$ region 6013 through the gate insulating film 6008. Further, gate electrode 6031 is formed to overlap with n$^-$ regions 6014 and 6015 by interposing a gate insulating film 6008. (FIG. 9B.)

The resist masks 6026 to 6029 are then removed and new resist masks 6033 and 6034 are formed. Subsequently, a step of forming an impurity region functioning as a source region or a drain region in the n-channel TFT is carried out. The resist mask 6034 is formed so as to cover the gate electrode 6032 of the n-channel TFT. This is for forming in later step a LDD region that does not overlap with the gate electrode in the n-channel TFT of the pixel portion.

An impurity element imparting n-type is added thereto to form impurity regions 6035 to 6041. Here, ion doping (of course ion implantation also will do) using phosphine (PH$_3$) is again employed, and the phosphorus concentration in these regions is set to $1 \times 10^{20}$ to $1 \times 10^{21}$ atoms/cm$^3$. The concentration of the impurity element for imparting n-type contained in the impurity regions 6039 to 6041 formed here is designated as (n$^+$). Accordingly, the impurity regions 6039 to 6041 may be referred to as n$^+$ regions in this specification. The impurity regions 6035 and 6038 have n$^-$ regions that have already been formed, so that, strictly speaking, they contain a slightly higher concentration of phosphorus than the impurity regions 6039 to 6041 do.

Figure 9C:
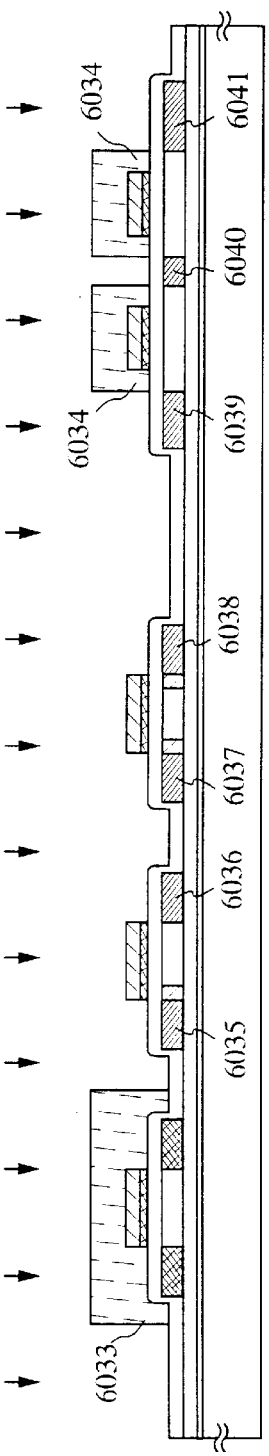

Here, doping process of impurity element imparting n-type may be performed instead after exposing a portion of island semiconductor layer 6005 to 6007 by removing gate insulating film 6008 by etching using resist masks 6033 and 6034 and gate electrodes 6030 and 6031 as masks. In this case, a low acceleration voltage is sufficient for the doping, causing less damage on the island semiconductor layers and improving the throughput. (FIG. 9C.)

Figure 10A:
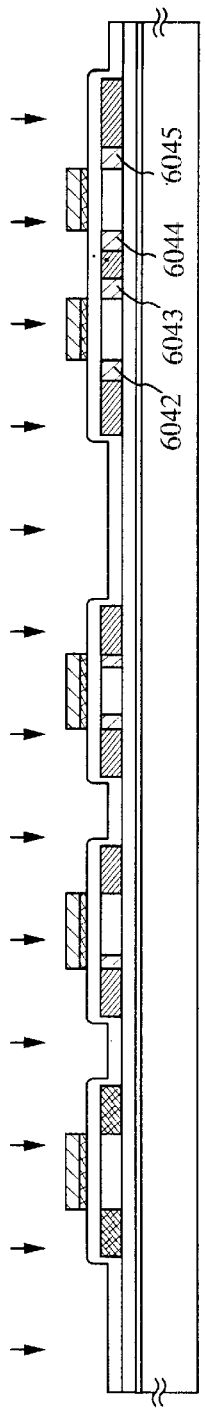
FIGS. 10A–10C are drawings showing manufacturing steps of TFTs according to Embodiment 4.

Next, the resist masks 6033 and 6034 are removed and an impurity element imparting n-type is doped in the island semiconductor layer 6007 where an n-channel TFT of the pixel portion is to be formed. Thus formed impurity regions 6042 to 6044 are doped with phosphorus in the same concentration as in the above n$^-$ regions or a less concentration (specifically, $5 \times 10^{16}$ to $1 \times 10^{18}$ atoms/cm$^3$). The concentration of the impurity element imparting n type contained in the impurity regions 6042 to 6045 formed here is expressed as (n$^{--}$). Accordingly, the impurity regions 6042 to 6045 may be referred to as n$^{--}$ regions in this specification. Further, all of the impurity regions except for impurity regions 6070, 6074 and 6075 that are hidden under the gate electrode are doped with phosphorus in a concentration of n$^{--}$ in this step. However, the phosphorus concentration is so low that the influence thereof may be neglected. (FIG. 10A.)

Formed next is a protective insulating film 6046, which will later become a part of a first interlayer insulating film. The protective insulating film 6046 may comprise a silicon nitride film, a silicon oxide film, a silicon nitride oxide or a laminated film combining those films. The film thickness thereof ranges from 100 nm to 400 nm.

Thereafter, a heat treatment step is carried out to activate the impurity element added for imparting n-type or p-type in the respective concentrations. This step may employ a furnace annealing, a laser annealing or a rapid thermal annealing (RTA). Here in this embodiment mode, the activation step is carried out by furnace annealing. The heat treatment is conducted in a nitrogen atmosphere at 300 to 650° C., preferably 400 to 550° C., in here 450° C., for 2 hours.

Figure 10B:
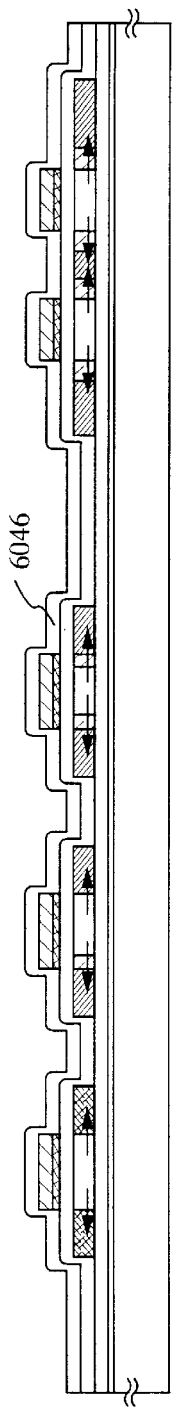
Figure 10C:
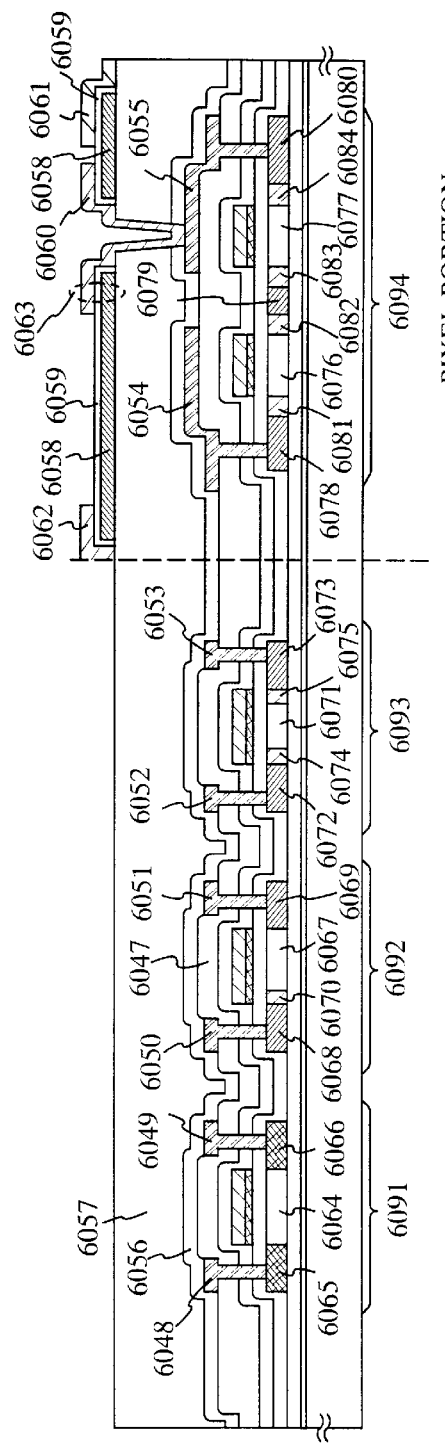

Further heat treatment is performed in an atmosphere containing 3 to 100% of hydrogen at 300 to 450° C. for 1 to 12 hours, hydrogenating the island semiconductor layers 6004 to 6007. This step is to terminate dangling bonds in the semiconductor layer with thermally excited hydrogen. Other hydrogenating means includes plasma hydrogenation (that uses hydrogen excited by plasma). (FIG. 10B.)

Upon completion of the activation step, an interlayer insulating film 6047 with a thickness of 0.5 to 1.5 $\mu$m is formed on the protective insulating film 6046. A laminated film consisting of the protective insulating film 6046 and the interlayer insulating film 6047 serves as a first interlayer insulating film.

After that, contact holes reaching to the source regions or the drain regions of the respective TFTs are formed to form source electrodes 6048, 6050, 6052 and 6054 and drain electrodes 6049, 6051, 6053 and 6055. Though not shown, these electrodes in this embodiment mode comprise a laminated film having a three-layer structure in which a Ti film with a thickness of 100 nm, a Ti-containing aluminum film with a thickness of 300 nm and another Ti film with a thickness of 150 nm are sequentially formed by sputtering.

Then a passivation film 6056 is formed using a silicon nitride film, a silicon oxide film or a silicon nitride oxide in a thickness of 50 to 500 nm (typically, 200 to 300 nm). Subsequent hydrogenation treatment performed in this state brings a favorable result in regard to the improvement of the TFT characteristics. For instance, it is sufficient if heat treatment is conducted in an atmosphere containing 3 to 100% hydrogen at 300 to 450° C. for 1 to 12 hours. The same result can be obtained when the plasma hydrogenation method is used. An opening may be formed here in the passivation film 6056 at a position where a contact hole is later formed for connecting pixel electrode and the drain electrode.

Thereafter, a second interlayer insulating film 6057 comprising an organic resin is formed to have a thickness of about 1 $\mu$m. As the organic resin, polyimide, acrylic, polyamide, polyimideamide, BCB (benzocyclobutene), etc. can be used. The advantages in the use of the organic resin film include simple film formation, reduced parasitic capacitance owing to low relative permittivity, excellent flatness, etc. Other organic resin films than the ones listed above or an organic-based SiO compound may also be used. Here, polyimide of the type being thermally polymerized after applied to the substrate is used and fired at 300° C. to form the film 6057.

Subsequently, a shielding film 6058 is formed on the second interlayer insulating film 6057 in area where pixel portion is formed. The shielding film 6058 comprises an element selected from aluminum (Al), titanium (Ti), chromium (Cr) and tantalum (Ta) or of a film containing one of those elements as its main ingredient into a thickness of 100 to 300 nm. On the surface of the shielding film 6058, a dielectric substance 6059 with a thickness of 30 to 150 nm (preferably 50 to 75 nm) is formed by anodic oxidation or plasma oxidation. Here, an aluminum film or a film mainly containing aluminum is used as the shielding film 6058, and an aluminum oxide film (alumina film) is used as the dielectric substance 6059.

The dielectric substance is provided only on the surface of the shielding film 6058 here in this embodiment mode. A dielectric substance may be formed by a vapor deposition method such as plasma CVD, thermal CVD, or by sputtering over the second interlayer insulating film 6057 to cover the shielding film 6058. In that case also, the film thickness thereof is preferably 30 to 150 nm (preferably 50 to 75 nm). A silicon oxide film, a silicon nitride film, a silicon nitride oxide, a DLC (diamond like carbon) film or an organic resin film may be used for the dielectric substance 6059. A lamination film with those films layered in combination may also be used.

Then a contact hole reaching the drain electrode 6055 is formed in the second interlayer insulating film 6057 and the passivation film 6056 to form pixel electrodes 6060, 6061 and 6062. Note that pixel electrodes 6061 and 6062 are adjacent but individual pixels, respectively. For the pixel electrodes 6060 to 6062, a transparent conductive film may be used in the case of fabricating a transmission type active matrix liquid crystal display device and a metal film may be used in the case of a reflection type active matrix liquid crystal display device. Here, in order to manufacture a transmission type active matrix liquid crystal display device, an indium tin oxide film (ITO) with a thickness of 100 nm is formed by sputtering.

At this point, a storage capacitor is formed in a region 6063 where the pixel electrode 6060 overlaps with the shielding film 6058 through a dielectric substance 6059.

In this way, an active matrix substrate comprising a driving circuit and a pixel portion on the same substrate is completed. A p-channel TFT 6091, an n-channel TFT 6092 and an n-channel TFT 6093 are formed in the driving circuit, and a pixel TFT 6094 is formed from an n-channel TFT in the pixel portion.

The p-channel TFT 6091 of the driving circuit comprises a channel forming region 6064, and a source region 6065 and a drain region 6066 formed respectively in the p$^+$ regions. The n-channel TFT 6092 comprises a channel forming region 6067, a source region 6068, a drain region 6069 and a LDD region (hereinafter referred to as Lov region, where 'ov' stands for 'overlap') 6070 that overlaps with the gate electrode 6030 through the gate insulating film 6008. The source region 6068 and the drain region 6069 are formed respectively from (n$^-$n$^+$) regions and the Lov region 6070 is formed from the n$^-$ region.

A channel forming region 6071, a source region 6072, a drain region 6073, LDD regions that overlap the gate electrode 6031 by interposing a gate insulating film 6008 (hereinafter referred to as Lov region, where 'ov' stands for 'overlap') 6074 and 6075 are formed in the n-channel TFT 6093. The source region 6072 and the drain region 6073 are formed respectively from (n$^-$+n$^+$) regions and Lov regions 6074 and 6075 are formed from n$^-$ region.

A TFT for the pixel portion (pixel TFT) 6094 has channel forming regions 6076 and 6077, a source region 6078, a drain region 6080, LDD regions 6081 to 6084 which do not overlap with the gate electrode 6032 through the gate insulating film 6008 (hereinafter referred to as Loff regions, where 'off' stands for 'offset'), and an n$^+$ region 6079 in contact with the Loff regions 6082 and 6083. The source region 6078 and the drain region 6080 are formed respectively from the n+ regions and the Loff regions 6081 to 6084 are formed from the n$^{--}$ regions.

The length of the Lov region may be 0.5 to 3.0 μm, typically 1.0 to 1.5 μm, with respect to the channel length of 3 to 7 μm. The length of the Loff regions 6081 to 6084 arranged in the pixel TFT 6094 may be 0.5 to 3.5 μm, typically 2.0 to 2.5 μm.

In the liquid crystal display devices fabricated in accordance with the above-described Embodiment, it is possible to use various kinds of liquid crystals. For example, usable liquid crystal material includes ones disclosed in: H. Furue et al, 1998, SID, "Characteristics and Driving Scheme of Polymer-Stabilized Monostable FLCD Exhibiting Fast Response Time and High Contrast Ratio with Gray-Scale Capability"; T. Yoshida et al., 1997, SID DIGEST, 841, "A Full-Color Thresholdless Antiferroelectric LCD Exhibiting Wide Viewing Angle with Fast Response Time"; S. Inui et al.1996, J. Mater. Chem. 6(4), 671–673, "Thresholdless Antiferroelectricity in Liquid Crystals and its Application to Displays"; and U.S. Pat. No. 5,594,569.

Liquid crystal that exhibits antiferroelectric phase in a certain temperature range is called antiferroelectric liquid crystal. Among mixed liquid crystal having antiferroelectric liquid crystal, there is one called thresholdless-antiferroelectric mixed liquid crystal, which exhibits electro-optical response characteristics in that the transmittance varies continuously with respect to the electric field. Some of the thresholdless-antiferroelectric mixed liquid crystal show electro-optical response characteristics of V shape, and there has been found among them ones the driving voltage of which is about ±2.5 V (with cell thickness of about 1 μm to 2 μm).

Figure 11:
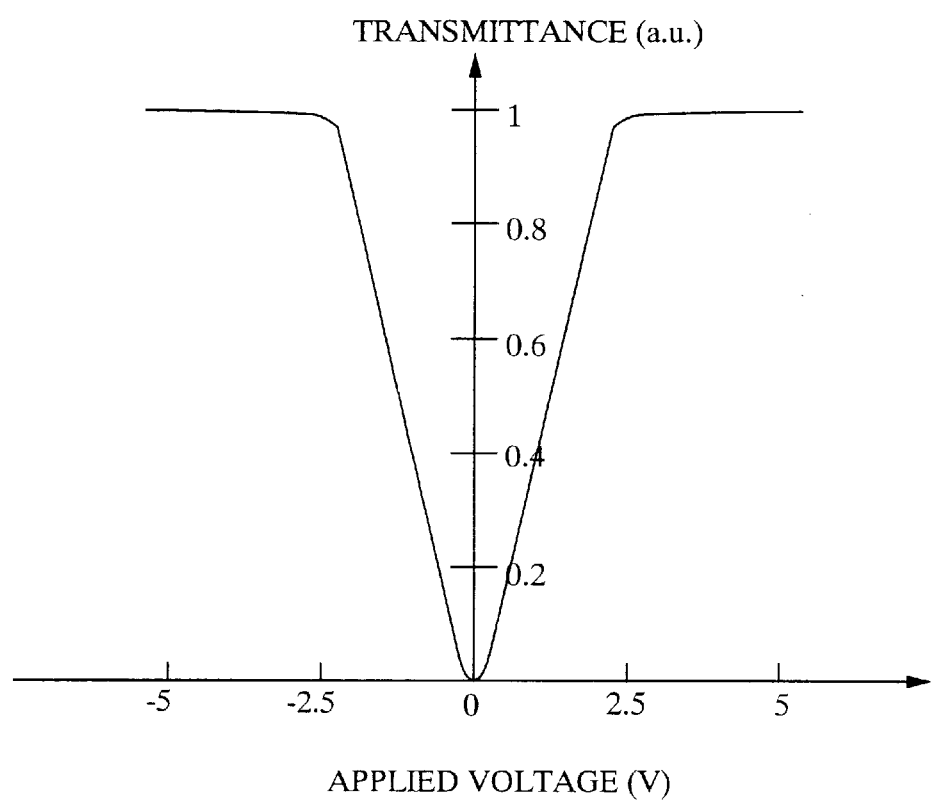
FIG. 11 shows characteristics of the thresholdless-antiferroelectric mixed liquid crystal in terms of its light transmittance with respect to the applied voltage according to Embodiment 4.

Here, reference is made to FIG. 11 showing exemplary characteristics of the thresholdless-antiferroelectric mixed liquid crystal that exhibits electro-optical response characteristics of V shape, in terms of its light transmittance with respect to the applied voltage. In the graph shown in FIG. 11, the axis of the ordinate indicates transmittance (in arbitrary unit) and the axis of abscissa indicates applied voltage. A transmission axis of a polarizing plate on the incident side of a liquid crystal display device is set substantially in parallel with the normal line direction of a smectic layer of the thresholdless-antiferroelectric mixed liquid crystal which substantially coincides with the rubbing direction of the liquid crystal display device. On the other hand, a transmission axis of the polarizing plate on the emission side is set so as to substantially form crossed Nicol to the transmission axis of the polarizing plate on the incident side.

As shown in FIG. 11, it can be understood that using such thresholdless-antiferroelectric mixed liquid crystal makes possible the low-voltage driving and gray scale display.

Also in the case that such thresholdless-antiferroelectric mixed liquid crystal of low-voltage driving is used in a liquid crystal display device having a source signal line driving circuit which is operated by digital, the output voltage of a D/A converter circuit may be reduced so as to lower operation supply voltage of the D/A converter circuit and to lower operation supply voltage of the driver. Accordingly, a liquid crystal display device of lowered power consumption and high reliability may be realized.

Therefore, the use of such thresholdless-antiferroelectric mixed liquid crystal of low-voltage driving is effective also when employing a TFT having an LDD region (lightly doped region) of which width is relatively small (for example, 0 nm to 500 nm, or 0 nm to 200 nm).

In general, threoldless-antiferroelectric mixed lid crystal is large in spontaneous polarization and dielectric permittivity of liquid crystal itself is high. For that reason, relatively large storage capacitor is required for a pixel when using for a liquid crystal display device the thresholdless-antiferroelectric mixed liquid crystal. Thus, preferably used is thresholdless-antiferroelectric mixed liquid crystal that is small in spontaneous polarization. Alternatively, with employment of the line sequential driving as a driving method of the liquid crystal display device, writing period of voltage gray scale into a pixel (pixel feed period) is prolonged so that a small storage capacitor may be supplemented.

The use of such thresholdless-antiferroelectric mixed liquid crystal realizes the low-voltage driving, to thereby realize a liquid crystal display device of lowered power consumption.

Embodiment 5

The D/A converter circuits of the present invention may be used in various semiconductor devices (active matrix liquid crystal display devices and EL display devices). The present invention can be implemented to all of the electronic devices that incorporate such semiconductor device as a display medium. Such electronic devices include video cameras, digital cameras, projectors (rear type or front type), head mounted displays (goggle type displays), car navigation systems, personal computers, and portable information terminals (mobile computers, portable telephones or electronic books etc.). Examples of these are shown in FIGS. 12A to 14C.

Figure 12A:
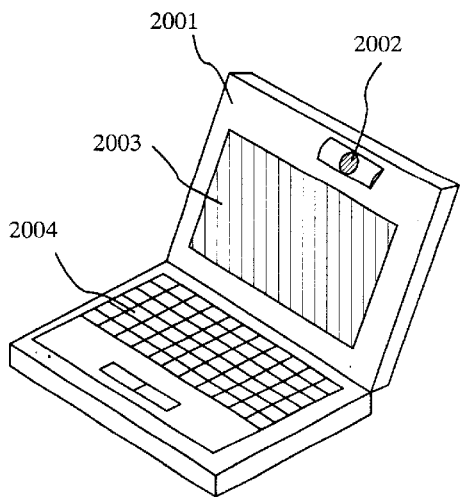
FIGS. 12A–12F are drawings showing electronic apparatuses incorporated with the semiconductor devices according to Embodiment 5.

FIG. 12A is a personal computer, which comprises a main body 2001, an image input section 2002, a display device 2003, and a keyboard 2004. The present invention can be applied to the image input section 2002, the display device 2003 and other signal control circuits.

Figure 12B:
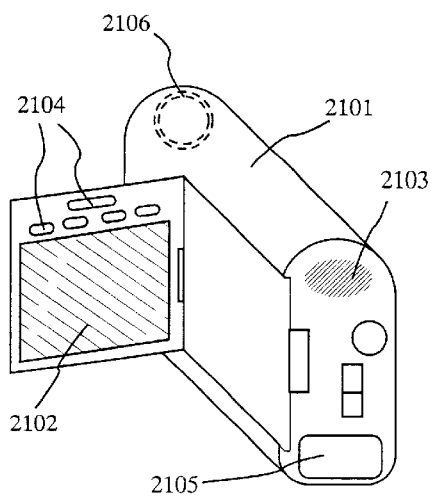

FIG. 12B is a video camera, which comprises a main body 2101, a display device 2102, a voice-input section 2103, operation switches 2104, a battery 2105, and an image receiving section 2106. The present invention can be applied to the display device 2102, the voice input section 2103 and other signal control circuits.

Figure 12C:
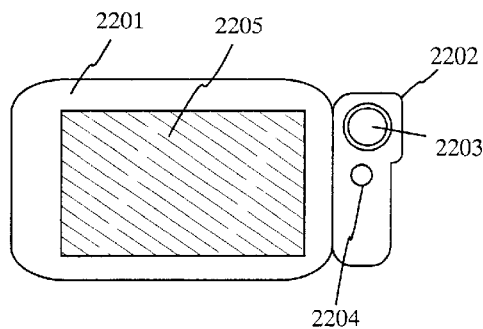

FIG. 12C is a mobile computer that comprises: a main body 2201; a camera section 2202; an image receiving section 2203; operation switches 2204; and a display device 2205. The present invention can be applied to the display device 2205 and other signal control circuits.

Figure 12D:
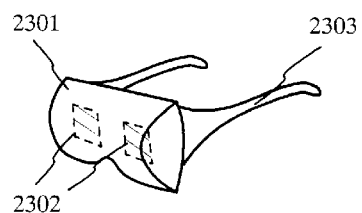

FIG. 12D is a goggle type display that comprises a main body 2301, a display device 2302 and an arm section 2303. The present invention can be applied to the display device 2302 and other signal control circuits.

Figure 12E:
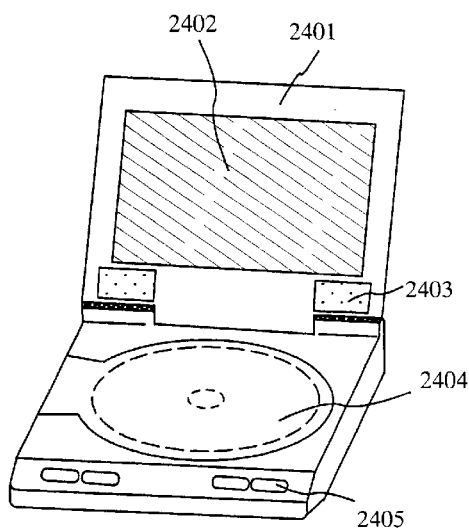

FIG. 12E is a device that uses a recording medium on which a program is recorded (hereinafter referred to as a recording medium), which comprises: a main body 2401, a display device 2402, a speaker section 2403, a recording medium 2404, and operation switches 2405. Note that music appreciation, film appreciation, games, and the use of the Internet can be performed with this device using a DVD (digital versatile disk), a CD, etc., as a recording medium. The present invention can be applied to the display device 2402 and other signal control circuits.

Figure 12F:
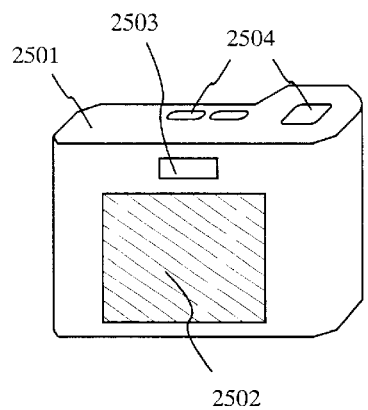

FIG. 12F is a digital camera which comprises: a main body 2501, a display device 2502, a view finder section 2503, operation switches 2504, and an image receiving section (not shown in the figure). The present invention can be applied to the display device 2502 and other signal control circuits.

Figure 13A:
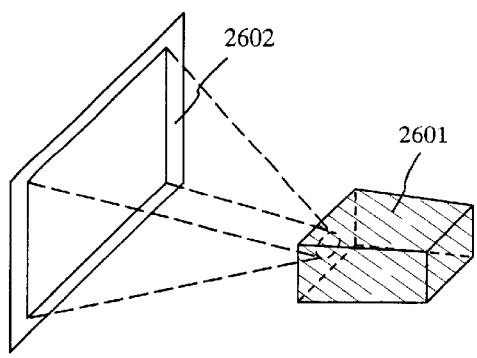
FIGS. 13A–13D are drawings showing three-plate type front projector and rear projector incorporated with the semiconductor devices according to Embodiment 5.

FIG. 13A is a front type projector that comprises: an optical light source system and a display device 2601, and a screen 2602. In FIG. 13A the display device is an active matrix liquid crystal display device. The present invention can be applied to the display device and other signal control circuits.

Figure 13B:
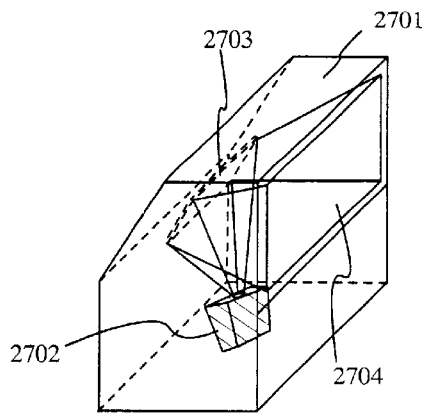

FIG. 13B is a rear type projector that comprises a main body 2701, an optical light source system and a display device 2702, a mirror 2703, and a screen 2704. In FIG. 13B.the display device is an active matrix liquid crystal display device. The present invention can be applied to the display device and other signal control circuits.

Figure 13C:
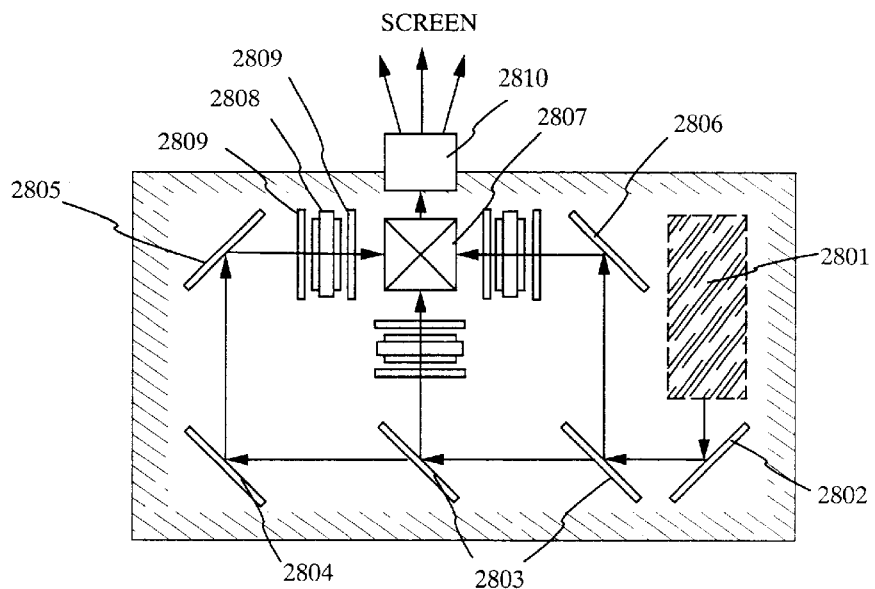

Note that FIG. 13C is a diagram showing an example of the structure of the optical light source system and a display device 2601 and 2702 in FIGS. 13A and 13B. The optical light source system and a display device 2601 and 2702 comprise: an optical light source system 2801, mirrors 2802 and 2804 to 2806, a dichroic mirror 2803, an optical system 2807, a display device 2808, a phase differentiating plate 2809, and a projection optical system 2810. The projection optical system 2810 comprises a plurality of optical lenses having a projection lens. This structure is called a three-plate type because three of the display devices 2808 are used. Further, an operator may appropriately dispose an optical lens, a film having a polarizing function, a film for adjusting the phase difference, or IR film etc., in the light path shown by an arrow in FIG. 13C.

Figure 13D:
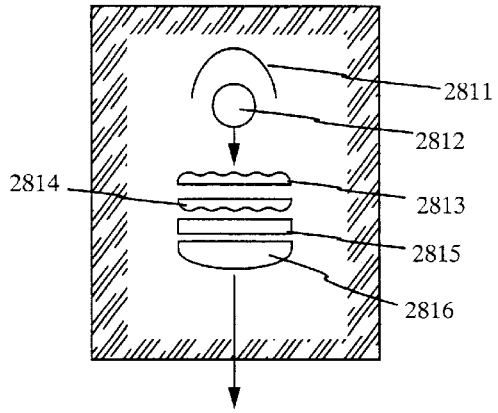

Note that FIG. 13D is a diagram showing an example of the structure of the optical light source system 2801 in FIG. 13C. The optical light source system 2801 comprises: a reflector 2811, a light source 2812, lens arrays 2813 and 2814, light polarizing conversion element 2815 and a condenser lens 2816. Note that the optical light source system shown in FIG. 13D is merely an example and the structure is not limited to this structure. For example, an operator may appropriately dispose an optical lens, a film having a polarizing function, a film for adjusting the phase difference, or IR film etc., in the optical light source system.

Figure 14A:
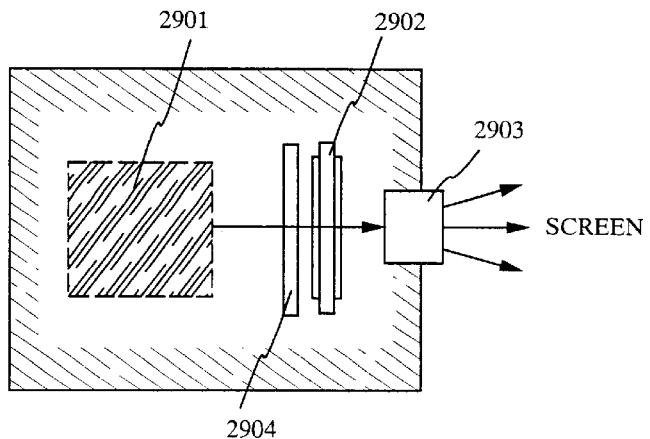
FIGS. 14A–14C are drawings showing a single-plate type incorporated with the semiconductor devices according to Embodiment 5.

While FIG. 13C shows an example of three-plate type, FIG. 14A is a diagram showing an example of a single plate type. The optical light source system and a display device shown in FIG. 14A comprises: an optical light source system 2901, a display device 2902, and a projection optical system 2903. The projection optical system 2903 comprises a plurality of optical lenses including a projection lens. The light source system and a display device shown in FIG. 14A can be applied to the optical light source systems and display devices 2601 and 2702 shown in FIGS. 13A and 13B. An optical light source system shown in FIG. 13D may be used as an optical light source system 2901. Note that a color filter is disposed in the display device 2902 (not shown) and the displayed image is colored.

Figure 14B:
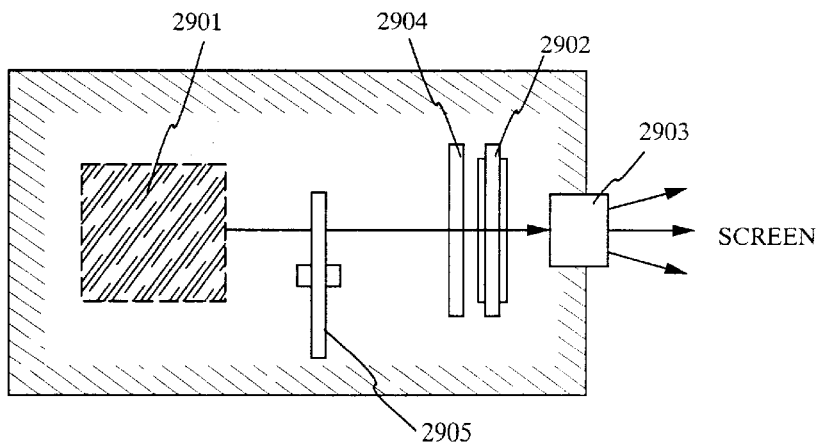

An optical light source system and a display device shown in FIG. 14B is an application of FIG. 14A and the displayed image is colored by using a rotating color filter circuit plate 2905 of RGB in place of disposing a color filter. The light source system and a display device shown in FIG. 14B can be applied to the optical light source systems and display devices 2601 and 2702 shown in FIGS. 13A and 13B.

Figure 14C:
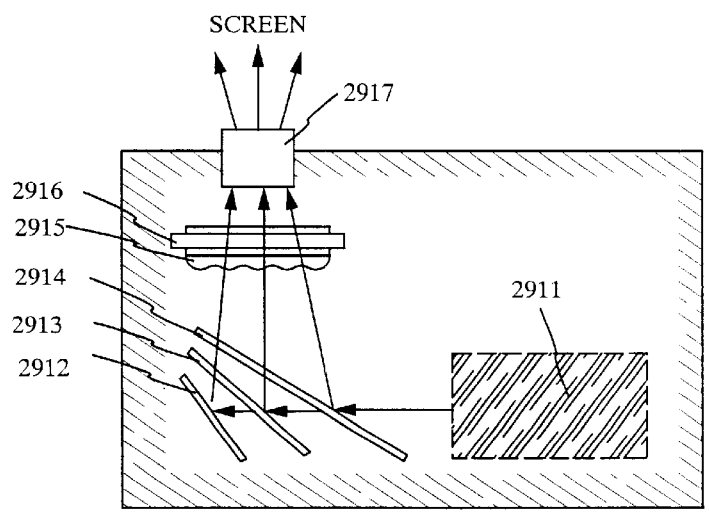
Figure 15:
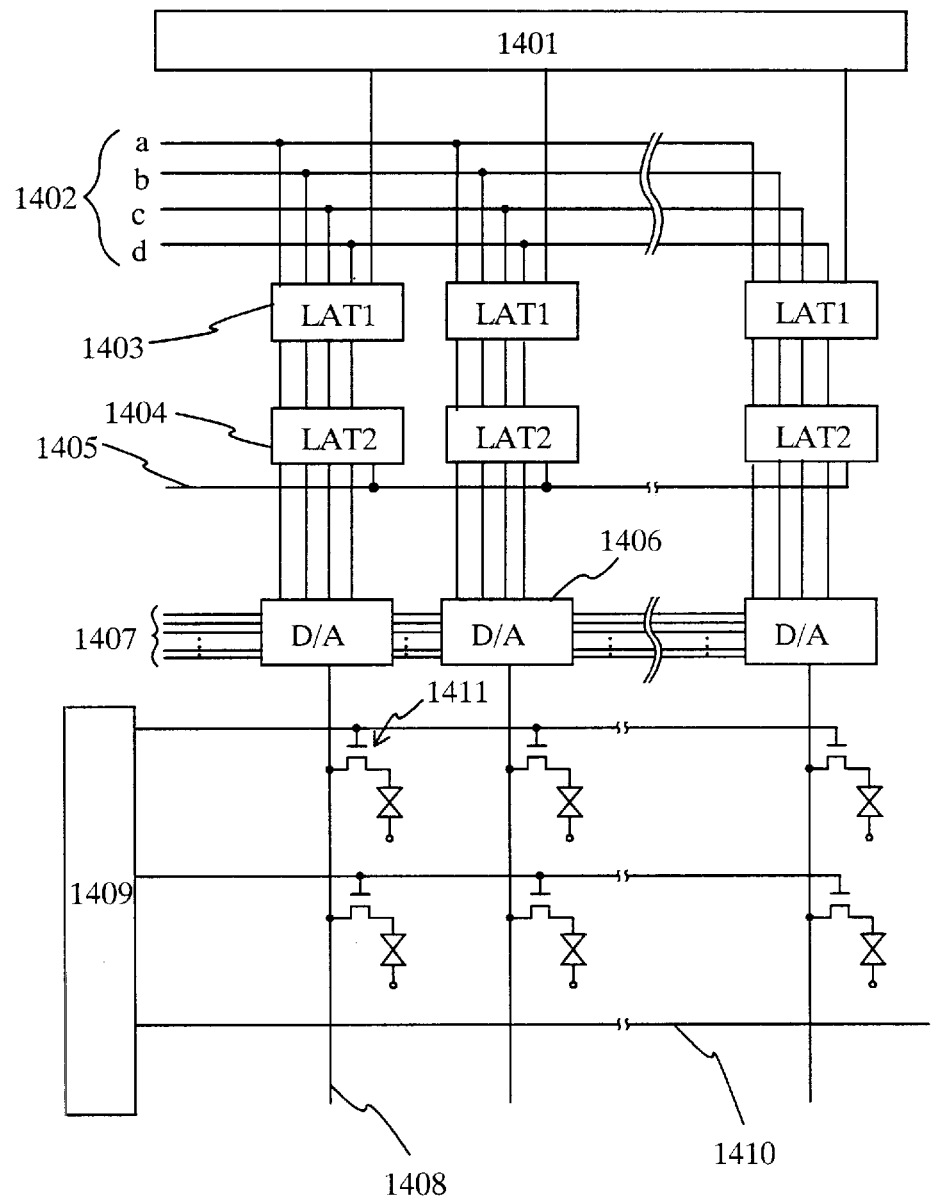
FIG. 15 is a diagram showing a structural outline of a conventional digital driving type active matrix liquid crystal display device.
Figure 16:
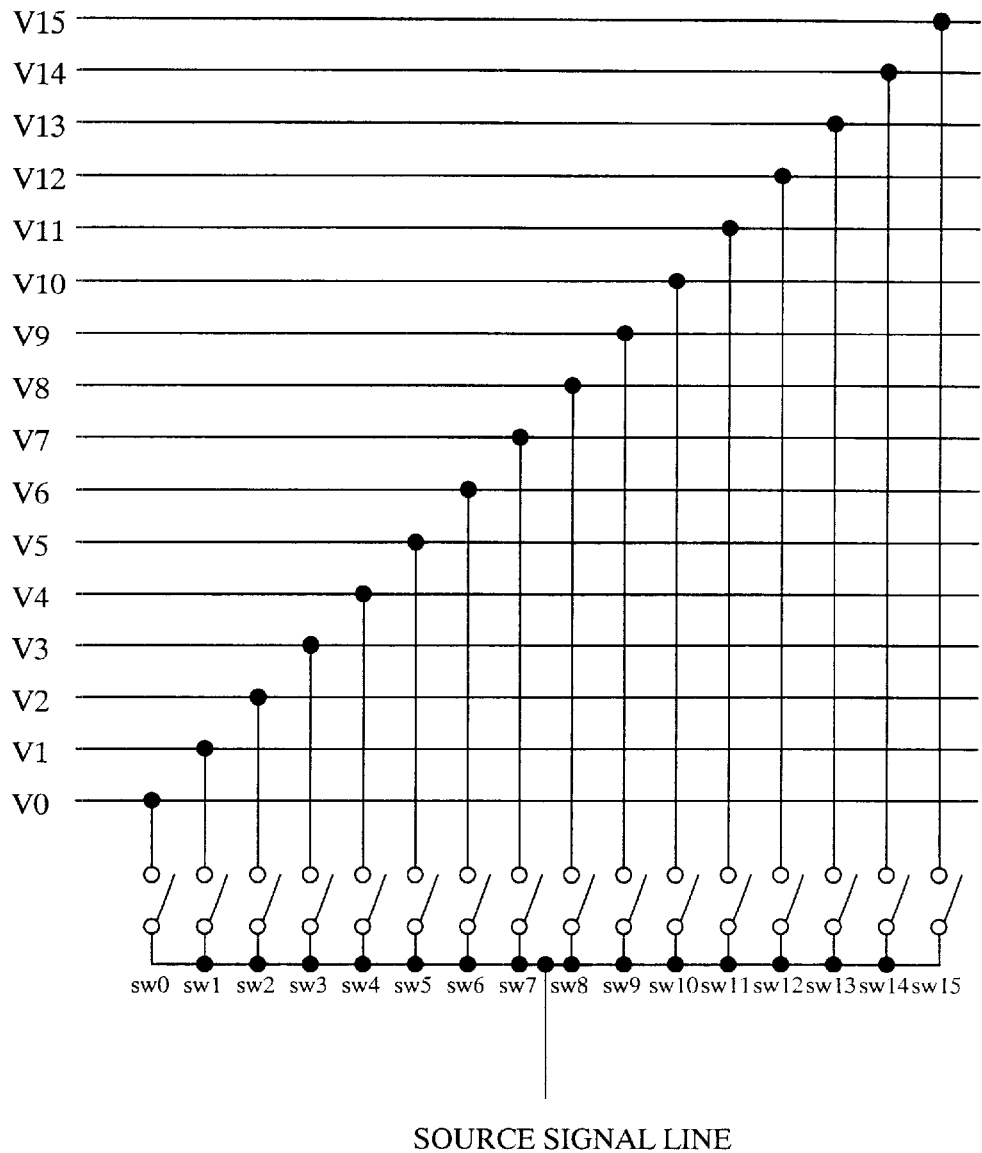
FIG. 16 is a circuit diagram of a conventional DAC
Figure 17:
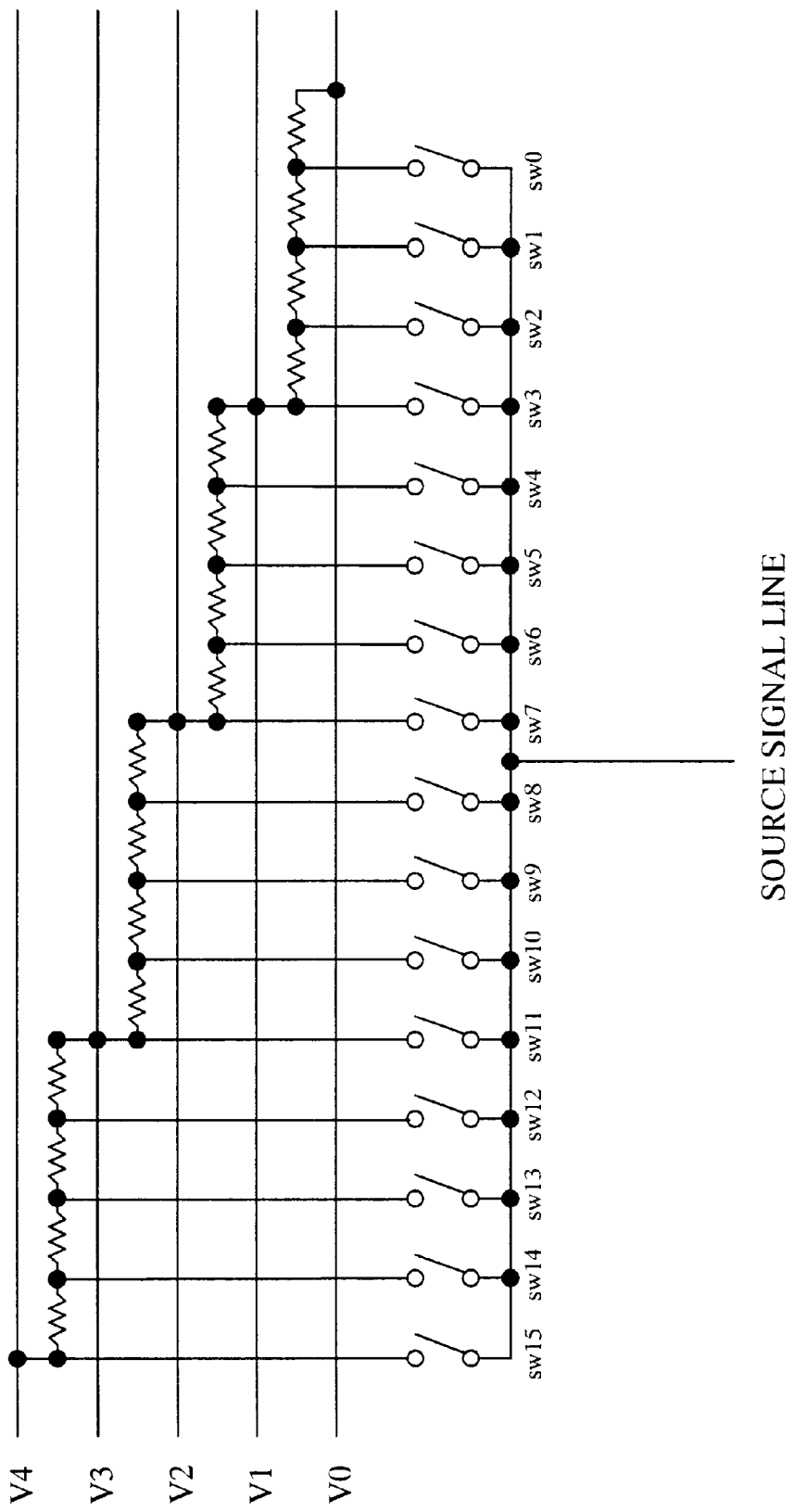
FIG. 17 is a circuit diagram of a conventional DAC.

An optical light source system and a display device shown in FIG. 14C is called a color-filter-less single plate system. This system disposed a micro lens array 2915 in the display device 2916 and the displayed image is colored by using a dichroic mirror (green) 2912, a dichroic mirror (red) 2913 and a dichroic mirror (blue) 2914. The projection optical system 2917 comprises a plurality of optical lenses including a projection lens. The light source system and a display device shown in FIG. 14C can be applied to the optical light source systems and display devices 2601 and 2702 shown in FIGS. 13A and 13B. Further as an optical light source system 2911, an optical system using a coupling lens and a collimator lens in addition to the light source may be used.

As described above, the applicable range of the liquid crystal display device of the present invention is very large, and it is possible to apply to electronic devices of various areas. The electronic devices of the present invention can be realized by using any combination of the constitutions of Embodiments 1 to 4.

Embodiment 6

An example of manufacturing an EL (electro-luminescence) display device which comprises a D/A converter circuit of the present invention is described in the present Embodiment. Note that FIG. 18A is a top view of an EL display device which comprises a D/A converter circuit of the present invention and FIG. 18B shows its cross sectional structure.

Figure 18A:
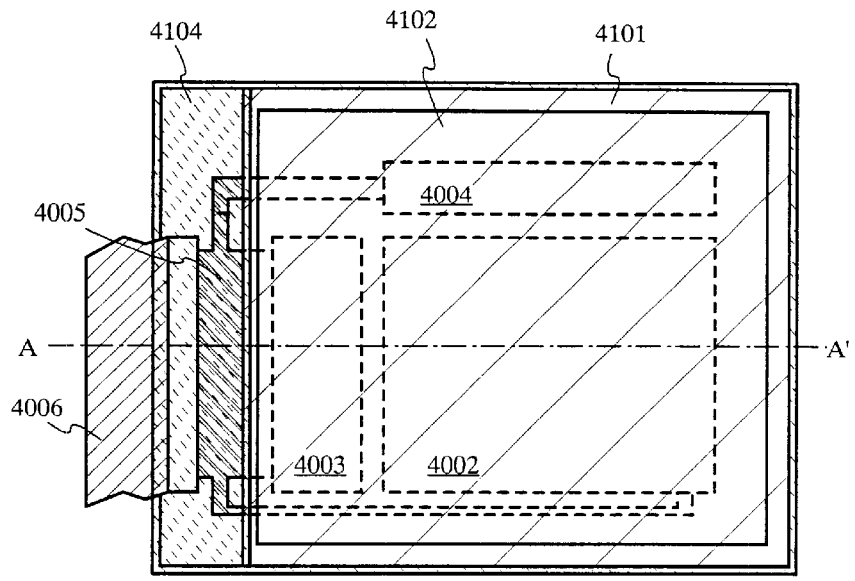
FIGS. 18A–18B are a top view and a sectional view of an EL display device which is one of the semiconductor devices according to Embodiment 6.
Figure 18B:
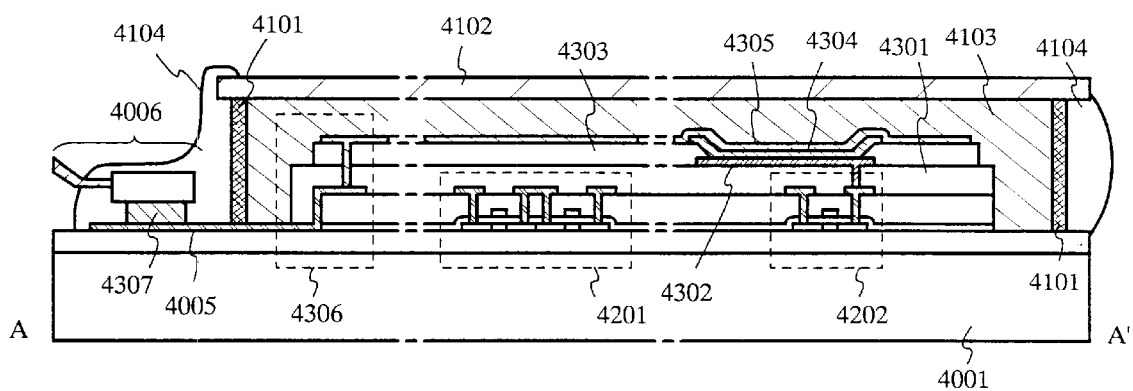

In FIGS. 18A and 18B: reference numeral 4001 denotes a substrate; 4002, a pixel portion; 4003, a source signal line driving circuit; 4004, a gate signal line driving circuit. Each driving circuit reaches FPC (flexible print circuit) 4006 through wiring 4005, and then connected to external machines.

Here, a first sealing material 4101, a cover material 4102, a filling material 4103 and second sealing material 4104 are disposed to surround a pixel portion 4002, a source signal line driving circuit 4003 and a gate signal line driving circuit 4004.

Further, FIG. 18B corresponds to a cross-sectional diagram at A–A' of FIG. 18A. A driver TFT 4201 which forms a source signal line driving circuit 4003 (note that an n-channel TFT and a p-channel TFT are shown in the figure) and a current control TFT (a TFT which controls electric current that flows into an EL element) 4202 which forms the pixel portion 4002 are formed over a substrate 4001.

In the present embodiment a p-channel TFT or an n-channel TFT fabricated through a known method is used for a driver TFT 4201; and a p-channel TFT fabricated through a known method is used for a current control TFT 4202. Further, a storage capacitor (not shown) which is connected to the gate of a current control TFT 4202 is disposed in the pixel portion 4002.

An interlayer insulating film (flattening film) 4301 comprising a resin material is formed over a driver TFT 4201 and a pixel TFT 4202, and a pixel electrode (anode) 4302 that is electrically connected to the drain of a pixel TFT 4202 is formed thereon. As a pixel electrode 4302, a transparent conductive film that has a large work function is used. A compound of indium oxide and tin oxide, a compound of indium oxide and zinc oxide, zinc oxide, tin oxide or indium oxide can be used as the transparent conductive film. In addition, a material added with gallium to the above stated transparent conductive film may also be used.

An insulating film 4303 is formed on the pixel electrode 4302 and an opening section is formed in the insulating film 4303 at above the pixel electrode 4302. In this opening section an EL (electro-luminescence) layer 4304 is formed over the pixel electrode 4302. A known organic or inorganic EL material can be used for the EL layer 4304. Further though there are small molecular materials and polymer materials in the organic EL materials, either may be used.

A known evaporation technique or a coating technique may be used for the formation method of the EL layer 4304.

Further, the structure of EL layer may be a laminate structure or a single layer structure by freely combining a hole injection layer, a hole transport layer, a light emitting layer, an electron transport layer or an electron injection layer.

A cathode 4305 comprising a conductive film having a light shielding property (typically a conductive film which has aluminum, copper or silver as the main constituent or a lamination of these and other conductive films) is formed on the EL layer 4304. It is preferable to avoid as much as possible of moisture and oxygen that exist in the interface between the cathode 4305 and the EL layer 4304. Accordingly measures such as successive deposition of the two in a vacuum, or forming EL layer 4304 in a nitrogen or noble gas atmosphere and then forming cathode 4305 without contact to oxygen and moisture, are required. In the present embodiment the deposition described above is made possible by using a deposition apparatus such as a multi-chamber system (cluster-tool system).

The cathode 4305 is electrically connected to the wiring 4005 in a region denoted by reference numeral 4306. Wiring 4005 is wiring for applying preset voltage to the cathode 4305 and is electrically connected to FPC 4006 through an isotropic conductive film 4307.

Thus an EL element that comprises a pixel electrode (anode) 4302, an EL layer 4304 and a cathode 4305 is formed. The EL elements are surrounded by first sealing material 4101 and a cover material 4102 which is stuck to a substrate 4001 by the first sealing material 4101 and sealed by filling material 4103.

As the cover material 4102, a glass material, a metallic material (typically stainless steel), a ceramics material and a plastic material (including a plastic film) can be used. As a plastic material, FRP (fiberglass-reinforced plastics) plate, PVF (polyvinyl fluoride) film, Myler film, polyester film or acrylic resin film can be used. Further, a sheet having a structure in which aluminum foil is sandwiched by PVF film or Myler film can be used.

Note however, the cover member need to be transparent in case that radiation from EL elements is directed to the direction toward cover material. In such cases, a transparent substance such as a glass plate, a plastic plate, a polyester film or an acrylic film is used.

A ultraviolet ray curing resin or a thermosetting resin can be used as filling material 4103, and PVC (polyvinyl chloride), acrylic, polyimide, epoxy resin, silicone resin, PVB (polyvinyl butyral), or EVA (ethylene vinyl acetate) can be used. If a drying agent (preferably barium oxide) or a material that absorbs oxygen is formed on the inside of the filling material 4103, deterioration of EL elements can be prevented.

Further, spacers may be included within the filling material 4103. When the spacers are formed from barium oxide, it is possible to give the ability to absorb moisture to the spacers themselves. In addition, it is effective to provide a resin film over cathode 4305, as a buffer layer that releases pressure from the spacers in case of disposing the spacers.

The wiring 4005 is electrically connected to the FPC 4006 through anisotropic conductive film 4307. Wiring 4005 transmits signals that are sent to pixel portion 4002, source side driving circuit 4003 and gate side driving circuit 4004 to FPC 4006, and is electrically connected to an external device by FPC 4006.

In the present embodiment a structure that thoroughly shields the EL elements from external atmosphere is employed in which second sealing material 4104 is provided so as to cover the exposed portions of first sealing material 4101 and a part of FPC 4006. An EL display device having the cross sectional structure of FIG. 18B is thus complete.

Figure 19:
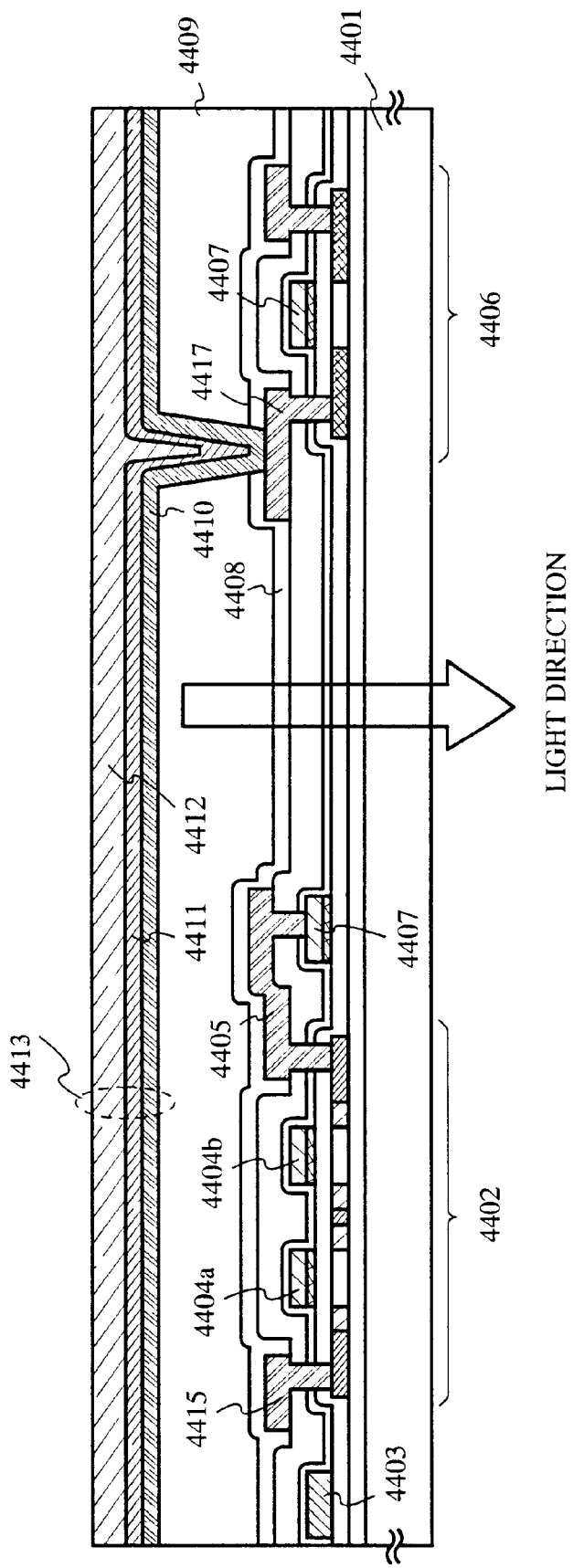
FIG. 19 is a sectional view of an EL display device which is one of the semiconductor devices according to Embodiment 6.
Figure 20A:
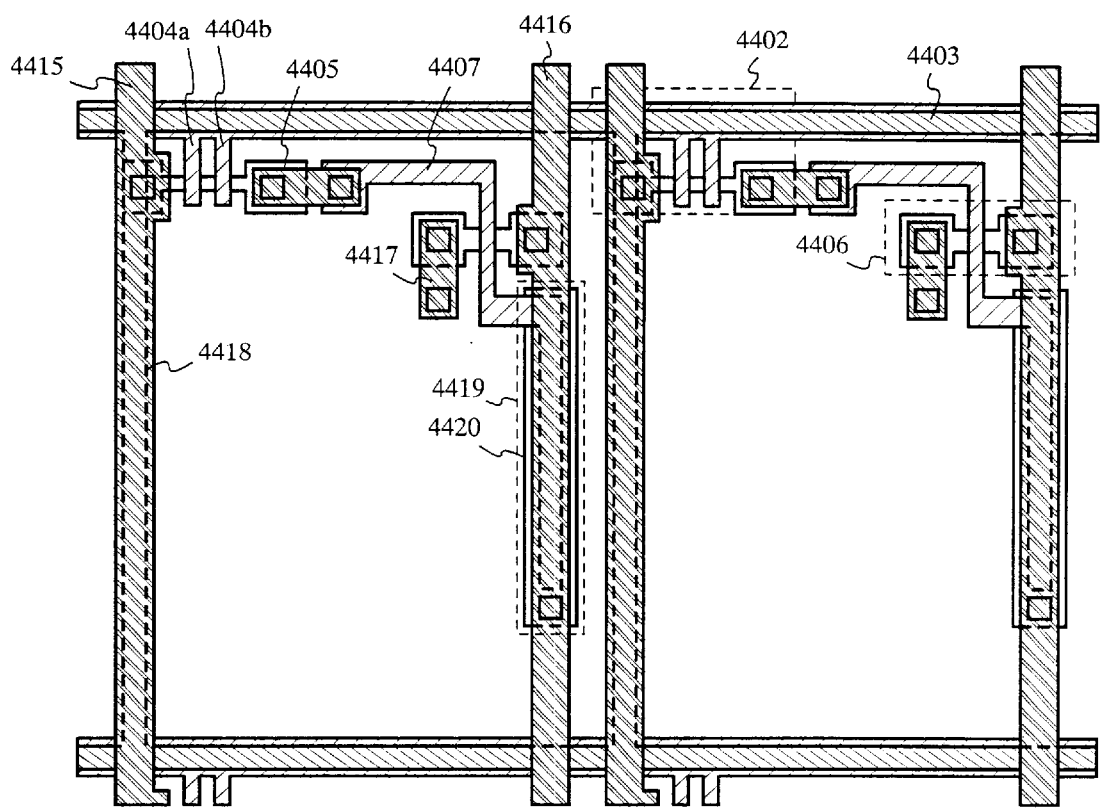
FIGS. 20A–20B are a top view and a circuit diagram of an EL display device which is one of the semiconductor devices according to Embodiment 6.
Figure 20B:
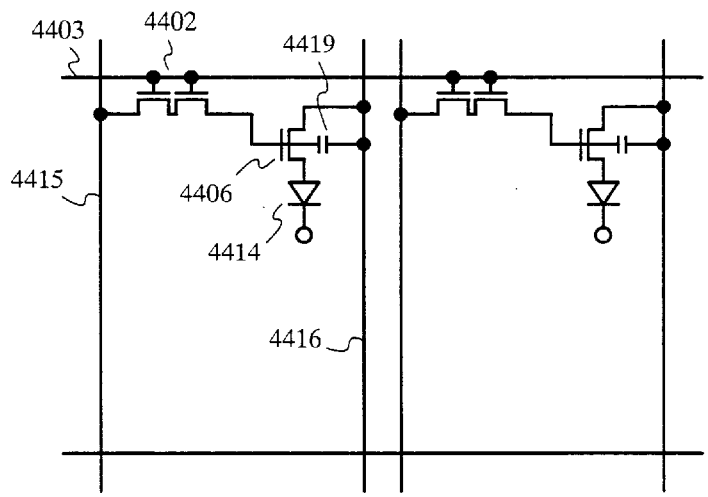

A more detailed structure on a cross section of pixel portion is shown in FIG. 19, a top view is shown in FIG. 20A, and circuit diagram is shown in FIG. 20B. Common reference numerals are used in FIGS. 19, 20A and 20B, so that the figures may be compared with each other.

In FIG. 19, switching TFT 4402 disposed over substrate 4401 is formed from an n-channel TFT fabricated in accordance with a known method. The wiring shown by 4403 is a gate wiring that electrically connects gate electrodes 4404a and 4404b of switching TFT 4402.

Note that while the present invention uses a double gate structure in which 2 channel forming regions are formed, single gate structure in which one channel forming region is formed or a triple gate structure in which 3 channel forming regions are formed are also acceptable.

The drain wiring 4405 of switching TFT 4402 is electrically connected to gate electrode 4407 of current control TFT 4406. Note that current control TFT 4406 is a p-channel TFT formed through a known method. Note that while the present embodiment uses a single gate structure, a double gate structure or a triple gate structure are also acceptable.

A first passivation film 4408 is disposed over the switching TFT 4402 and the current control TFT 4406, and a planarization film 4409 comprising resin is formed on top. It is very important to flatten by using the planarization film 4409, the step due to the TFTs. Since an EL layer formed later is extremely thin, there are cases in which defective luminescence is caused due to the existence of the step. Therefore, it is preferable to planarize before forming pixel electrode so as to form an EL layer on a planarized surface as possible.

The reference numeral 4410 denotes a pixel electrode (anode of EL element) comprising a transparent conductive film, and is electrically connected to the drain wiring 4417 of current control TFT 4406. A compound of indium oxide and tin oxide, a compound of indium oxide and zinc oxide, zinc oxide, tin oxide or indium oxide can be used as the transparent conductive film. Further, said conductive transparent including gallium may also be used.

An EL layer 4411 is formed on pixel electrode 4410. Note that while FIG. 19 shows only 1 pixel, EL layers corresponding to each colors of R (red), G (green) and B (blue) are each formed properly in the present embodiment. A small molecular type organic EL material is formed by evaporation in the present embodiment. In concrete, a laminate structure is formed from a copper phthalocyanine (CuPc) film of 20 nm thickness disposed as a hole injection layer, and tris-8-quinolinolate aluminum complex ($Alq_3$) film formed thereon into 70 nm thickness as a luminescent layer. A luminescent color may be controlled by adding fluorescent dye such as quinacridon, Perylene or DCM1 into $Alq_3$.

However, the above example is one example of the organic EL materials that can be used as an EL layer, and it is not necessary to limit to these materials. An EL layer (a layer for luminescence and for performing carrier motion for luminescence) may be formed by freely combining luminescence layer, charge transport layer, or charge injection layer. For example, an example using small molecular type materials as luminescence layers is shown in the present embodiment, but polymer type organic EL materials may also be used. Further, it is possible to use inorganic materials such as silicon carbide, etc., as charge transport layer and charge injection layer. Publicly known materials can be used for these organic EL materials and inorganic materials.

A cathode 4412 comprising a conductive film is next formed on EL layer 4411. In the case of the present embodiment, an alloy film of aluminum and lithium is used as the conductive film. Needless to say, a publicly known MgAg film (alloy film of magnesium and silver) may also be used. As the cathode material, a conductive film comprising an element belonging to periodic table group 1 or 2, or a conductive film added with at least one of these elements, may be used.

EL element 4413 is completed at the point when this cathode 4412 is formed. Note that an EL element 4413 formed here represents a capacitor formed from pixel electrode (anode) 4410, EL layer 4411 and cathode 4412.

The top view of the pixel in the present embodiment is next described by using FIG. 20A. Source region of switching TFT 4402 is connected to source wiring (source signal line) 4415 and drain region is connected to drain wiring 4405. Further, drain wiring 4405 is electrically connected to gate electrode 4407 of current control TFT 4406. Source region of current control TFT 4406 is electrically connected to current supply line 4416 and drain region is electrically connected to drain wiring 4417. Drain wiring 4417 is electrically connected to pixel electrode (anode) 4410 shown by dotted line.

Here, a storage capacitor is formed in the region shown by 4419. Storage capacitor 4419 is formed from a semiconductor film 4420 electrically connected to current supply line 4416, an insulating film formed of the same layer as gate insulating film (not shown) and gate electrode 4407. Further, it is possible to use a capacitance formed from gate electrode 4407, a layer formed from the same layer as the first interlayer insulating film (not shown) and current supply line 4416, for a storage capacitor.

Embodiment 7

Figure 21:
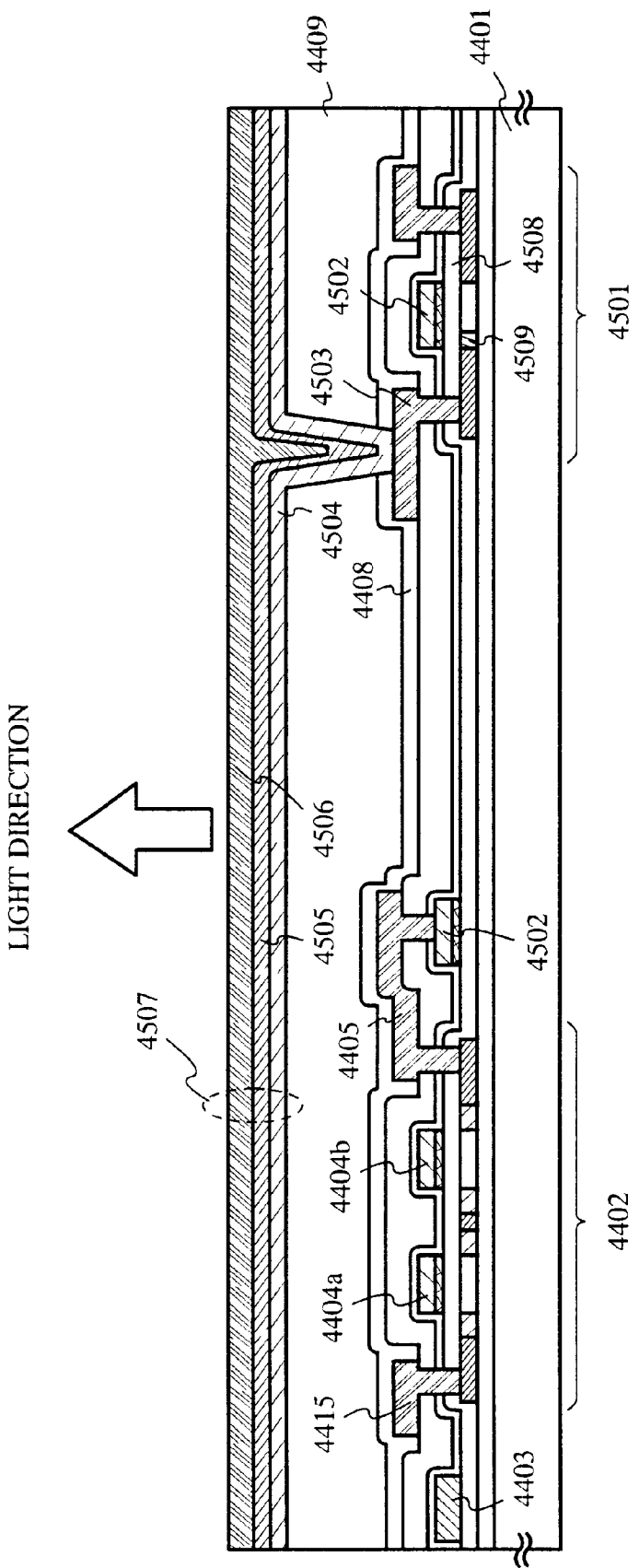
FIG. 21 is a sectional view of an EL display device which is one of the semiconductor devices according to Embodiment 7.

In embodiment 7 an EL display device having a pixel structure differing from embodiment 6 is described. FIG. 21 is used for explanation. Note that the description of embodiment 6 may be referred regarding parts where the same reference numerals as FIG. 20 are given.

In FIG. 21 an n-channel ITT fabricated through a known method is used as current control TFT 4501. Needless to say, gate electrode 4502 of current control TFT 4501 is electrically connected to drain wiring 4405 of switching TFT 4402. Drain wiring 4503 of current control TFT 4501 is electrically connected to pixel electrode 4504.

In embodiment 7, a pixel electrode 4504 comprising a conductive film functions as a cathode of the EL element. An alloy film of aluminum and lithium is used in concrete, but a conductive film comprising an element belonging to periodic table group 1 or 2, or a conductive film added with such element may be used here.

EL layer 4505 is formed on top of pixel electrode 4504. Note that though FIG. 21 shows only one pixel, EL layer corresponding to G (green) is formed in the present embodiment by evaporation method or coating method (preferably spin coating). In concrete, it is a laminate structure comprising a lithium fluoride (LiF) film of 20 nm thickness provided as electron injection layer and a PPV (poly-p-phenylene vinylene) of 70 nm thickness provided thereon as luminescence layer.

An anode 4506 comprising transparent conductive film is next disposed on EL layer 4505. In the present embodiment, a compound of indium oxide and tin oxide or a compound of indium oxide and zinc oxide is used as the transparent conductive film.

On completing formation of anode 4506, an EL element 4507 is finished. Note that EL element 4507 represents here a capacitor formed from pixel electrode (cathode) 4504, EL layer 4505 and anode 4506.

Degradation due to hot carrier effect is actualized in a current control TFT 4501 in case that the voltage applied to the EL element 4507 is such a high voltage as exceeding 10V. It is effective to use an n-channel TFT having a LDD region 4509 as the current control TFT 4501.

Note that, the current control TFT 4501 of the present embodiment forms a parasitic capacitance, which is referred to as gate capacitance, in between gate electrode 4502 and LDD regions 4509. It is possible to provide the same function as storage capacitor 4419 shown in FIGS. 20A and 20B by adjusting this gate capacitance. Specifically in case of driving the EL display device by digital driving method, it is possible to use the gate capacitance for storage capacitor because the capacitance of storage capacitor can be smaller compared to the case of driving by analog driving method.

Note that an n-channel TFT in which LDD region 4509 is omitted from the structure shown in FIG. 21 may be used in case the voltage applied to an EL element is less than 10V preferably less than 5V because above stated degradation due to hot carrier effect would not become a serious problem.

Embodiment 8

Figure 22A:
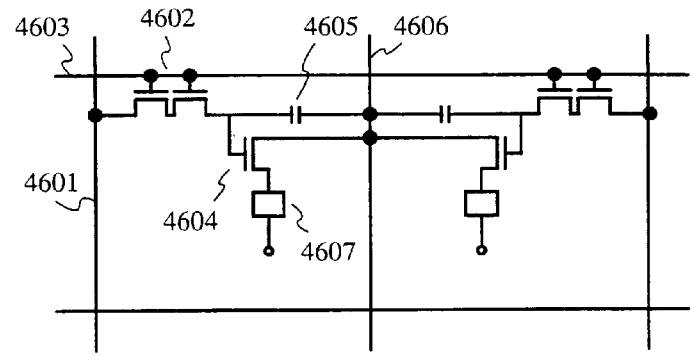
FIGS. 22A–22C show circuit diagrams of an EL display device being one of the semiconductor devices according to Embodiment 8.
Figure 22B:
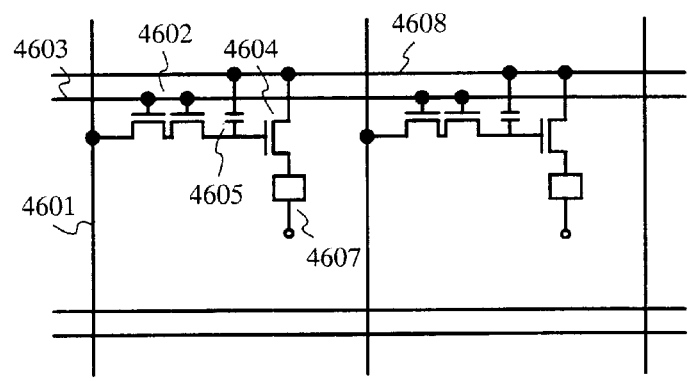
Figure 22C:
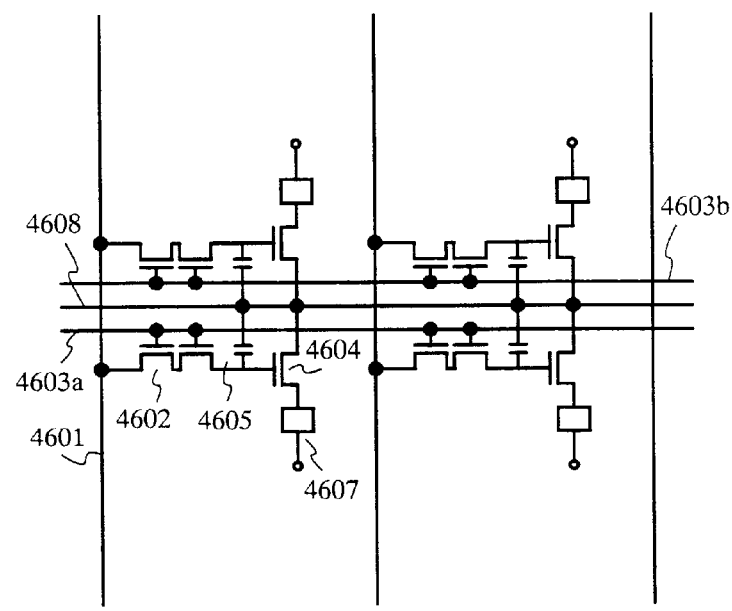

Examples of pixel structures that can be used in the pixel portion of an EL display device described in Embodiments 6 and 7 are shown in the present Embodiment in FIGS. 22A to 22C. In the present Embodiment: reference numeral 4601 denotes a source wiring (source signal line) of a switching TFT 4602; 4603, a gate wiring (gate signal line) of a switching TFT 4602; 4604, a current control TFT; 4605, a capacitance; 4606 and 4608; power supply lines; and 4607, EL element.

FIG. 22A shows an example in which the current supply line 4606 is shared by two pixels. In other words, this example is characterized in that two pixels are formed so as to be axisymmetric with respect to the current supply line 4606. In this case, the number of current supply lines can be reduced, further enhancing the definition of the pixel portion.

FIG. 22B shows an example in which the current supply line 4608 is arranged in parallel with the gate wirings 4603. Though the current supply line 4608 is arranged so as not to overlap with the gate wirings 4603 in FIG. 22B, the two may overlap with each other through an insulating film if the lines are formed in different layers. In this case, the current supply line 4608 and the gate wiring 4603 can share their occupying area, further enhancing the definition of the pixel portion.

An example shown in FIG. 22C is characterized in that the current supply line 4608 is arranged, similar to the structure in FIG. 22B, in parallel with the gate wirings 4603 and, further, two pixels are formed to be axisymmetric with respect to the current supply line 4608. It is also effective to arrange the current supply line 4608 so as to overlap with one of the gate wirings 4603. In this case, the number of current supply lines can be reduced, further enhancing the definition of the pixel portion.

Embodiment 9

Figure 23A:
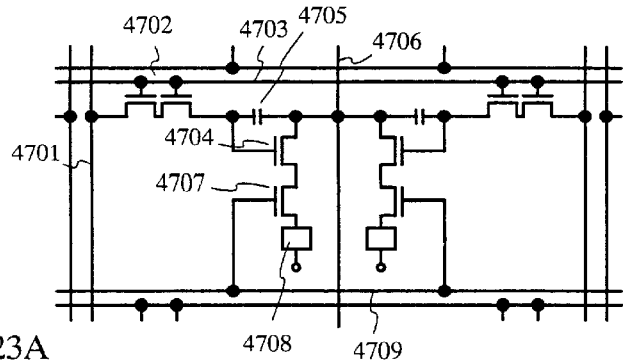
FIGS. 23A–23B show circuit diagrams of the pixel portion of an EL display device being one of the semiconductor devices according to Embodiment 9.
Figure 23B:
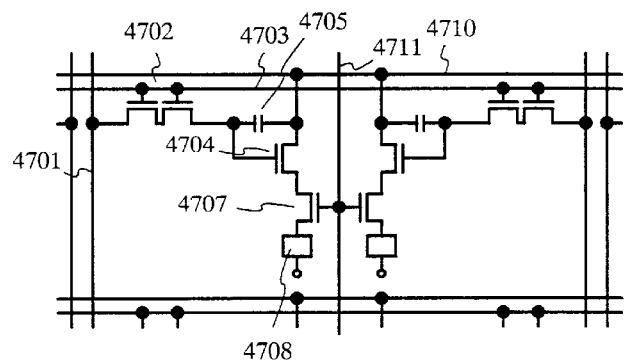

This embodiment relates to the pixel structure of an EL display device to which the present invention is applied, and FIG. 23A–FIG. 23B show examples of the pixel structure. In this embodiment, numeral 4701 denotes a source wiring (source signal line) of a switching TFT 4702, numeral 4703 denotes a gate wiring (gate signal line) of the switching TFT 4702, numeral 4704 denotes a current controlling TFT, numeral 4705 denotes a capacitor (this can be omitted), numeral 4706 a power-supply feed line, numeral 4707 denotes a power-supply controlling TFT, numeral 4708 denotes an EL element, and numeral 4709 denotes a power-supply controlling gate wiring. For the operation of the power-supply controlling TFT 4707, reference can be made to Japanese Patent Application No. 11-341272.

Further, in this embodiment, the power-supply controlling TFT 4707 is provided between the current controlling TFT 4704 and the EL element 4708, but this embodiment may also be constituted in such a manner that, between the power-supply controlling TFT; 4707 and the EL element 4708, the current controlling TFT 4704 is provided. Further, it is preferred that the power-supply controlling TFT 4707 is of the same structure as the current controlling TFT 4704 or is formed in series in the same active layer.

Further, FIG. 23A shows an example of the case where the power-supply line 4706 is used in common between two pixels. That is, the feature of this example lies in the point that the two pixels are formed so as to be axisymmetrical with reference to the power supply feed line 4706. In this case, the power supply lines can be decreased in number, so that the pixel portion can be made further precise and minute. Further, FIG. 23B shows an example of the case where a power-supply line 4710 is provided in parallel to a power-supply controlling gate wiring 4711 is provided in parallel to the source wiring 4701. In the structure shown in FIG. 23B, the power supply line 4710 and the gate wiring 4703 do not overlap each other, but, if both lines are formed in different layers, they can be provided so as to overlap each other through an insulator film. In this case, the same area can be commonly occupied by the power-supply line 4710 and the gate wiring 4703, so that the pixel portion can be made further precise and minute.

Embodiment 10

Figure 24A:
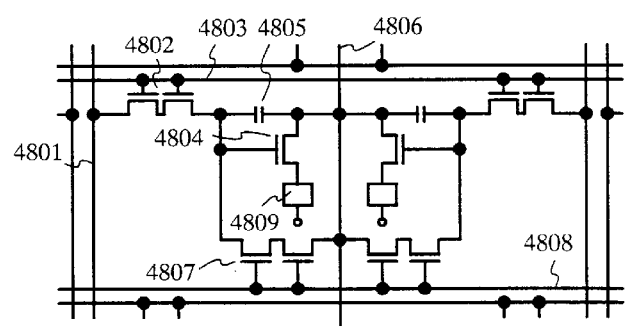
FIG. 24A–24B show circuit diagrams of the pixel portion of an EL display device being one of the semiconductor devices according to Embodiment 10.
Figure 24B:
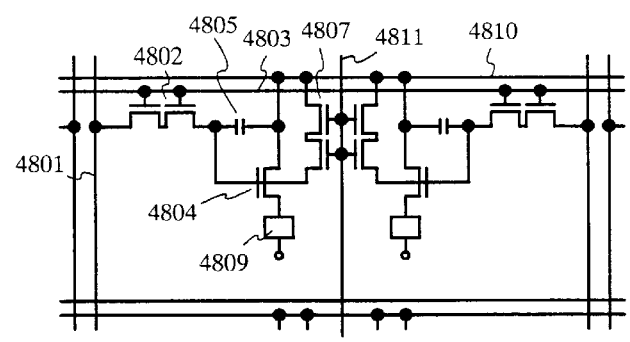

This embodiment relates to the pixel structure of an EL display device to which the present invention is applied, and FIG. 24A and FIG. 24B show examples of the pixel structure. In this embodiment, numeral 4801 denotes a source wiring (source signal line) of a switching TFT 4802, numeral 4802 denotes a source wiring (source signal line), numeral 4803 denotes a gate wiring (gate signal line) of the switching TFT 4802, numeral 4804 denotes a current controlling TFT, numeral 4805 denotes a capacitor (this can be omitted), numeral 4806 denotes a power-supply feed line, numeral 4807 denotes an erasing TFT, numeral 4808 denotes an erasing gate wiring, and numeral 4809 denotes an EL element. For the operation of the erasing TFT 4807, reference can be made to Japanese Patent Application No. 11-338786.

The drain of the erasing TFT 4807 is connected to the gate electrode of the current controlling TFT 4804 and can forcedly change the gate voltage of the current controlling TFT 4804. The erasing TFT 4807 may be comprised of either an n-channel type TFT or a p-channel type TFT, but should desirably of the same structure as the switching TFT 4802 so that the OFF current can be reduced.

Further, FIG. 24A shows an example of the case where the power-supply line 4806 is used in common between two pixels. That is, the structure sown in FIG. 24A has its feature in the point that the two pixels are formed so as to be axisymmetrical with reference to the power-supply line 4806. In this case, the power-supply lines can be reduced in number, so that the pixel portion can be made further precise and minute.

Further, FIG. 24B shows an example of the case where the power-supply line 4810 is provided in parallel to the gate wiring 4803, an erasing gate wiring 4811 is provided in parallel to the source wiring 4801. In the structure shown in FIG. 24B, the power-supply line 4810 and the gate wiring 4803 are provided so as not to overlap each other, but, if they are wirings formed in different layers, they can also be provided so as to overlap each other through an insulator film. In this case, one mounting area can be commonly used by the power-supply line 4810 and the gate wiring 4803, so that the pixel portion can be made further precise and minute.

Embodiment 11

An EL display device using the D/A conversion circuit according to the present invention may be constructed in such a manner that several TFTs are provided in the pixel. For example, four to six or more TFTs may be provided. The invention can be practiced without being limited to the pixel structure of the EL display device.

Embodiment 12

This embodiment relates to an example, different from that of Embodiment 5, of the electronic apparatus using the D/A conversion circuit according to the present invention.

Figure 25A:
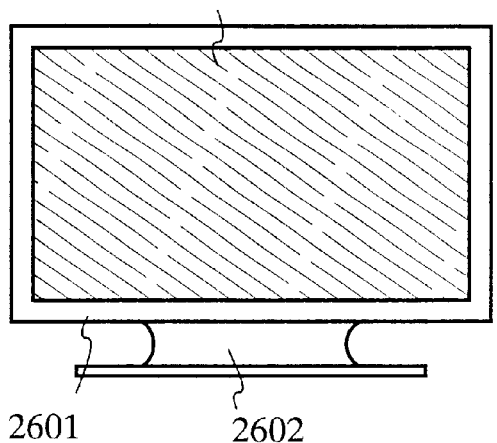
FIG. 25A–25B show diagrams of electronic apparatuses in which a semiconductor device according to Embodiment 12 is incorporated.

FIG. 25A shows a display, which includes a casing body 2601, a support stand 2602, a display device 2603, and the like. The present invention can be applied to the display device 2603 and other signal control circuits.

Figure 25B:
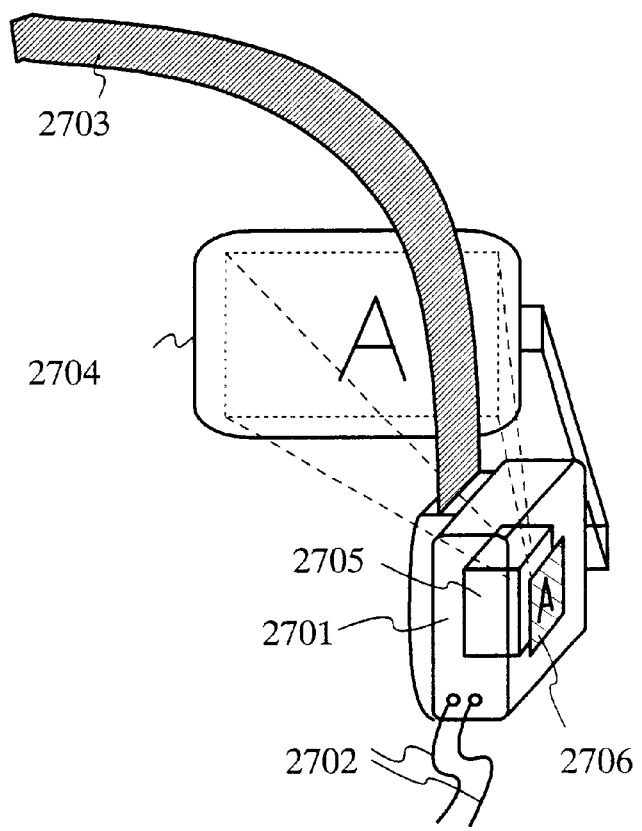

FIG. 25B shows a part (the right-hand side) of a head mounting type display, which includes a main body 2701, signal cables 2702, a head fixing band 2703, a screen portion 2704, an optical system 2705, a display device 2706 and the like. The present invention can be applied to the display device 2706 and other signal control circuits.

As described above, the invention, which has a very wide range of application, can be applied to electronic apparatus in every field. Further, the electronic apparatus according to this embodiment can be realized by the use of the constitution comprising any combination of Embodiments 1 to 4, and 6 to 11.

In the DAC according to the present invention, it is not necessary to provide the same number of switches or graduation voltage lines as the bit number of the digital signals unlike in case of the known DAC. Thus, the area of the DAC can be held down, and the miniaturization of driving circuits and semiconductor devices has become possible.

Further, in case of the conventional DAC, the number of switches had to be exponentially increased as the bit number of the digital signals increases. According to the present invention, however, in case of converting n-bit digital signals, the number of the switches has become 2n. Thus, even if the bit number increases, an increase in the switch number can held down unlike the conventional DAC, and thus, the miniaturization of driving circuits and semiconductor devices has become possible.

Further, since the area of the DAC itself can be held down, the area of the driving circuit can be held down even if the number of the D/A conversion circuits is increased by increasing the pixel number, that is, the source signal lines; and the fabrication of highly precise and minute semiconductor devices has become possible. Further, unlike in case of a capacitance division type DAC, the period of time for accumulating charges in the capacitance and the period of time for discharging the charges accumulated in the capacitance to reset them to the same charges as the GND (ground) are not necessary any more, so that the operating speed is enhanced as compared with the capacitance division type DAC.

What is claimed is:

1. An electric device including a D/A conversion circuit comprising:

n resistors $A_0, A_1, \ldots A_{n-1}$, n resistors $B_0, B_1, \ldots, B_{n-1}$, a power-supply voltage line L and a power-supply voltage line H being maintained at potentials different from each other, n switches $SWa_0, SWa_1, \ldots, SWa_{n-1}$, n switches $SWb_0, SWb_1, \ldots, SWb_{n-1}$, and an output line, wherein resistance values of the n resistors $A_0, A_1, \ldots A_{n-1}$ are $R, 2R, \ldots, 2_{n-1}R$, respectively, wherein n stands for a natural number of 1 or greater, and R stands for a positive number, respectively, wherein resistance values of the n resistors $B_0, B_1, \ldots, B_{n-1}$ are $R, 2R, \ldots, 2_{n-1}R$, respectively, wherein both ends of each of the n resistors $A_0, A_1, \ldots A_{n-1}$ are connected to one end of each of the n switches $SWa_0, SWa_1, \ldots, SWa_{n-1}$ and to the output line, wherein an end of each of the n switches $SWa_0, SWa_1, \ldots, SWa_{n-1}$ which is not connected to each of the n resistors $A_0, A_1, \ldots A_{n-1}$ is connected to the power-supply voltage line L, wherein both ends of each of the n resistors $B_0, B_1, \ldots, B_{n-1}$ are connected to one end of each of the n switches $SWb_0, SWb_1, \ldots, SWb_{n-1}$ and to the output line, wherein an end of each of the n switches $SWb_0, SWb_1, \ldots, SWb_{n-1}$ which is not connected to each of the n resistors $B_0, B_1, \ldots, B_{n-1}$ is connected to the power-supply voltage line H, wherein the n switches $SWa_0, SWa_1, \ldots, SWa_{n-1}$, and the n switches $SWb_0, SWb_1, \ldots, SWb_{n-1}$ are controlled by n-bit digital signals inputted from the outside, wherein inverted signals of the n-bit digital signals which are inputted to the n switches $SWa_0, SWa_1, \ldots, SWa_{n-1}$ are respectively inputted to the n switches $SWb_0, SWb_1, \ldots, SWb_{n-1}$, and wherein an analog gradation voltage signal is outputted from said output line, wherein each of the switches $SWa_0, SWa_1, \ldots, SWa_{n-1}$ includes a first thin film transistor, wherein each of the switches $SWb_0, SWb_1, \ldots, SWb_{n-1}$ includes a second thin film transistor.

2. A device according to claim 1, wherein each of the first and second thin film transistors comprises at least one selected from the group consisting of an n-channel type thin film transistor and a p-channel type thin film transistor.

3. A device according to claim 1, wherein the electric device is an active matrix liquid crystal display device.

4. A device according to claim 1, wherein the electric device is an EL display device.

5. A device according to claim 1,
wherein the electric device is a computer.

6. A device according to claim 1,
wherein the electric device is a video camera.

7. A device according to claim 1,
wherein the electric device is a DVD.

8. An electric device including a D/A conversion circuit comprising
a power-supply voltage line H and a power-supply voltage line L being maintained at potentials different from each other,
n switches $SWa_0, SWa_1, \ldots, SWa_{n-1}$ each including a thin film transistor,
n switches $SWb_0, SWb_1, \ldots, SWb_{n-1}$ each including a thin film transistor, and
an output line,
wherein the thin film transistor includes,
a gate electrode,
an active layer having a source region, a drain region and a channel forming region, and
a gate insulating film being provided between the gate electrode and the active layer,
wherein the thin film transistor has resistance value of an internal resistance represented by the general expression, $2_{n-1}R$,
wherein n stands for a natural number of 1 or greater, and R stands for a positive number,
wherein one end of each of the n switches $SWa_0, SWa_1, \ldots, SWa_{n-1}$ is connected the power-supply voltage line L, while the other is connected to the output line,
wherein one end of each of said n switches $SWb_0, SWb_1, \ldots, SWb_{n-1}$ is connected the power-supply voltage line H, while the other is connected to the output line,
wherein the n switches $SWa_0, SWa_1, \ldots, SWa_{n-1}$ and the n switches $SWb_0, SWb_1, \ldots, Swb_{n-1}$ are controlled by the n-bit digital signals inputted from the outside,
wherein inverted signals of the n-bit digital signals inputted to the n switches $SWa_0, SWa_1, \ldots, SWa_{n-1}$ are respectively inputted to the n switches $SWb_0, SWb_1, \ldots, SWb_{n-1}$ and
wherein an analog gradation voltage signal is outputted from the output line.

9. A device according to claim 8,
wherein resistance value of the internal resistance of the thin film transistor is determined depending on a channel width W of the channel forming region.

10. A device according to claim 8,
wherein resistance value of the internal resistance of the thin film transistor is determined depending on a length L of the channel forming region.

11. A device according to claim 8,
wherein the thin film transistor comprises at least one selected from the group consisting of an n-channel type thin film transistor and a p-channel type thin film transistor.

12. A device according to claim 8,
wherein the electric device is an active matrix liquid crystal display device.

13. A device according to claim 8,
wherein the electric device is an EL display device.

14. A device according to claim 8,
wherein the electric device is a computer.

15. A device according to claim 8,
wherein the electric device is a video camera.

16. A device according to claim 8,
wherein the electric device is a DVD.

17. An electric device including a D/A conversion circuit comprising
n resistors $A_0, A_1, \ldots A_{n-1}$,
n resistors $B_0, B_1, \ldots, B_{n-1}$,
a power-supply voltage line L and a power-supply voltage line H being maintained at potentials different from each other,
n switches $SWa_0, SWa_1, \ldots, SWa_{n-1}$,
n switches $SWb_0, Swb_1, \ldots, SWb_{n-1}$, and
an output line,
wherein resistance values of the n resistors $A_0, A_1, \ldots A_{n-1}$ are $R, 2R, \ldots, 2_{n-1}R$, respectively,
wherein n stands for a natural number of 1 or greater, and R stands for a positive number, respectively,
wherein resistance values of the n resistors $B_0, B_1, \ldots, B_{n-1}$ are $R, 2R, \ldots, 2_{n-1}R$, respectively,
wherein both ends of each of the n resistors $A_0, A_1$, are connected to one end of each of the n switches $SWa_0, SWa_1, \ldots, SWa_{n-1}$ and to the power-supply voltage line L,
wherein an end of each of the n switches $SWa_0, SWa_1, \ldots, SWa_{n-1}$ which is not connected to each of the n resistors $A_0, A_1, \ldots A_{n-1}$ is connected to the output line,
wherein both ends of each of the n resistors $B_0, B_1, \ldots, B_{n-1}$ are connected to one end of each of the n switches $SWb_0, SWb_1, \ldots, SWb_{n-1}$ and to the power-supply voltage line H,
wherein an end of each of the n switches $SWb_0, SWb_1, \ldots, SWb_{n-1}$ which is not connected to each of the n resistors $B_0, B_1, \ldots, B_{n-1}$ is connected to the output line,
wherein the n switches $SWa_0, SWa_1, \ldots, SWa_{n-1}$ and the n switches $SWb_0, SWb_1, \ldots, SWb_{n-1}$ are controlled by the n-bit digital signals inputted from outside,
wherein inverted signals of the n-bit digital signals which are inputted to the n switches $SWb_0, SWb_1, \ldots, SWb_{n-1}$ are respectively inputted to the n switches $SWb_0, SWb_1, \ldots, SWb_{n-1}$ and
wherein an analog gradation voltage signal is outputted from the output line,
wherein each of the switches $SWa_0, SWa_1, \ldots, SWa_{n-1}$ includes a first thin film transistor,
wherein each of the switches $SWb_0, SWb_1, \ldots, SWb_{n-1}$ includes a second thin film transistor.

18. A device according to claim 17,
wherein each of the first and second thin film transistors comprises at least one selected from the group consisting of an n-channel type thin film transistor and a p-channel type thin film transistor.

19. A device according to claim 17,
wherein the electric device is an active matrix liquid crystal display device.

20. A device according to claim 17,
wherein the electric device is an EL display device.

21. A device according to claim 17,
wherein the electric device is a computer.

22. A device according to claim 17,
wherein the electric device is a video camera.

23. A device according to claim 17,
wherein the electric device is a DVD.

* * * * *

UNITED STATES PATENT AND TRADEMARK OFFICE
CERTIFICATE OF CORRECTION

PATENT NO. : 6,380,876 B1
DATED : April 30, 2002
INVENTOR(S) : Shou Nagao

It is certified that error appears in the above-identified patent and that said Letters Patent is hereby corrected as shown below:

Column 42,
Lines 23 and 27, delete "$2_{n-1}R$" and insert -- $2^{n-1}R$ --;

Column 43,
Line 26, delete "$2_{n-1}R$" and insert -- $2^{n-1}R$ --;

Column 44,
Lines 15 and 19, delete "$2_{n-1}R$" and insert -- $2^{n-1}R$ --.

Signed and Sealed this

Third Day of August, 2004

JON W. DUDAS
*Acting Director of the United States Patent and Trademark Office*